United States Patent
Trang et al.

(10) Patent No.: US 11,387,340 B2
(45) Date of Patent: Jul. 12, 2022

(54) HIGH POWER TRANSISTOR WITH INTERIOR-FED FINGERS

(71) Applicant: Wolfspeed, Inc., Durham, NC (US)

(72) Inventors: Frank Trang, San Jose, CA (US); Zulhazmi Mokhti, Morgan Hill, CA (US); Haedong Jang, San Jose, CA (US)

(73) Assignee: WolfSpeed, Inc., Durham, NC (US)

( * ) Notice: Subject to any disclaimer, the term of this patent is extended or adjusted under 35 U.S.C. 154(b) by 0 days.

(21) Appl. No.: 16/393,280

(22) Filed: Apr. 24, 2019

(65) Prior Publication Data
US 2020/0343352 A1    Oct. 29, 2020

(51) Int. Cl.
| | |
|---|---|
| H01L 29/423 | (2006.01) |
| H01L 29/40 | (2006.01) |
| H01L 29/417 | (2006.01) |
| H01L 23/00 | (2006.01) |
| H01L 29/06 | (2006.01) |
| H01L 29/778 | (2006.01) |

(52) U.S. Cl.
CPC .......... *H01L 29/4238* (2013.01); *H01L 24/09* (2013.01); *H01L 24/49* (2013.01); *H01L 29/0649* (2013.01); *H01L 29/402* (2013.01); *H01L 29/41775* (2013.01); *H01L 29/7786* (2013.01)

(58) Field of Classification Search
None
See application file for complete search history.

(56) References Cited

U.S. PATENT DOCUMENTS

| | | | |
|---|---|---|---|
| 4,498,093 | A | 2/1985 | Allyn |
| 4,721,986 | A | 1/1988 | Kinzer |
| 5,025,296 | A | 6/1991 | Fullerton |
| 5,430,247 | A | 7/1995 | Bockelman |
| 5,500,522 | A | 3/1996 | Eshraghian |
| 5,592,006 | A | 1/1997 | Merrill |
| 5,744,843 | A | 4/1998 | Efland et al. |
| 6,023,086 | A | 2/2000 | Reyes |
| 6,274,896 | B1 | 8/2001 | Gibson |
| 6,316,793 | B1 | 11/2001 | Sheppard |
| 6,507,047 | B2 | 1/2003 | Litwin |
| 6,765,268 | B2 | 7/2004 | Akamine |
| 6,900,482 | B2 | 5/2005 | Aoki |
| 7,135,747 | B2 | 11/2006 | Allen |

(Continued)

FOREIGN PATENT DOCUMENTS

| | | |
|---|---|---|
| JP | 2002299351 A | 10/2002 |
| JP | 2006156902 A | 6/2006 |

(Continued)

OTHER PUBLICATIONS

Trang et al., U.S. Appl. No. 16/039,703, filed Jul. 19, 2018.

(Continued)

*Primary Examiner* — Xiaoming Liu
(74) *Attorney, Agent, or Firm* — Myers Bigel, P.A.

(57) ABSTRACT

A transistor device includes a gate finger and a drain finger extending on a semiconductor structure, a gate bond pad coupled to the gate finger, and a drain bond pad coupled to the drain finger. The gate bond pad extends on the gate finger and/or the drain bond pad extends on the drain finger.

22 Claims, 45 Drawing Sheets

(56) References Cited

U.S. PATENT DOCUMENTS

| | | |
|---|---|---|
| 7,851,832 B2 | 12/2010 | Takagi |
| 7,906,799 B2 | 3/2011 | Sheppard |
| 8,026,596 B2 | 9/2011 | Singhal et al. |
| 8,076,994 B2 | 12/2011 | Farrell |
| 8,178,908 B2 | 5/2012 | Greenberg |
| 8,536,622 B2 | 9/2013 | Takemae |
| 8,860,093 B2 | 10/2014 | Sasaki |
| 8,866,197 B2 | 10/2014 | Becker |
| 8,872,279 B2 | 10/2014 | Greenberg et al. |
| 9,190,479 B1 | 11/2015 | Greenberg |
| 9,564,861 B2 | 2/2017 | Zhao et al. |
| 9,607,953 B1 | 3/2017 | Li et al. |
| 9,653,410 B1* | 5/2017 | Holmes ............... H01L 23/5225 |
| 9,741,673 B2 | 8/2017 | Andre |
| 9,786,660 B1 | 10/2017 | Farrell |
| 9,917,104 B1 | 3/2018 | Roizin et al. |
| 9,979,361 B1 | 5/2018 | Mangaonkar et al. |
| 10,270,402 B1 | 4/2019 | Holmes et al. |
| 10,483,352 B1 | 11/2019 | Mokhti et al. |
| 10,600,746 B2 | 3/2020 | Trang et al. |
| 10,763,334 B2 | 9/2020 | Trang et al. |
| 2001/0012671 A1 | 8/2001 | Hoshino |
| 2002/0033508 A1 | 3/2002 | Morikawa |
| 2002/0039038 A1 | 4/2002 | Miyazawa |
| 2002/0066908 A1 | 6/2002 | Smith |
| 2002/0167023 A1 | 11/2002 | Chavarkar |
| 2003/0013276 A1 | 1/2003 | Asano et al. |
| 2003/0102482 A1 | 6/2003 | Saxler |
| 2004/0061129 A1 | 4/2004 | Saxler |
| 2005/0133829 A1 | 6/2005 | Kunii et al. |
| 2006/0081985 A1 | 4/2006 | Beach |
| 2008/0100404 A1 | 5/2008 | Vice |
| 2008/0149940 A1 | 6/2008 | Shibata et al. |
| 2008/0157222 A1* | 7/2008 | Wang ................... H01L 27/0207 257/401 |
| 2009/0020848 A1 | 1/2009 | Ono |
| 2009/0108357 A1 | 4/2009 | Takagi |
| 2009/0212846 A1 | 8/2009 | Cutter |
| 2009/0278207 A1 | 11/2009 | Greenberg |
| 2011/0018631 A1 | 1/2011 | Ng |
| 2011/0102077 A1 | 5/2011 | Lamey |
| 2012/0012908 A1 | 1/2012 | Matsunaga |
| 2012/0199847 A1 | 8/2012 | Takagi |
| 2012/0267795 A1 | 10/2012 | Shimura |
| 2013/0099286 A1 | 4/2013 | Imada |
| 2013/0228787 A1 | 9/2013 | Yamamura |
| 2013/0313653 A1 | 11/2013 | Brech |
| 2014/0014969 A1 | 1/2014 | Kunii |
| 2015/0129965 A1 | 5/2015 | Roy |
| 2015/0145025 A1 | 5/2015 | Yoshida et al. |
| 2015/0170986 A1 | 6/2015 | Szymanowski et al. |
| 2015/0243657 A1* | 8/2015 | Lin .................... H01L 23/49537 257/401 |
| 2015/0279781 A1 | 10/2015 | Kaibara |
| 2015/0311131 A1 | 10/2015 | Watts et al. |
| 2015/0333051 A1 | 11/2015 | Greenberg et al. |
| 2015/0349727 A1 | 12/2015 | Flowers et al. |
| 2016/0380606 A1 | 12/2016 | Limjoco et al. |
| 2017/0154839 A1 | 6/2017 | Lin et al. |
| 2017/0221878 A1 | 8/2017 | Tomomitsu |
| 2017/0271329 A1 | 9/2017 | Farrell |
| 2017/0271497 A1 | 9/2017 | Fayed |
| 2018/0026125 A1* | 1/2018 | Liao .................. H01L 23/49537 257/401 |
| 2018/0047822 A1* | 2/2018 | Lin ................... H01L 29/42316 |
| 2018/0190814 A1 | 7/2018 | Pendharkar et al. |
| 2018/0261566 A1 | 9/2018 | Babcock et al. |
| 2020/0027850 A1 | 1/2020 | Trang et al. |
| 2020/0075479 A1* | 3/2020 | Khalil ................. H01L 23/5225 |

FOREIGN PATENT DOCUMENTS

| | | |
|---|---|---|
| JP | 2007173731 A | 7/2007 |
| JP | 2010147254 A | 7/2010 |
| JP | 2011524079 A | 8/2011 |
| JP | 2013247618 | 12/2013 |
| WO | 2014097524 A1 | 6/2014 |

OTHER PUBLICATIONS

Mokhti et al., U.S. Appl. No. 16/032,571, filed Jul. 11, 2018.

Trang et al., U.S. Appl. No. 16/208,821, filed Dec. 4, 2018.

Trang et al., U.S. Appl. No. 16/375,398, filed Apr. 4, 2019.

Notification ofTransmittal of the International Search Report and the Written Opinion of the International Searching Authority, or the Declaration, issued in corresponding PCT International Application No. PCT/US2019/040960, dated Dec. 13, 2019.

Notification of Transmittal of the International Search Report and the Written Opinion of the International Searching Authority, or the Declaration, issued in corresponding PCT International Application No. PCT/US2019/063961, dated Mar. 16, 2020.

Notification Concerning Transmittal of International Preliminary Report on Patentability (Chapter 1 of the Patent Cooperation Treaty) dated Jan. 21, 2021, for corresponding PCT International Application No. PCT/US2019/040960.

Notification of Transmittal of the International Search Report and the Written Opinion of the International Searching Authority, or the Declaration, dated Sep. 14, 2020, for corresponding PCT International Application No. PCT/US2020/029442.

Notification of Transmittal of the International Search Report and the Written Opinion of the International Searching Authority, or the Declaration, dated Mar. 16, 2020, for corresponding PCT International Application No. PCT/US2019/063961.

* cited by examiner

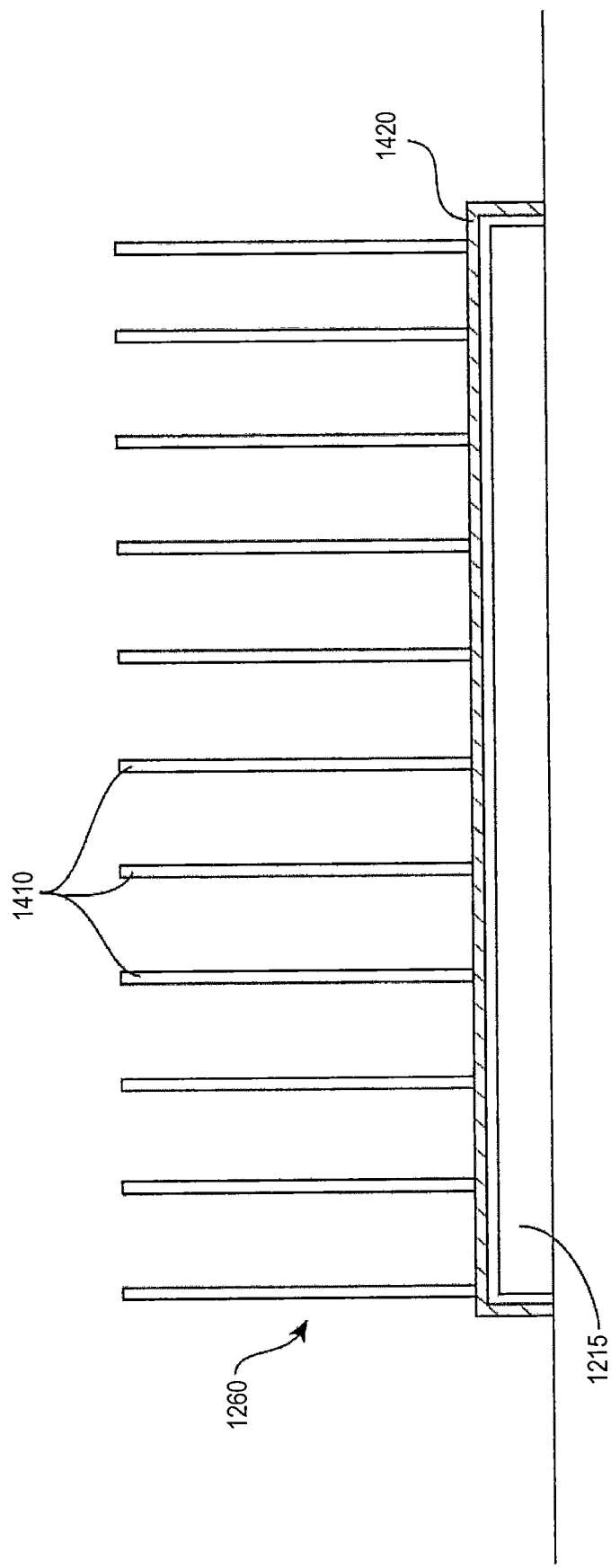

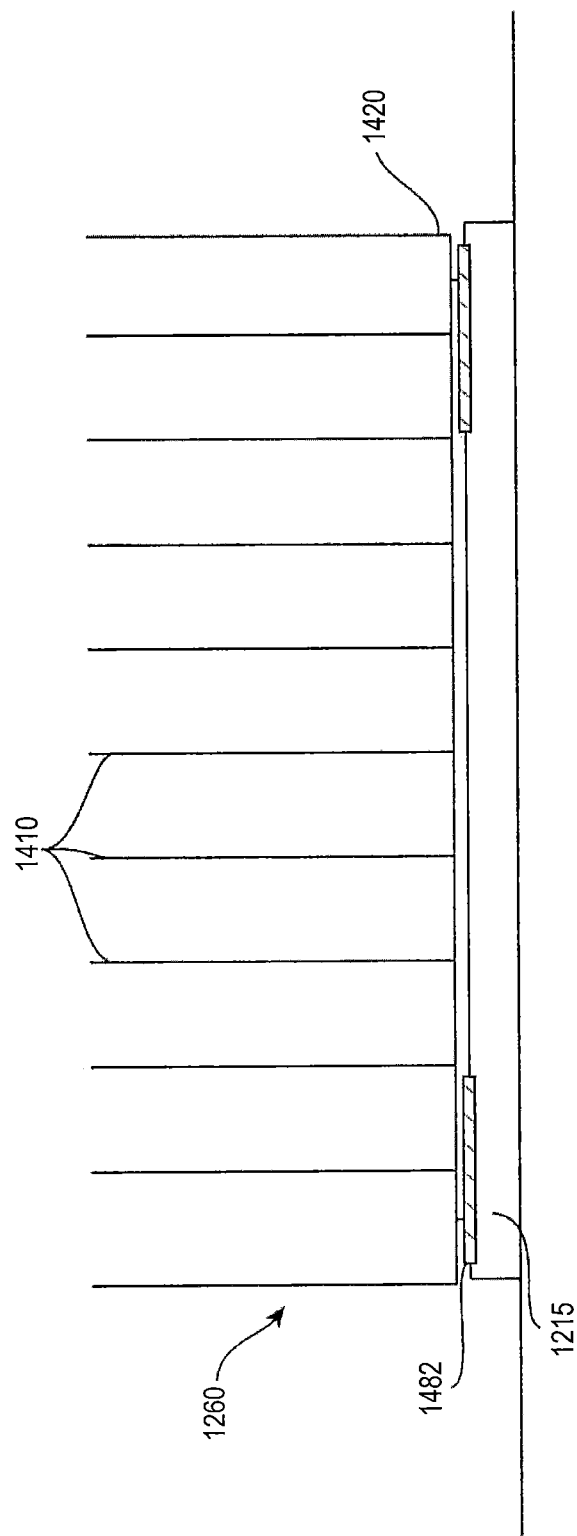

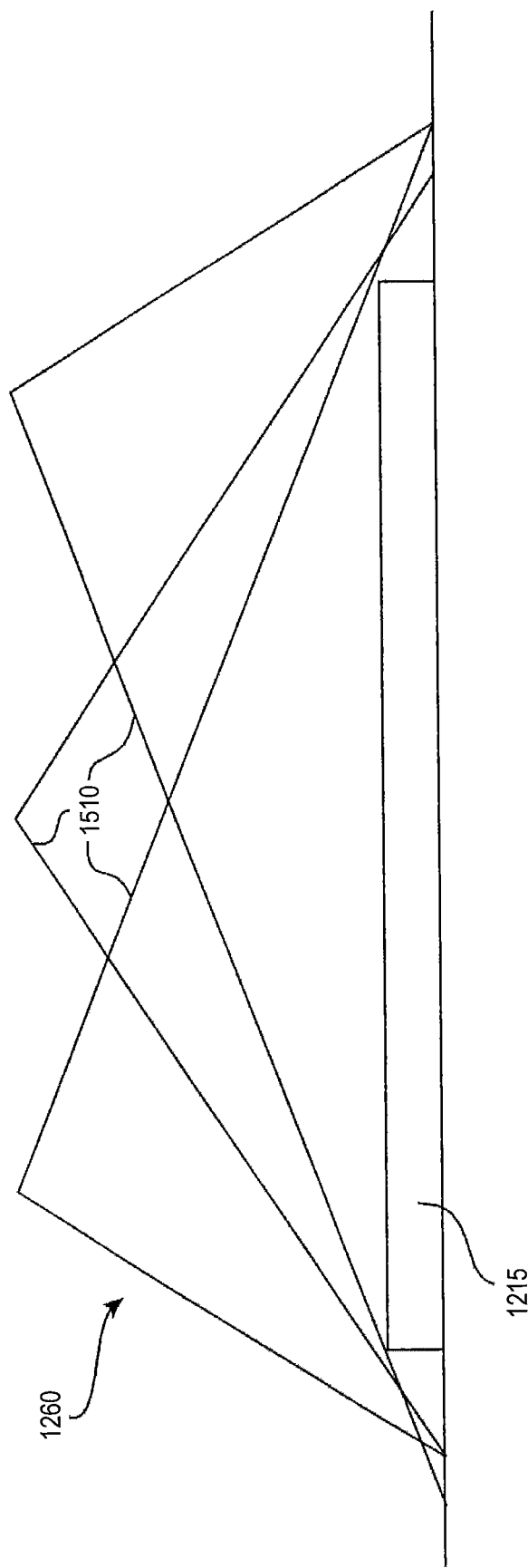

HIGH POWER TRANSISTOR WITH INTERIOR-FED FINGERS

FIELD

The inventive concepts described herein relate to microelectronic devices and, more particularly, to high power, high frequency transistors having unit cell-based structures.

BACKGROUND

Electrical circuits requiring high power handling capability while operating at high frequencies, such as radio frequencies (500 MHz), S-band (3 GHz) and X-band (10 GHz), have in recent years become more prevalent. Because of the increase in high power, high frequency circuits, there has been a corresponding increase in demand for transistors which are capable of reliably operating at radio and microwave frequencies while still being capable of handling higher power loads.

To provide increased output power, transistors with larger gate peripheries have been developed. One technique for increasing the effective gate periphery of a transistor is to provide a plurality of transistor cells that are connected in parallel in a unit cell configuration. For example, a high power transistor may include a plurality of gate fingers that extend in parallel between respective elongated source and drain contacts, as illustrated in FIG. 1.

In particular, FIG. 1 illustrates a metal layout of a conventional semiconductor transistor device 10 that includes a gate pad 12 and a drain pad 32 on a semiconductor substrate 20. FIG. 1 is a plan view of the device (i.e., looking down at the device from above). As shown in FIG. 1, in the conventional semiconductor transistor device 10, the gate pad 12 is connected by a gate bus 14 to a plurality of parallel gate fingers 16 that are spaced apart from each other along a first direction (e.g., the Y-direction indicated in FIG. 1) and extend in a second direction that crosses the first direction (e.g., the X-direction indicated in FIG. 1). The drain pad 32 is connected to a plurality of drain contacts 36 via a drain bus 34. In addition, source contacts 26 may also be located on the semiconductor transistor device 10. Each gate finger 16 runs along the X-direction between a pair of adjacent source and drain contacts 26, 36. A unit cell of the semiconductor transistor device 10 is illustrated at box 40, and includes a gate finger 16 that extends between adjacent source and drain contacts 26, 36. The "gate length" refers to the distance of the gate metallization in the Y-direction, while the "gate width" is the distance by which the source and drain contacts 26, 36 overlap in the X-direction. That is, "width" of a gate finger 16 refers to the dimension of the gate finger 16 that extends in parallel to the adjacent source/drain contacts 26, 36 (the distance along the X-direction). The gate periphery of the device refers to the sum of the gate widths for each gate finger 16 of the semiconductor transistor device 10.

In addition to adding unit cells, the gate periphery of a multi-cell transistor device may be increased by making the gate fingers wider (i.e., longer in the X-direction). As the gate fingers of a device become wider, however, the high frequency performance of the device may be adversely impacted. In addition, making the gate fingers wider typically means that the gate fingers must handle increased current levels, which can cause electromigration of the gate finger metallization.

SUMMARY

Pursuant to some embodiments of the present invention, transistor devices are provided that include a gate finger and a drain finger extending on a semiconductor structure, a gate bond pad coupled to the gate finger, and a drain bond pad coupled to the drain finger, where the gate bond pad extends on the gate finger and/or the drain bond pad extends on the drain finger In some embodiments, the transistor device further includes an isolation material arranged on an area between the gate bond pad and the drain bond pad.

In some embodiments, the isolation material is a conductive isolation material, a magnetic isolation material, or a lossy dielectric isolation material.

In some embodiments, the isolation material comprises a plurality of third bond wires.

In some embodiments, the transistor device further includes an input bond wire coupled to the gate bond pad, and an output bond wire coupled to the drain bond pad, where the isolation material is physically between the input bond wire and the output bond wire.

In some embodiments, the gate bond pad extends on the drain finger and the gate finger.

In some embodiments, the transistor device further includes a gate interconnect coupled to the gate finger, wherein the gate bond pad is coupled to the gate interconnect at an interior position of the gate interconnect.

In some embodiments, the interior position of the gate interconnect is between one-third and two-thirds of a distance between a first end and a second end of the gate interconnect.

In some embodiments, the interior position of the gate interconnect is at a halfway point between a first end and a second end of the gate interconnect.

In some embodiments, the gate bond pad is coupled to the gate interconnect by a multi-segment conductive via.

In some embodiments, the gate finger and the drain finger extend in a first direction, and the gate bond pad and the drain bond pad extend in a second direction that crosses the first direction.

In some embodiments, the transistor device further includes a field plate between the gate bond pad and the gate finger.

Pursuant to further embodiments of the present invention, transistor devices are provided that include a gate finger and a drain finger, a gate interconnect coupled to the gate finger, a drain interconnect coupled to the drain finger, a gate bond pad coupled to the gate interconnect at an interior position of the gate interconnect, and a drain bond pad coupled to the drain interconnect at an interior position of the drain interconnect, where the gate bond pad extends on the gate finger and/or the drain bond pad extends on the drain finger.

In some embodiments, the transistor device further includes an input bond wire coupled to the gate bond pad, an output bond wire coupled to the drain bond pad, and an isolation material physically between the input bond wire and the output bond wire.

In some embodiments, the isolation material is a conductive isolation material, a magnetic isolation material, or a lossy dielectric isolation material that is configured to reduce a coupling between the input bond wire and the output bond wire.

In some embodiments, the isolation material comprises a plurality of third bond wires.

In some embodiments, the gate bond pad extends on the drain finger and the gate finger.

In some embodiments, the transistor device further includes a field plate between the gate bond pad and the gate finger.

Pursuant to further embodiments of the present invention, transistor devices are provided that include a gate finger and a drain finger extending in a first direction, a gate bond pad extending in a second direction, crossing the first direction, and having an input bond wire coupled thereto, a drain bond pad extending in the second direction and having an output bond wire coupled thereto, where the gate bond pad extends on the gate finger and/or the drain bond pad extends on the drain finger.

In some embodiments, the transistor device further includes an isolation material between the input bond wire and the output bond wire.

In some embodiments, the isolation material extends in the second direction between the input bond wire and the output bond wire.

In some embodiments, the transistor device further includes a gate interconnect coupled to the gate finger, wherein the gate bond pad is coupled to the gate interconnect at an interior position of the gate interconnect.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings:

FIG. 14A is a schematic cross-sectional view illustrating an isolation material, according to further embodiments of the invention. FIG. 14B illustrates an embodiment in with the transistor die has ground pads on a top surface of the transistor die, according to further embodiments of the invention.

FIG. 15A is a cross-sectional view illustrating the configuration of an isolation material incorporating isolation bond wires, according to some embodiments of the invention.

DETAILED DESCRIPTION

Figure 1:
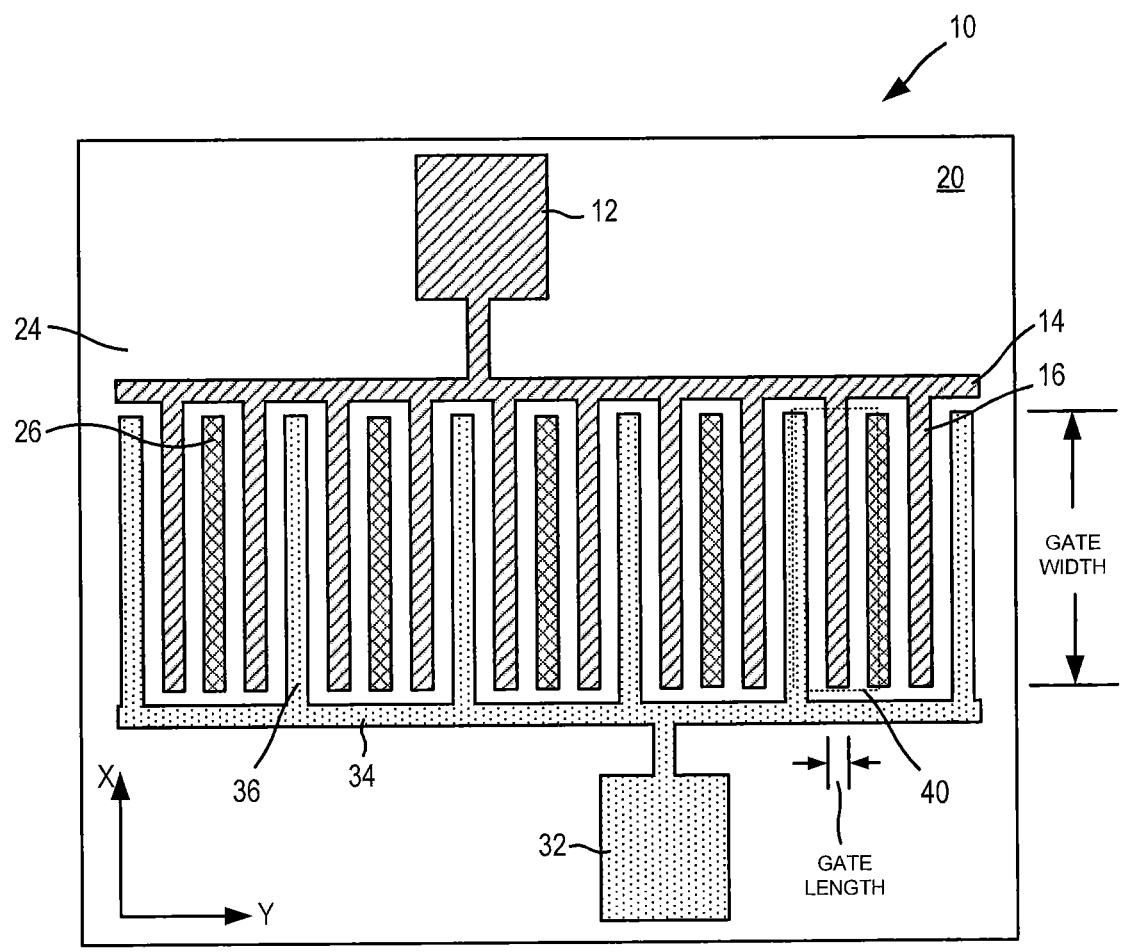
FIG. 1 is a plan view of a metal layout of a conventional multi-cell transistor.

Embodiments of the present inventive concepts are described more fully hereinafter with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

Embodiments of the inventive concepts provide multi-cell transistor devices with large effective gate widths. By feeding the gate signal to the gate fingers at an interior position of the gate interconnect, such as a midpoint of a gate interconnect, large phase differences that can occur due to the gate signal propagating across the full length of a long gate finger may be reduced and/or avoided. According to some embodiments, a larger gate width of a multi-cell transistor device can be accommodated by adding a gate runner above a gate interconnect, with a conductive via coupling the gate runner to an interior position on the gate interconnect. The connection of the gate runner to the interior position of the gate interconnect may serve to divide the gate finger into multiple segments. The gate signal may thus travel from the interior position of the gate interconnect to ends of the gate interconnect, and be provided to the gate finger with little to no phase difference in the resulting propagated gate signal.

By effectively dividing the gate finger into segments and distributing the gate signal to each of the gate finger segments by means of a gate runner, the gain performance of the transistor may be increased as compared to conventional devices.

Thus, in some embodiments, transistors are provided that includes a semiconductor structure, a plurality of gate fingers extending on the semiconductor structure in a first direction, a plurality of gate interconnects that each have a first end and a second end extending on the semiconductor structure in the first direction, a plurality of gate runners extending on the semiconductor structure in the first direction, and a gate manifold on the semiconductor structure and connected to the gate runners. Each gate interconnect is connected to a respective gate finger by a plurality of first conductive vias. The gate interconnects are connected to the respective gate runners by respective second conductive vias at interior positions of the gate interconnects that are remote from the respective first ends and the respective second ends of the gate interconnects. The semiconductor structure may comprise, for example, a semiconductor or non-semiconductor substrate having one or more semiconductor epitaxial layers grown thereon. The substrate may be removed in some embodiments.

In some embodiments, transistors are provided that include a semiconductor structure, a plurality of source regions and a plurality of drain regions alternately arranged on the semiconductor structure, a plurality of gate fingers extending respectively at a first level between adjacent ones of the plurality of source regions and the plurality of drain regions, a plurality of gate interconnects on the semiconductor structure at a second level above the semiconductor structure that is higher than the first level, a plurality of gate runners on the semiconductor structure at a third level above the semiconductor structure that is higher than the second level, and a gate manifold on the semiconductor structure and connected to the gate runners. Each of the gate interconnects is connected to a respective gate finger by a plurality of first conductive vias. Each gate runner is connected to a respective gate interconnect by a second conductive via, the second conductive via connecting to the respective gate interconnect at a respective first interior position on the gate interconnect that overlaps an adjacent source region.

In some embodiments, transistors are provided that include a semiconductor structure, a plurality of gate fingers extending on the semiconductor structure, a plurality of gate interconnects on the semiconductor structure, each of the plurality of gate interconnects electrically coupled to respective ones of gate fingers, where each gate interconnect of the plurality of gate interconnects has a first end and a second end, and a plurality of gate runners on the semiconductor structure. Each gate is connected to at least one gate interconnect by a conductive via. Current received at the first end of the at least one gate interconnect via the conductive via has less than 1 degree phase difference from current received at the second end of the at least one gate interconnect via the conductive via.

Embodiments of the present invention will now be described in greater detail with reference to FIGS. 2A-11.

As discussed in the Background section, one technique for increasing the effective gate periphery of a transistor is to provide a plurality of unit cell transistors that are connected in parallel. Such a plurality of unit cell transistors may be used in applications involving high frequency and/or high power. For example, base stations may use RF power amplifiers in the final stage of signal amplification to generate the high output power required for coverage of the cell. An important element in these RF power amplifiers, as well as similar applications, is the unit cell transistors that produce the amplification mechanism.

Figure 2A:
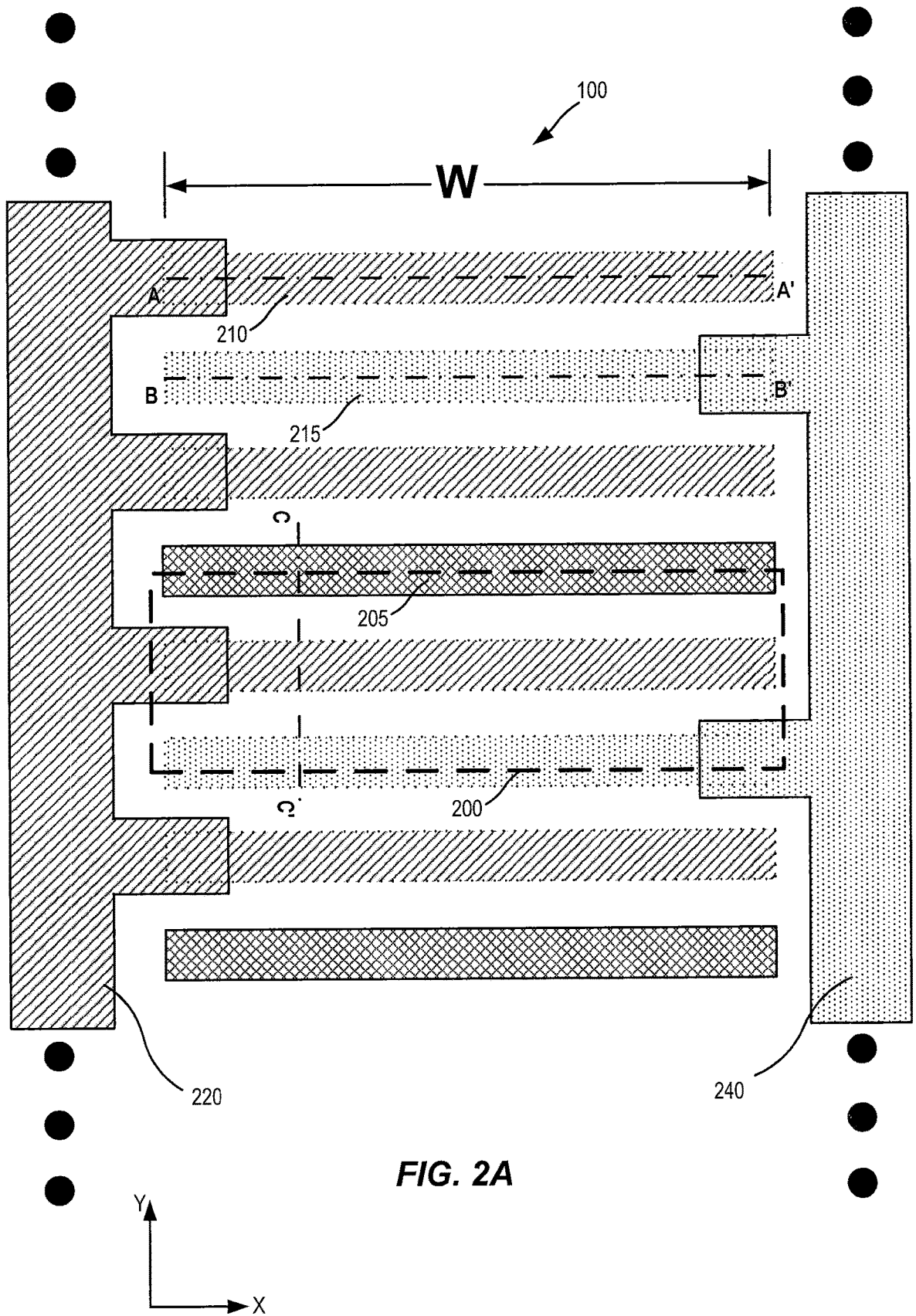
FIG. 2A is a plan view illustrating embodiments of a multi-cell transistor utilizing gate and drain runners.
Figure 2B:
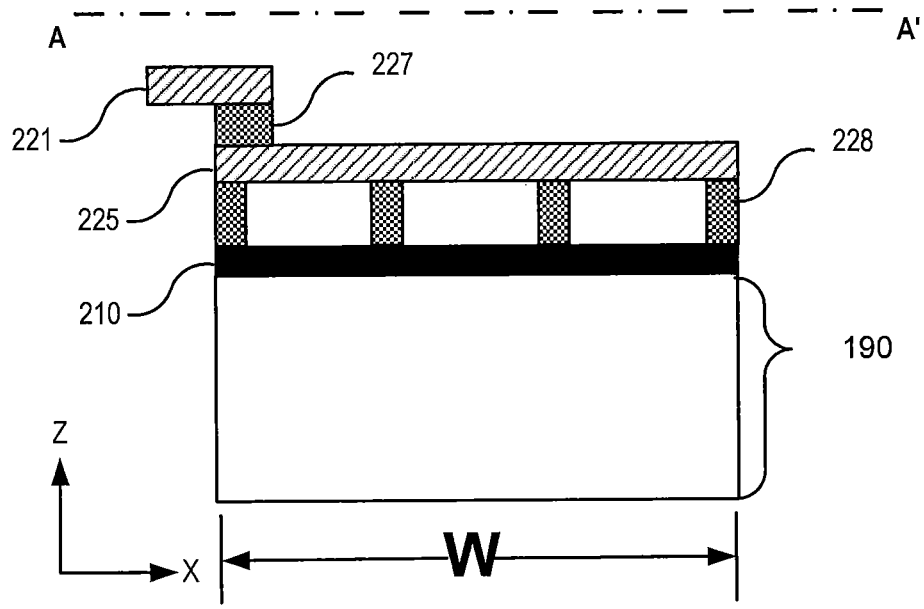
FIG. 2B is a cross section of FIG. 2A taken along the line A-A'.
Figure 2C:
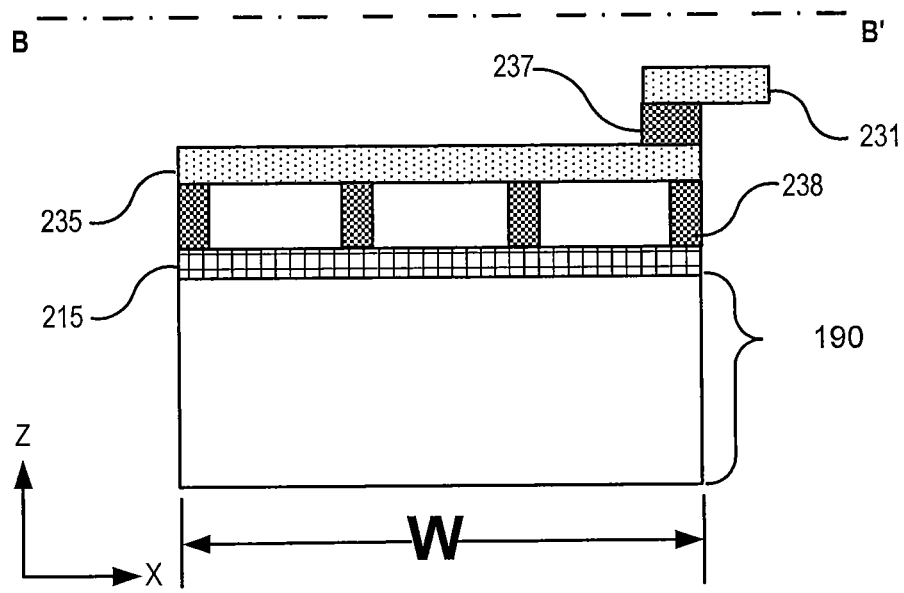
FIG. 2C is a cross section of FIG. 2A taken along the line B-B'.

FIG. 2A is a plan view illustrating embodiments of a multi-cell transistor utilizing gate and drain runners. FIG. 2B is a cross section of FIG. 2A taken along the line A-A'. FIG. 2C is a cross section of FIG. 2A taken along the line B-B'.

Referring first to FIG. 2A, a transistor device 100 is illustrated that includes a plurality of transistor cells 200. The active region of a transistor cell 200 may include a gate finger 210, a drain finger 215, and a source contact 205. During amplification, current flows between the drain finger 215 and the source contact 205, and the amount of current may be modulated by a voltage signal applied to the gate finger 210.

As illustrated in FIG. 2B, a gate signal may be provided to the transistor cell 200 via a gate finger 210. The gate finger 210 may be electrically coupled to gate regions of a transistor cell 200. Similarly, as illustrated in FIG. 2C, a drain signal may be provided to the transistor cell 200 via a drain finger 215.

The gate finger 210, a drain finger 215, and a source 205 may be formed on a semiconductor structure 190 which contains an embodiment of a transistor. More specifically, the drain finger 215, the source contact 205, and the gate finger 210, may be respectively coupled to a drain region, a source region, and a gate region (e.g., a channel) of a semiconductor implementation of a transistor cell 200. It will be understood that multiple embodiments of a semiconductor-based transistor cell 200 are possible to which the drain finger 215, the source contact 205, and the gate finger 210 of FIG. 2A may be connected. For example, the drain finger 215, the source contact 205, and the gate finger 210 may be coupled to LDMOS and/or HEMT transistor embodiments, though the present invention is not limited thereto.

Figure 3A:
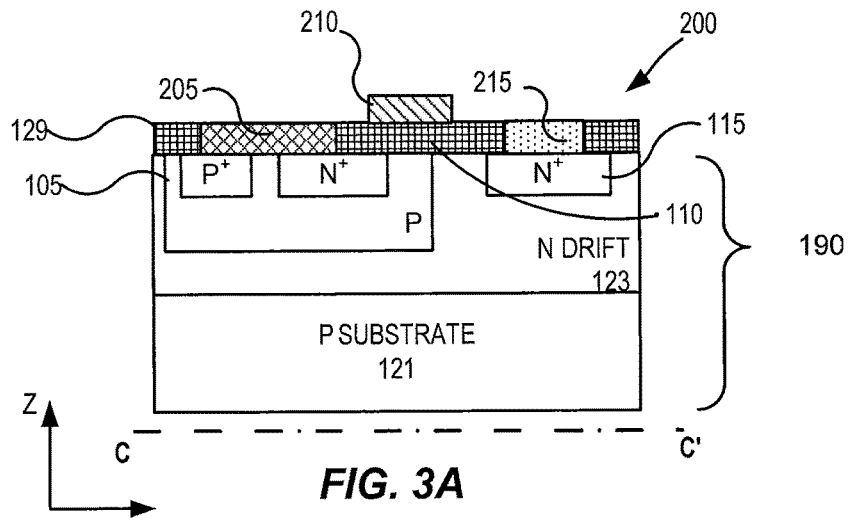
FIG. 3A is a cross section of a unit cell of a conventional laterally diffused metal oxide semiconductor (LDMOS) transistor device.

For example, FIG. 3A, which is a cross section of FIG. 2A taken along the line C-C', illustrates an implementation of the transistor cell 200 of FIG. 2A where the transistor cell is an LDMOS transistor cell. An LDMOS field effect transistor (FET) is a 3-terminal transistor device that has a source region 105 and a drain region 115 that are formed in a semiconductor structure 190. The semiconductor structure 190 includes a semiconductor substrate 121 (e.g., of p-type conductivity) and a drift layer 123 (e.g., of n-type conductivity) on the semiconductor substrate 121. The semiconductor substrate may include semiconductor and non-semiconductor substrates, including, for example, sapphire, diamond, aluminum nitride, aluminum gallium nitride, gallium nitride, silicon, silicon carbide, GaAs, LGO, ZnO, LAO, InP and the like. The LDMOS transistor cell 200 may include doped well regions providing the source region 105 and drain region 115. The source region 105, drain region 115, and gate region 110 of the LDMOS transistor cell 200 may be coupled to contacts for operation of the LDMOS transistor cell 200. For example, the gate region 110 may be electrically coupled to the gate fingers 210 that are illustrated in FIG. 2A. Similarly, drain region 115 may be electrically coupled to the drain fingers 215 illustrated in FIG. 2A.

The gate region 110 is isolated from the conducting channel by an insulator layer 129 (e.g., $SiO_2$). Applying a positive voltage to the gate region 110 with respect to the source region 105 may provide for a current to flow between drain region 115 and the source region 105 by forming an inversion layer (e.g., a channel) between the source region 105 and the drain region 115. LDMOS FETs may operate in "enhancement mode," meaning the drain-source current may not flow until an applied positive gate voltage enhances a channel across the p-well.

Figure 3B:
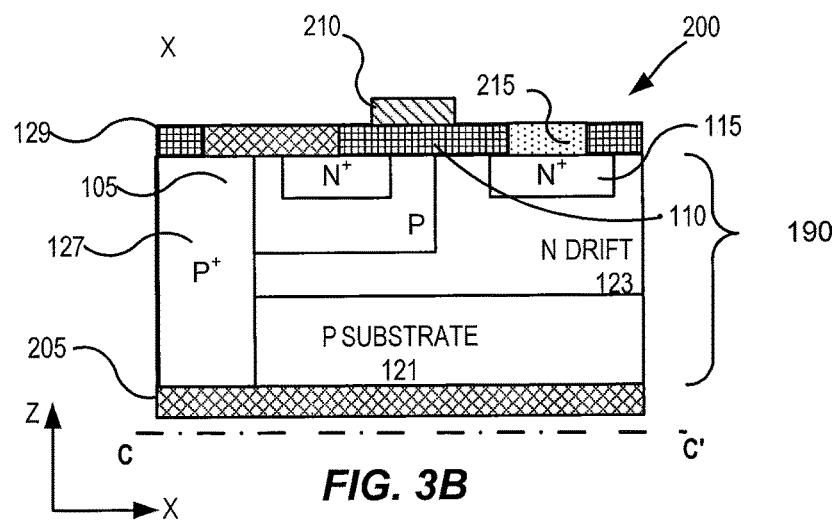
FIG. 3B is a cross section of a unit cell of a conventional LDMOS transistor device utilizing a bottom source terminal.

Though FIG. 3A illustrates the LDMOS with a contact connected to an upper surface of the source region 105 of the LDMOS transistor cell 200, it will be understood that other embodiments are possible. For example, in some embodiments, vias or other connection regions may be provided to connect the source region 105 to a contact on the bottom surface of the LDMOS device. For example, FIG. 3B is a cross section of a conventional LDMOS transistor cell 200 utilizing a bottom source contact 205. As illustrated in FIG. 3B, a laterally diffused, low-resistance p+ "sinker" 127 may connect the source region 105 to the substrate 121 and the source contact 205. When the LDMOS device of FIG. 3B is used in conjunction with a parallel transistor configuration such as that illustrated in FIG. 2A, source fingers and/or other source contacts may not be necessary on a top surface of the device. In some embodiments, source fingers similar to the gate fingers 210 and/or drain fingers 215 may be provided.

Figure 3C:
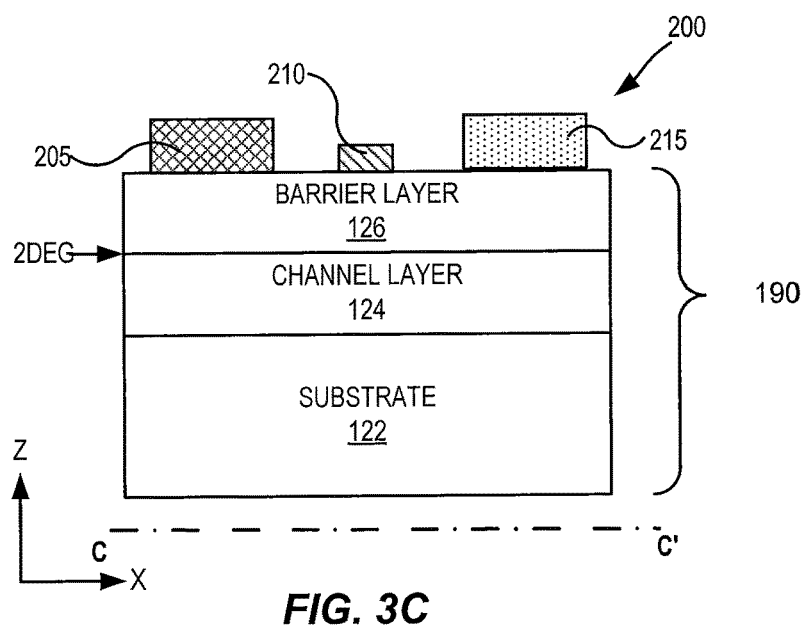
FIG. 3C is a cross section of a conventional high-electron-mobility transistor (HEMT) cell.

FIG. 3C, which is a cross section of FIG. 2A taken along the line C-C', illustrates an implementation of the transistor cell 200 of FIG. 2A where the transistor cell 200 is a HEMT transistor cell. As illustrated in FIG. 3C, a HEMT transistor cell 200 may include a semiconductor structure 190 including a substrate 122, which may, for example, include 4H-SiC or 6H-SiC. Although silicon carbide may be used as a substrate material, embodiments of the present invention may utilize any suitable substrate, such as sapphire, diamond, aluminum nitride, aluminum gallium nitride, gallium nitride, silicon, GaAs, LGO, ZnO, LAO, InP, and the like. An epitaxial structure is formed on the substrate 122. The epitaxial structure may include a channel layer 124 that is formed on the substrate 122, and a barrier layer 126 that is formed on the channel layer 124. The channel layer 124 and the barrier layer 126 may include Group III-nitride based materials, with the material of the barrier layer 126 having a higher bandgap than the material of the channel layer 124. For example, the channel layer 124 may comprise GaN, while the barrier layer 126 may comprise AlGaN. While the channel layer 124 and the barrier layer 126 are illustrated as single layer structures, it will be appreciated that either or both the channel layer 124 and/or the barrier layer 126 may be implemented as multi-layer structures. It will also be appreciated that additional layers such as, for example, buffer layers, strain-balancing layers, transition layers and the like may also be included as part of the epitaxial structure provided on the substrate 122.

Due to the difference in bandgap between the barrier layer 126 and the channel layer 124 and piezoelectric effects at the interface between the barrier layer 126 and the channel layer 124, a two dimensional electron gas (2DEG) is induced in the channel layer 124 at a junction between the channel layer 124 and the barrier layer 126. The 2DEG acts as a highly conductive layer that allows conduction between the source and drain regions of the device that are beneath a source contact segment 205 and a drain finger 215, respectively. The source contact segment 205 and the drain finger 215 are formed on the barrier layer 126. A gate finger 210 is formed on the barrier layer 126 between the drain finger 215 and the source contact segment 205.

The LDMOS and HEMT devices of FIGS. 3A, 3B, and 3C are included as examples for possible configurations of a transistor cell 200. However, it will be understood that other transistor cell configurations could be utilized with the present invention without deviating from the scope of the embodiments described herein. For example, any configuration of a transistor cell 200 that may be combined with other transistor cells using a gate finger and/or drain finger may benefit from the embodiments described herein. As such, the present invention is not limited to HEMT and LDMOS transistor cells. As used herein, the term "semiconductor structure" will be used to refer to the transistor cell configurations to which the gate fingers 210 and drain fingers 215 of FIG. 2A may be connected (such as, for example, the LDMOS and HEMT examples illustrated in FIGS. 3A, 3B, and 3C).

Referring back to FIGS. 2A, 2B, and 2C, the gate finger 210 may be coupled to a gate runner 225 by a plurality of first conductive gate vias 228. In some embodiments, the gate runner 225 may be at a higher level above the semiconductor substrate than the gate finger 210. The gate runner 225 may be further connected to a gate pad 221 by a second conductive gate via 227. The gate pad 221 may be further connected to a gate manifold 220. The gate manifold 220 may provide the gate signal to a plurality of the transistor cells 200.

The drain finger 215 may be coupled to a drain runner 235 by a plurality of first conductive drain vias 238. In some embodiments, drain runner 235 may be at a higher level above the semiconductor structure 190 than the drain finger 215. The drain runner 235 may be further connected to a drain pad 231 by a second conductive drain via 237. The drain pad 231 may be further connected to a drain manifold 240. The drain manifold 240 may provide the drain signal to the plurality of transistor cells 200.

For a given fixed drain bias voltage provided to the transistor device 100, the amount of output current affects the output power of the transistor device 100. The output current is based, in part, on the total gate periphery, which is the gate finger width (W) shown in FIGS. 2A-2B multiplied by the number of gate fingers 210.

A larger gate periphery may be used to produce higher power in the transistor device 100. This higher power output may be achieved either by increasing the number of gate fingers 210, and/or by increasing the width of the gate fingers 210 (e.g., extending the gate fingers 210 in the X-direction). However, each solution has its limitations.

Figure 4:
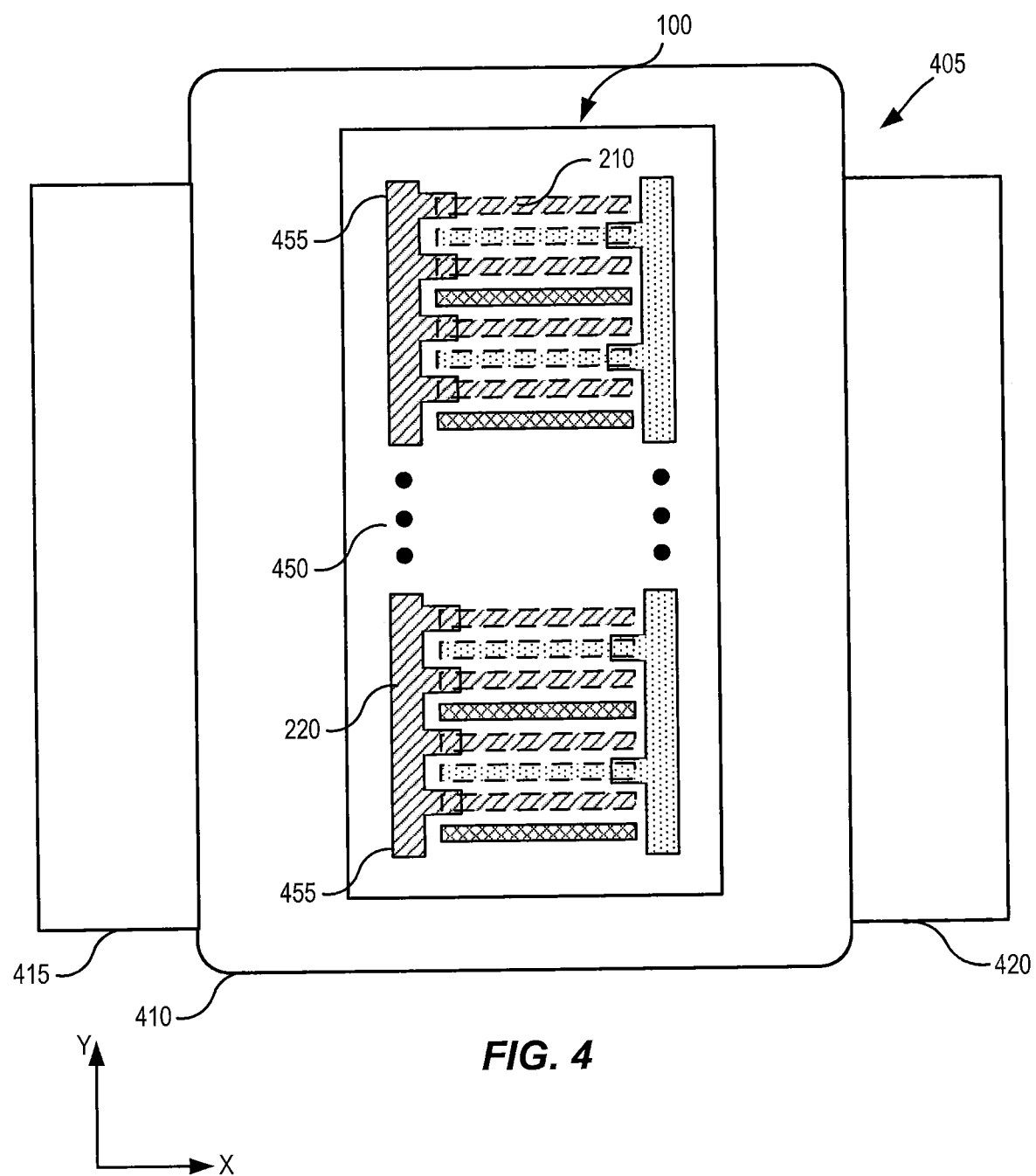
FIG. 4 is a plan view illustrating a transistor device in which a number of gate fingers is increased.

For example, increasing the number of gate fingers 210 may increase the final transistor die physical width (e.g., in the Y-direction in FIG. 2A). The physical transistor package and/or semiconductor processing equipment may therefore put a constraint on the maximum number of gate fingers 210 that may be included in the device (or alternatively, a maximum extent to which the device may extend in the Y-direction). This can be seen with reference to FIG. 4 which is a plan view of a transistor device 100 having a large number of gate fingers 210. As can be seen in FIG. 4, the size of the physical transistor package 405 may be limited by a size of a base 410 upon which the transistor device 100 is placed. The physical transistor package 405 may also be affected by the size of the package leads, such as a gate lead 415 and/or a drain lead 420.

As also illustrated in FIG. 4, another potential downside of using an increased number of gate fingers 210 in a transistor device 100 is the non-uniform signal phase distribution that may occur along the length of the gate manifold 220. The magnitude of the impact that increasing the number of gate fingers may have on the signal phase distribution and device performance may depend on the design of the transistor device. A given transistor device 100 may have a central portion 450 and end portions 455. As the length of the gate manifold 220 becomes longer, a phase difference may occur in signals, such as, for example, the gate signal transmitted to gate fingers 210, that are transmitted along the length of the gate manifold 220 (e.g., in the Y-direction). In some embodiments, the gate signal may be received from the gate lead 415 primarily at the central portion 450 of the gate manifold 220, to be distributed to the end portions 455 of the gate manifold 220. Because of differences in transmission lengths, a phase of a gate signal at an end portion 455 may differ from a phase at a central portion 450. The drain current produced at these different regions may also therefore not be summed in phase at the output (e.g., at drain lead 420), causing a degradation in the total output current magnitude and consequently, in the output power of the transistor device 100.

Figure 5A:
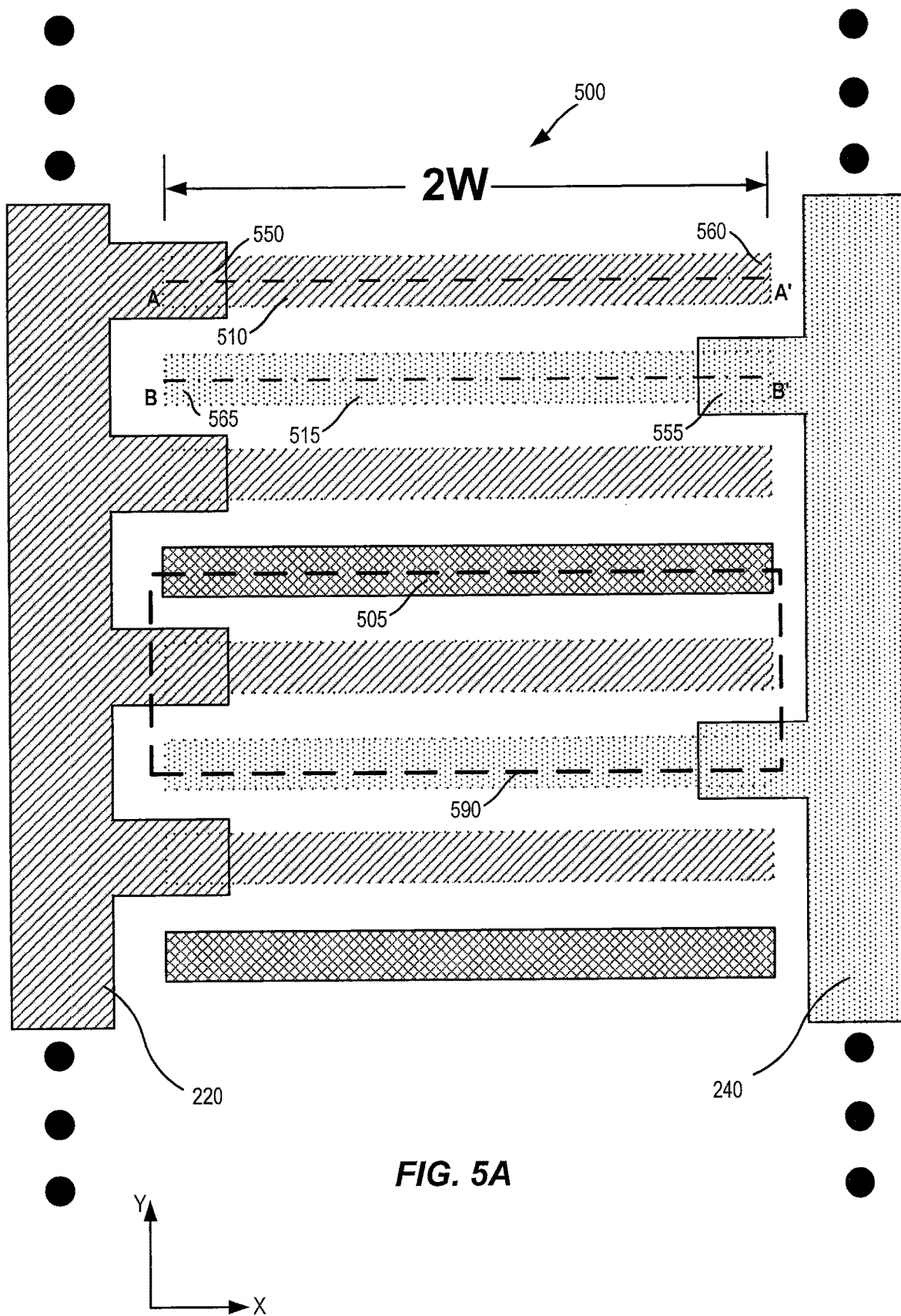
FIG. 5A is a plan view illustrating a transistor device in which a width of gate fingers is increased.
Figure 5B:
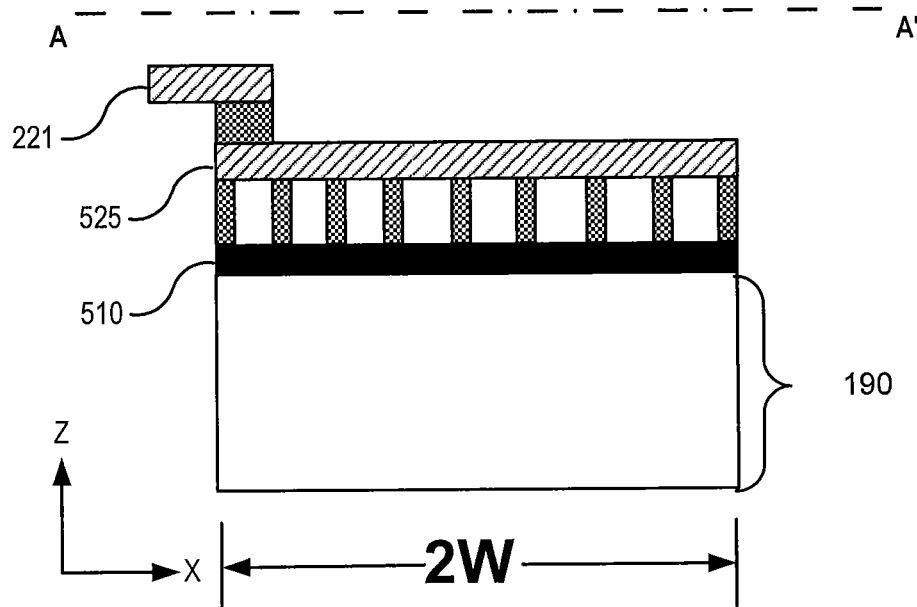
FIG. 5B is a cross section of FIG. 5A taken along the line A-A'.
Figure 5C:
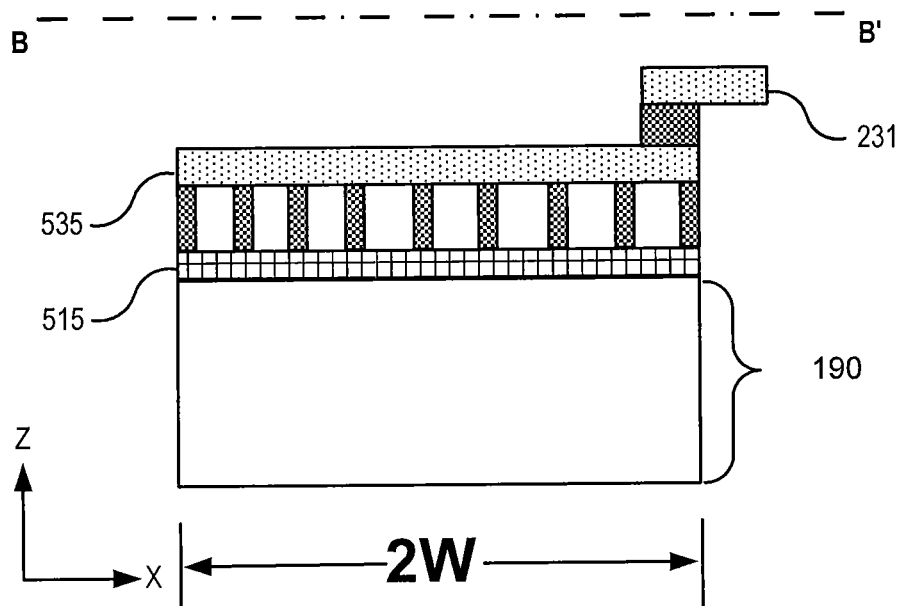
FIG. 5C is a cross section of FIG. 5A taken along the line B-B'.

In addition to increasing the number of gate fingers within the transistor device 100, another technique to increase the transistor output power may include increasing the gate finger width (W), along with corresponding increases in the widths of the source contacts and the drain fingers. FIG. 5A is a plan view illustrating an embodiment of a transistor device 500 in which the widths of the gate fingers 510, the source contacts 505 and the drain fingers 515 are increased. FIG. 5B is a cross section of FIG. 5A taken along the line A-A'. FIG. 5C is a cross section of FIG. 5A taken along the line B-B'.

The transistor device 500 of FIGS. 5A-5C may closely resemble the transistor device of FIGS. 2A-2C. However, the width of the gate fingers 510, the source contacts 505 and the drain fingers 515 included in the transistor device 500 is increased as compared to the widths of the corresponding gate fingers 210, source contacts 205 and drain fingers 215 of the transistor device 100. For example, a width of the gate fingers 510 of the transistor device 500 may be 2W (e.g., twice as wide as the gate width of the gate fingers 210 of transistor device 100). The gate fingers 510, source contacts, and drain fingers 515 with the increased width may be connected to the semiconductor structure 190 to form a transistor cell 590. The widened gate fingers 510 may include gate pads 221 and gate runners 525, with structure similar to that discussed herein with respect to the gate pads 221 and gate runners 225 of FIG. 2B. The widened drain fingers 515 may include drain pads 231 and drain runners 535, with structure similar to that discussed herein with respect to the drain pads 231 and drain runners 235 of FIG. 2C. Other aspects of the transistor device 500 may be similar to the transistor device 100 discussed above with respect to FIGS. 2A-2C. In addition, it will be appreciated that the transistor device 500 may include the semiconductor structure 190 that is may be configured as, for example, a HEMT or as other types of transistors such as, for example, LDMOS transistors in the same manner as the transistor device 100 as discussed above with reference to FIGS. 3A-3C.

Unfortunately, increasing the width of the gate fingers 510 may introduce performance issues. The first issue is an increase in gate resistance. (See, e.g., P. H. Aaen, J. A. Pla, J. Wood, "Modeling and Characterization of RF and Microwave Power FETs," Cambridge University Press, 2007). If the number of gate fingers 510 is held constant and the length of the gate fingers 510 is changed, the gate resistance $R_{new}$ for the new configuration of gate fingers 510 is given by:

$$R_{new} = R_{orig}\left(\frac{W_{new}}{W_{orig}}\right) \quad \text{[Equation 1]}$$

where $R_{orig}$ and $W_{orig}$ are the gate resistance and gate finger width, respectively, for the original gate finger configuration (e.g., gate finger 210 of FIG. 2A), and $W_{new}$ is the width of a gate finger in the new configuration (e.g., gate finger 510 of FIG. 5A). As can be seen from Equation 1, increasing the gate finger width from W to 2W doubles the gate resistance. Increasing the gate resistance may result in a lower transistor gain, an important specification for an amplifier. For example, if a transistor with a gate finger length of W produces an output power of P, doubling the width of the gate fingers 510 to 2W produces an output power that is lower than 2P. This non-linear scaling also poses a challenge for power amplifier designers in selecting the correct transistor die size for a given output power requirement. The increased resistance also reduces the efficiency of the amplifier.

Another drawback associated with gate fingers 510 and/or drain fingers 515 having large widths is the increase in a phase difference that occurs in the signal along the length of the finger (e.g., from region 550 to region 560 of the gate finger 510 and/or from region 555 to region 565 of the drain finger 515). This phase difference may be caused by various distributed effects related to the transmission distance along the gate finger 510 and/or the drain finger 515. These phase differences can degrade the total output current magnitude after being summed up (combined) at the drain manifold 240. The end result may be a lower output power for the transistor device 500 than expected from the increased dimensions. Since the input power is the same, this may also contribute to the gain degradation phenomenon.

Additionally, the out-of-phase current combining may affect the time-domain output current waveform shape, and may impact the transistor efficiency, which is another key specification for a power amplifier. (See, e.g., S. C. Cripps, "RF Power Amplifiers for Wireless Communications," Artech House, 2006.) The non-uniform phase phenomenon may also be present in the original shorter gate fingers 210 of FIGS. 2A-2C, but to a smaller degree.

Figure 6A:
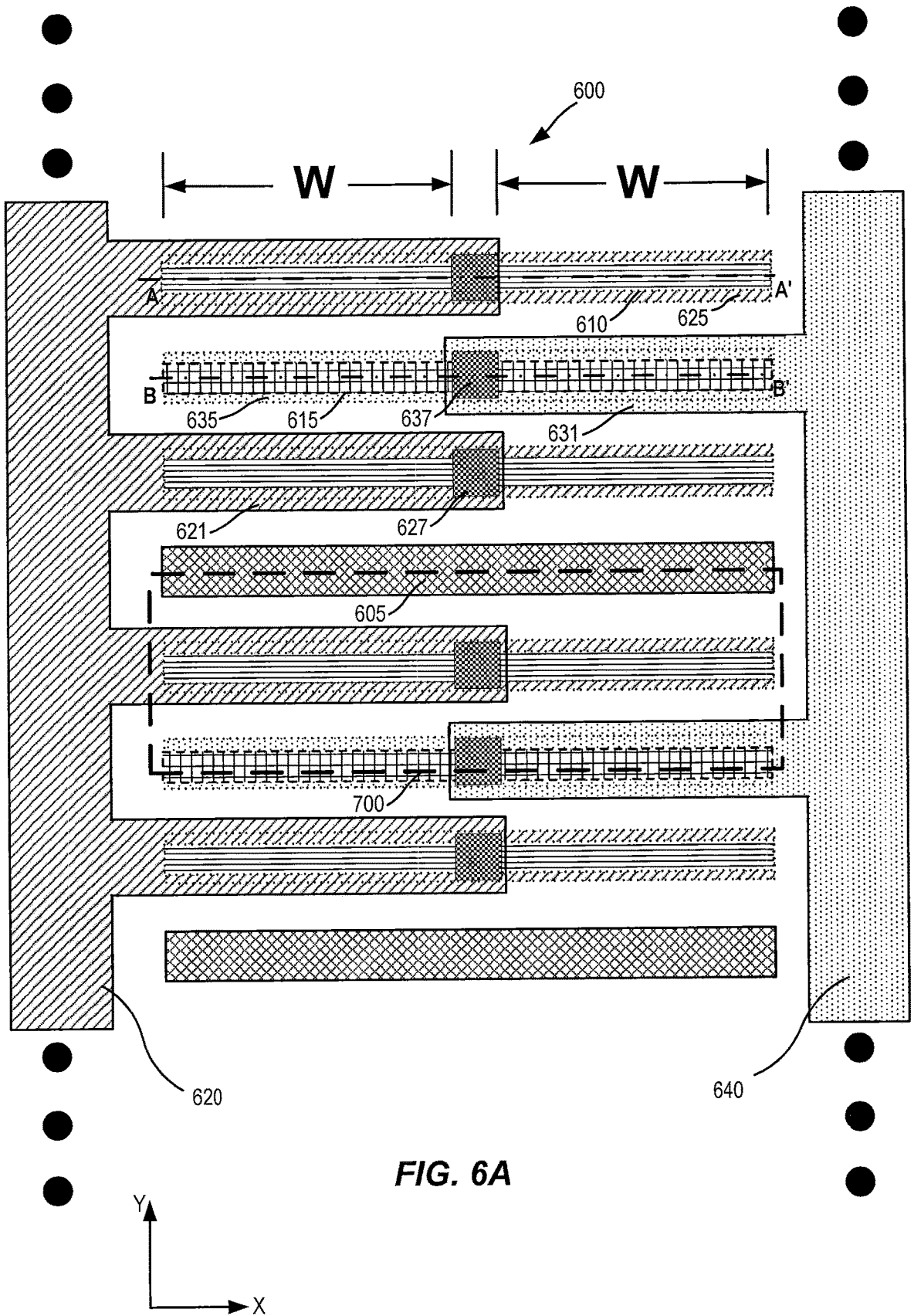
FIG. 6A is a plan view illustrating a transistor device in which a width of gate fingers is increased, according to some embodiments of the invention.
Figure 6B:
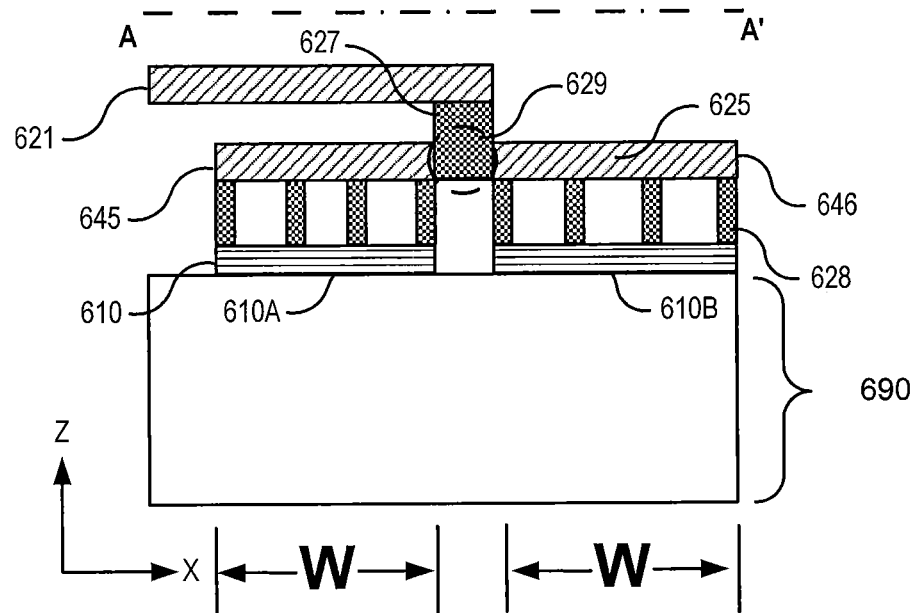
FIG. 6B is a cross section of FIG. 6A taken along the line A-A', according to some embodiments of the invention.
Figure 6C:
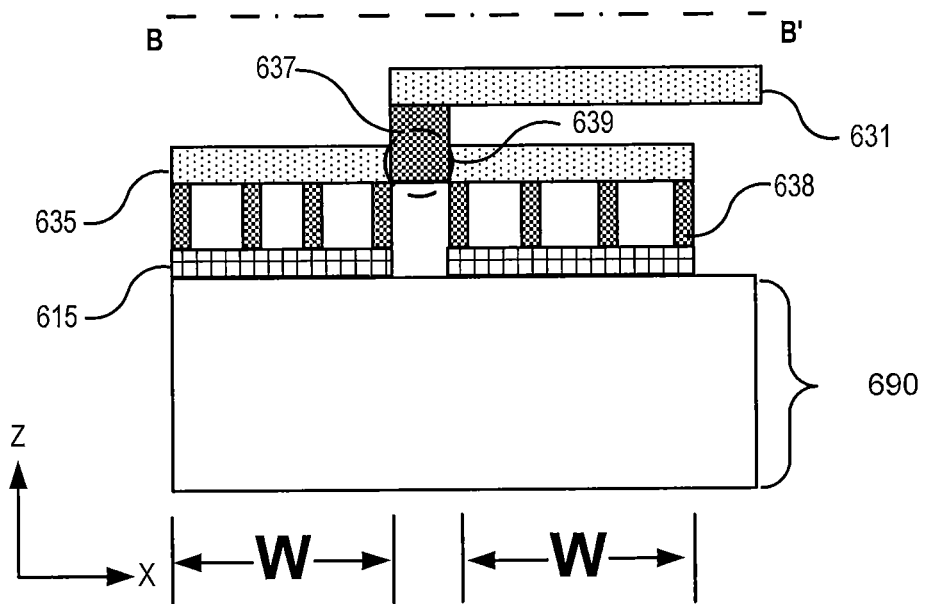
FIG. 6C is a cross section of FIG. 6A taken along the line B-B', according to some embodiments of the invention.

To mitigate these issues when higher output power is required, a solution is proposed as shown in FIGS. 6A, 6B, and 6C. FIG. 6A is a plan view illustrating a transistor device 600 in which the width of gate fingers 610 are increased, according to some embodiments of the invention. FIG. 6B is a cross section of FIG. 6A taken along the line A-A', according to some embodiments of the invention. FIG. 6C is a cross section of FIG. 6A taken along the line B-B', according to some embodiments of the invention.

As illustrated in FIGS. 6A, 6B, and 6C some embodiments of the present invention may provide a plurality of transistor cells 700 repeatedly arranged on a semiconductor structure 690. It will be appreciated that the transistor cells 700 may be formed of semiconductor structures 690 such as those illustrated in FIGS. 3A-3C (e.g., LDMOS or HEMT transistor cells). The transistors cells 700 may be arranged as part of a transistor device 600 to provide a combined output signal. For example, the respective gate regions, drain regions, and source regions of the plurality of transistor cells 700 may be commonly connected so as to provide a plurality of transistors coupled in parallel.

The transistor cells 700 may be repeatedly arranged in a first direction (e.g., a Y-direction). The gate region, the drain region, and the source region of a respective transistor cell 700 may extend in a second direction (e.g., an X-direction) that crosses the first direction. The active region for each of the transistor cells 700 may include the region of the semiconductor structure 690 in which a respective gate region, drain region, and source region overlap in the first direction (e.g., the X-direction). In some embodiments, the source region of adjacent transistor cells 700 may be a shared source region that acts as a source region for two different gate regions. Similarly, in some embodiments, the drain region of adjacent transistor cells 700 may be a shared drain region that acts as a drain region for two different gate regions.

The transistor device 600 may also include a plurality of gate fingers 610 that are spaced apart from each other along on the semiconductor structure 690 in the first direction (e.g., the Y-direction). Each of the gate fingers 610 may have a width 2W in the second direction (e.g., the X-direction) or some other width that exceeds the width of a conventional transistor device. In some embodiments the width 2W may be 800 microns.

The gate fingers 610 may be disposed on the semiconductor structure 690 to be respectively in electrical contact with the gate regions (e.g., a channel) of the plurality of transistor cells 700. The plurality of gate fingers 610 may provide a gate signal to respective ones of the transistor cells 700.

In some embodiments, the transistor device 600 may also include a plurality of drain fingers 615 that are arranged on the semiconductor structure 690 in the first direction (e.g., the Y-direction). Each of the plurality of drain fingers 615 may have a width 2W in the second direction (e.g., the X-direction), though the present invention is not limited thereto. The plurality of drain fingers 615 may be disposed on the semiconductor structure 690 to be respectively in electrical contact with the drain regions of the plurality of transistor cells 700. The drain fingers 615 may conduct a drain signal of respective ones of the transistor cells 700.

In some embodiments, the transistor device 600 may also electrically connect each of the source regions of respective ones of the transistor cells 700 to a common source signal. In some embodiments, the electrical connection for the source regions may be on a back side of the semiconductor structure 690 (e.g., a side of the semiconductor structure 690 that is opposite the gate fingers 610 and the drain fingers 615. In some embodiments, a plurality of source fingers 605 may also be provided on the same side of the semiconductor structure 690 as the gate fingers 610 and the drain fingers 615. The plurality of source fingers 605 may have a structure similar to that discussed herein with respect to the gate fingers 610 and drain fingers 615.

Each gate finger 610 may be coupled to a gate interconnect 625 by a plurality of first conductive gate vias 628. In some embodiments, the gate interconnects 625 may be at a higher level above the semiconductor structure 690 (e.g., in the Z direction) than the gate fingers 610. In some embodiments, the gate interconnect 625 may have a greater dimension in the first direction (e.g., in the Y-direction) than the gate finger 610. The gate interconnects 625 may be connected to a gate runner 621 by a second conductive gate via 627. In some embodiments, the gate runner 621 may have a greater dimension in the first direction (e.g., in the Y-direction) than the gate interconnects 625. In some embodiments, the gate runner 621 may contain metal or other highly conductive material, including, for example, copper, gold, and/or a composite metal. The gate runner 621 may be further connected to a gate manifold 620. The gate manifold 620 may provide the gate signal to the plurality of transistor cells 700.

In some embodiments, each second conductive gate via 627 that connects a gate runner 621 to a respective gate interconnect 625 may be connected to the gate interconnect 625 at an interior position 629 of the gate interconnect 625. For example, the gate interconnect 625 may have first and second opposed ends 645, 646. In some embodiments, the second conductive gate via 627 may be connected to the gate interconnect 625 at an interior position 629 of the gate interconnect 625 that is between the first end 645 and the second end 646. In some embodiments, the interior position 629 may be at a midpoint of (e.g., halfway between) the first end 645 and the second end 646 of the gate interconnect 625. In some embodiments, the interior position 629 may be at a distance that is within ten percent of the length of the gate interconnect 625 from the midpoint of the gate interconnect 625. In some embodiments, the interior position 629 may be at a distance that is within twenty percent of the length of the gate interconnect 625 from the midpoint of the gate interconnect 625. In some embodiments, the interior position 629 may be at a distance that is between one-third and two-thirds of the distance between the first end 645 and the second end 646 of the gate interconnect 625.

Figure 7:
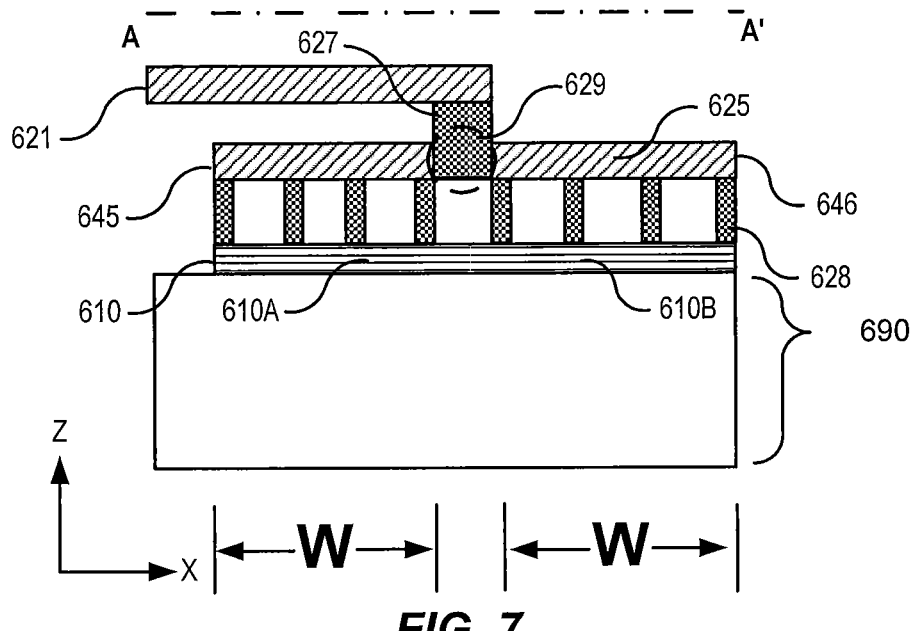
FIGS. 7 and 8 illustrate additional embodiments of the invention, taken along the line A-A' of FIG. 6A.

In some embodiments, each of the gate fingers 610 may be composed of a first segment 610A and a second segment 610B. In some embodiments, the first segment 610A and the second segment 610B may extend collinearly. In some embodiments, the first segment 610A and the second segment 610B may be arranged at opposite sides of the second conductive gate via 627. For example, for a gate finger 610 that has a width 2W, both the first segment 610A and the second segment 610B may have a width W, though the present invention is not limited thereto. In some embodiments, the first segment 610A and the second segment 610B may be physically separated by a gap, as illustrated in FIG. 6B. For example, there may an additional element (e.g., an insulation layer) disposed between the first segment 610A and the second segment 610B. However, the present invention is not limited thereto, and it will be appreciated that in other embodiments the gate finger 610 may not be divided into separate first and second segments 610A, 610B. For example, FIG. 7 illustrates an embodiment in which the first segment 610A and second segment 610B are integrally connected.

Figure 8:
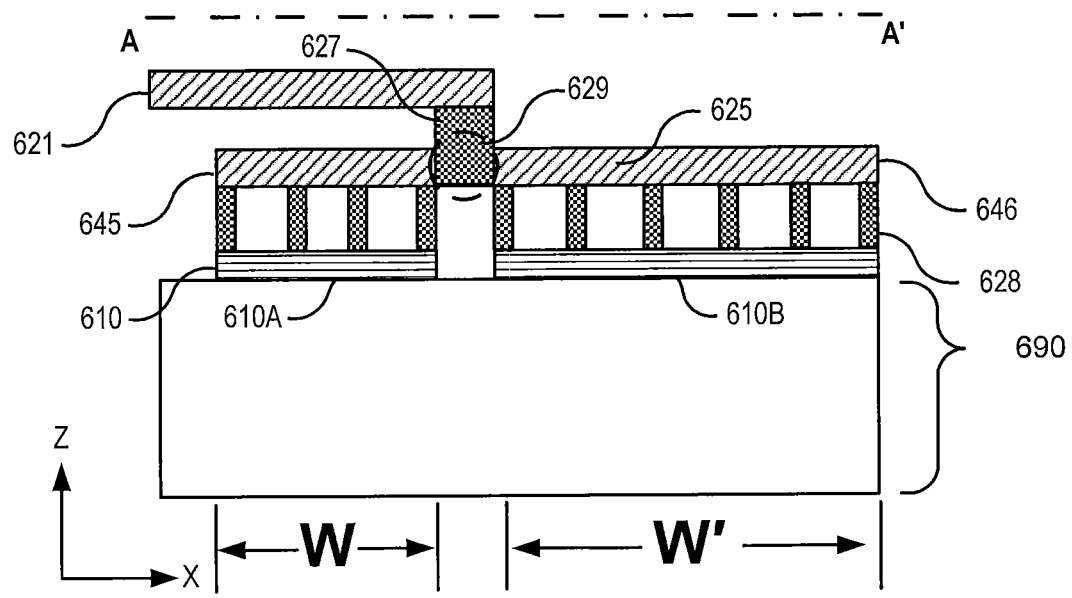

As noted above, in some embodiments, the second conductive gate via 627 may be located at an interior position 629 that is located at the midpoint of the gate interconnect 625. However, in some embodiments, the second conductive gate via 627 may be located at an interior position 629 that is offset from the midpoint of the gate interconnect 625. In such embodiments, the first segment 610A may have a different length than the second segment 610B (or vice versa). For example, as illustrated in FIG. 8, the first segment 610A may have a first length W, and the second segment 610B may have a second length W', different from the first length W.

Each drain finger 615 may be coupled to a respective drain interconnect 635 by a plurality of first conductive drain vias 638. In some embodiments, the drain interconnects 635 may be at a higher level above the semiconductor structure 690 than the drain fingers 615. In some embodiments, the drain interconnects 635 may be at a same level above the semiconductor structure 690 as the gate interconnects 625. In some embodiments, the drain interconnects 635 may be at a different level above the semiconductor structure 690 as the gate interconnects 625. In some embodiments, the drain interconnects 635 may have a greater dimension in the first direction (e.g., in the Y-direction) than the drain fingers 615.

Each drain interconnect 635 may be connected to a respective drain runner 631 by a respective second conductive drain via 637. In some embodiments, the drain runner 631 may be at a higher level above the semiconductor structure 690 than the drain interconnect 635. In some embodiments, the drain runner 631 may be at a same level above the semiconductor structure 690 as the gate runner 621. In some embodiments, the drain runner 631 may be at a different level above the semiconductor structure 690 as the gate runner 621. In some embodiments, the drain runners 631 may have a greater dimension in the first direction (e.g., in the Y-direction) than the drain interconnects 635. In some embodiments, the drain runners 631 may contain metal or other highly conductive material, including, for example, copper, gold, and/or a composite metal. The drain runners 631 may be connected to a drain manifold 640. The drain manifold 640 may provide the drain signal to the plurality of transistor cells 700.

As with the gate runners 621, in some embodiments, the second conductive drain vias 637 that connect each drain runner 631 to a respective drain interconnect 635 may be connected to the drain interconnect 635 at an interior position 639 of the drain interconnect 635. The various possibilities for connecting the drain runners 631 to the drain interconnects 635 are similar to those discussed herein with respect to connecting the gate runners 621 to the gate interconnects 625, and duplicate descriptions thereof will be not be repeated for brevity.

The solution described herein may split each gate interconnect 625 into two segments, and the feed from the gate runners 621 to the respective gate interconnects 625 may be provided through a second conductive gate via 627 located at, for example, roughly the center (e.g., a central portion) of each gate interconnect 625, providing a symmetric feed to the first segment 610A and the second segment 610B of the gate finger 610. A similar configuration may also be implemented for the drain side (e.g., for drain interconnect 635 and drain runner 631). This approach retains the original short gate and drain finger lengths (e.g., separate segments with individual lengths of W) while achieving the desired higher output power. In some embodiments, the use of the gate runners 621, which may be wider and have a lower resistance than the gate interconnects 625, may not significantly increase the gate resistance, and may advantageously reduce phase differences in the combined signals of the transistor cells 700 that can degrade the output power of the transistor device 600. For example, in embodiments of the present invention, when a signal (e.g., current) is transmitted over the second conductive gate via 627 to a gate interconnect 625, the signal received at the first end 645 of the gate interconnect 625 may have less than 1 degree phase difference from the signal received at the second end 646 of the gate interconnect 625. In some embodiments, the phase difference may be less than 0.5 degrees.

The present invention increases the finger lengths of a transistor device in a parallel configuration instead of in a series configuration, as is used in conventional devices. However, the present invention reaches substantially the same or greater total gate periphery as the conventional devices. The embodiments described herein therefore produce the desired higher output power but retain the original shorter individual gate finger length of the conventional devices.

With this technique, the gate resistance of the gate finger (or the drain resistance of the drain finger) adds in parallel instead of in series, reducing the overall resistance and improving the transistor gain in a high-power configuration.

This technique has a similar effect as doubling the number of gate fingers but does not result in a die dimension that is physically too wide to fit in a package. It also mitigates the phase variation issues associated with wide transistor dies discussed herein with respect to FIG. 4.

This embodiments described herein also reduce the phase variation along the increased gate and drain finger lengths (2W) described with respect to FIGS. 5A-5C, reverting back to the original phase delta of the shorter gate length (W) described with respect to FIGS. 2A-2C, but increasing (e.g., doubling) the output current.

Figure 9A:
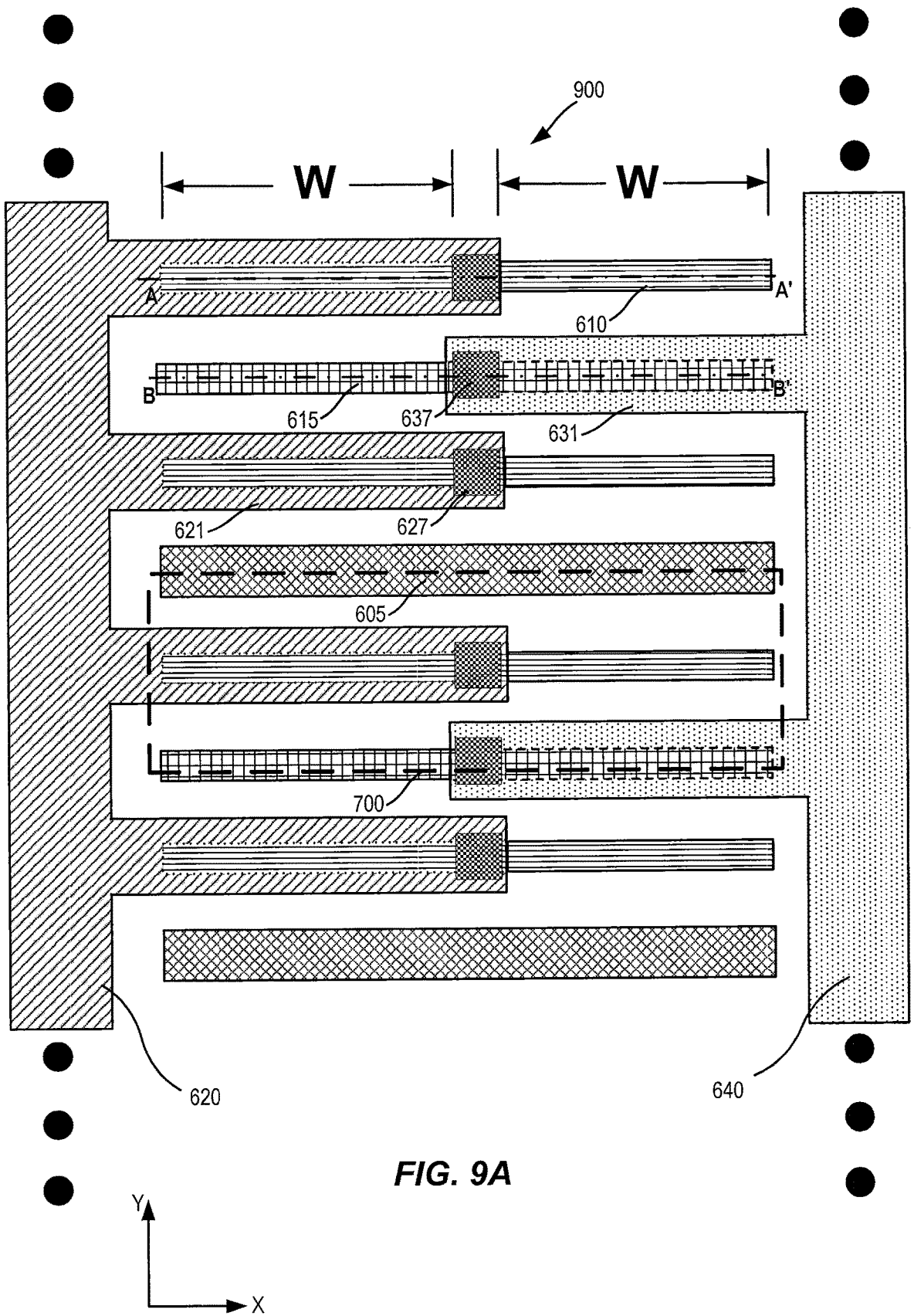
FIG. 9A is a plan view illustrating a transistor device in which the gate and drain fingers are fed at interior locations without an intervening interconnect.
Figure 9B:
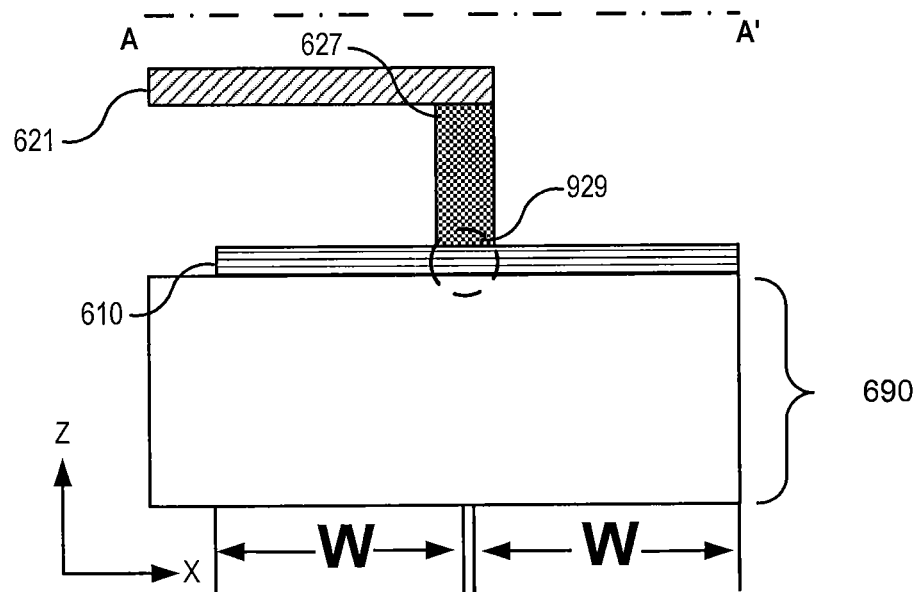
FIG. 9B is a cross section of FIG. 9A taken along the line A-A', according to some embodiments of the invention.
Figure 9C:
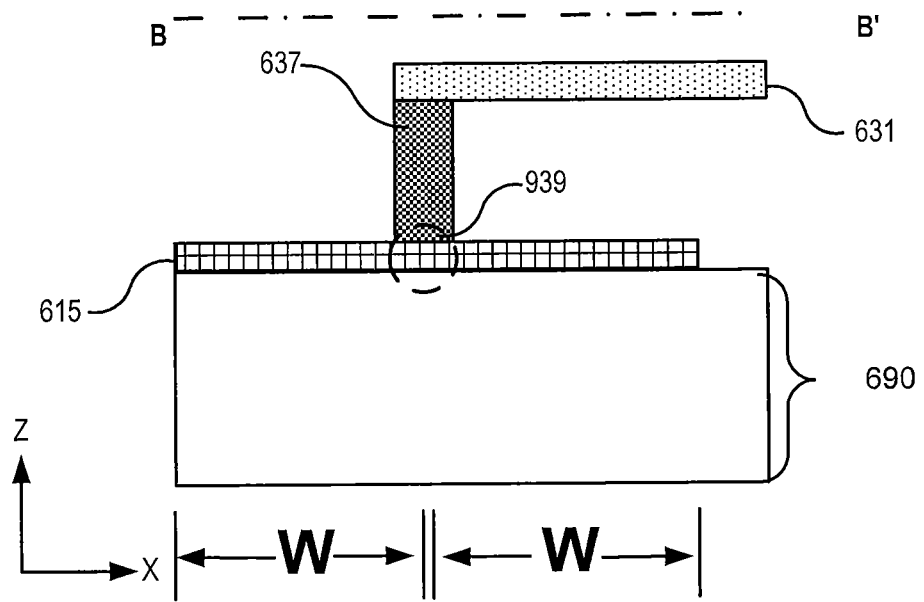
FIG. 9C is a cross section of FIG. 9A taken along the line B-B', according to some embodiments of the invention.

Though the embodiments described herein have incorporated a gate interconnect (see, e.g., gate interconnect 625 in FIG. 6B and drain interconnect 635 in FIG. 6C), it will be understood that, in some embodiments, the drain/gate runner may connect directly to the drain/gate finger at an interior location. FIG. 9A is a plan view illustrating a transistor device 900 in which the gate and drain fingers are fed at interior locations without an intervening interconnect. FIG. 9B is a cross section of FIG. 9A taken along the line A-A', according to some embodiments of the invention. FIG. 9C is a cross section of FIG. 9A taken along the line B-B', according to some embodiments of the invention. Elements of FIGS. 9A-9C which are similar to those described herein are denoted with similar reference numbers, and duplicate descriptions thereof may be omitted.

As illustrated in FIGS. 9A-9C, a gate runner 621 may be connected to the gate finger 610 and/or a drain runner 631 may be connected to the drain finger 615 at an interior location without an intervening interconnect structure. For example, referring to FIG. 9B, the gate runner 621 may extend over the gate finger 610 to connect to an interior position 929 of the gate finger 610 via a conductive gate via 627. In some embodiments, the interior position 929 may be at a midpoint of the gate finger 610. In some embodiments, the interior position 929 may be at a distance that is within ten percent of the length of the gate finger 610 from the midpoint of the gate finger 610. In some embodiments, the interior position 929 may be at a distance that is within twenty percent of the length of the gate finger 610 from the midpoint of the gate finger 610. In some embodiments, the interior position 929 may be at a distance that is between one-third and two-thirds of the distance between opposite ends of the gate finger 610.

In a similar manner, as illustrated in FIG. 9C, the drain runner 631 may extend over the drain finger 615 to connect to an interior position 939 of the drain finger 615 via a conductive via 637. In some embodiments, the interior position 939 may be at a midpoint of the drain finger 615. In some embodiments, the interior position 939 may be at a distance that is within ten percent of the length of the drain finger 615 from the midpoint of the drain finger 615. In some embodiments, the interior position 939 may be at a distance that is within twenty percent of the length of the drain finger 615 from the midpoint of the drain finger 615. In some embodiments, the interior position 939 may be at a distance that is between one-third and two-thirds of the distance between opposite ends of the drain finger 615.

Though FIG. 9A illustrates that both the drain finger 615 and the gate finger 610 are directly connected to the drain runner 631 and gate runner 621, respectively, without a respective interconnect, it will be understood that other configurations are possible. For example, in some embodiments, the gate runner 621 may be connected to the gate finger 610 through an interior position 629 of the gate interconnect 625 as illustrated, for example, in FIG. 6B, while the drain runner 631 may be connected to the drain finger 615 at an interior position 939 without a drain interconnect as illustrated, for example, in FIG. 9C. In some embodiments, the drain runner 631 may be connected to the drain finger 615 through an interior position 639 of the drain interconnect 635 as illustrated, for example, in FIG. 6C, while the gate runner 621 may be connected to the gate finger 610 at an interior position 929 without a gate interconnect as illustrated, for example, in FIG. 9B.

The use of an interconnect (e.g., a gate interconnect and/or a drain interconnect) may allow for the use of a layer having a lower resistance than the intrinsic finger of the transistor device (e.g., a gate finger and/or a drain finger). For example, the interconnect may, in some embodiments, be formed of a metal layer and/or may have larger dimensions than the finger. In some embodiments, the finger may be made of polysilicon. In some technologies, the additional metal layers for use as an interconnect may not be available. In some embodiments, the additional metal layers may be used when additional space is available. For example, as discussed herein, source regions of the device may be electrically connected through a back surface of the device, rather than a top surface. In such embodiments, wiring layers to the gate finger of the device can extend over the surface of the source region without interfering with connections to the source region.

Figure 10:
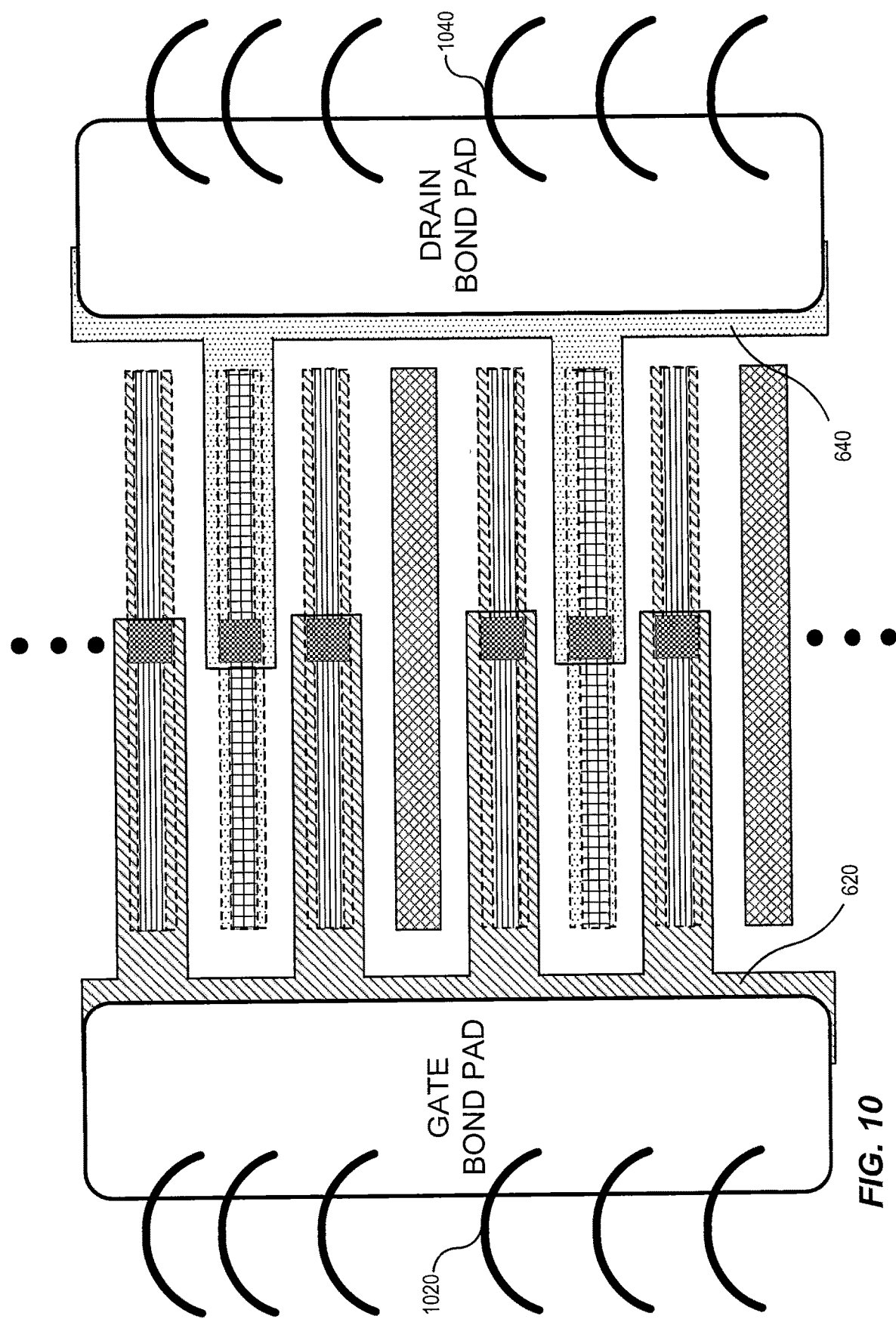
FIG. 10 is a plan view of a gate bond pad and a drain bond pad coupled to the gate manifold and the drain manifold, respectively.

FIG. 10 is a plan view of a gate bond pad and a drain bond pad coupled to the gate manifold 220 and the drain manifold 240, respectively. As illustrated in FIG. 10, the gate bond pad may be configured so as to be electrically coupled to the gate manifold 220. The gate bond pad may be used as a bonding surface for input bond wires 1020 to be connected to the gate manifold 220. The input bond wires 1020 may be provided to input a gate signal to the transistor cells described herein. Similarly, the drain bond pad may be configured so as to be electrically coupled to the drain manifold 240. The drain bond pad may be used as a bonding surface for output bond wires 1040 to be connected to the drain manifold 240. The output bond wires 1040 may be provided to output a signal from the drain regions of the various transistor cells described herein. Though illustrated as being separate from the gate manifold 220, in some embodiments, the gate bond pad and the gate manifold 220 may be a single element. That is to say that, in some embodiments, input bond wires 1020 may be directly coupled to the gate manifold 220. Similarly, in some embodiments, the drain bond pad and the drain manifold 240 may be a single element, such that output bond wires 1040 may be directly coupled to the drain bond pad.

As can be seen in FIG. 10, utilizing the gate/drain runner and gate/drain interconnect configuration described herein may improve the performance of the existing device by reducing a phase displacement of the signals propagating through the device. In some embodiments, the improved configuration illustrated in FIG. 10 may be integrated with an existing die while minimizing modifications to the manufacturing process.

Figure 11:
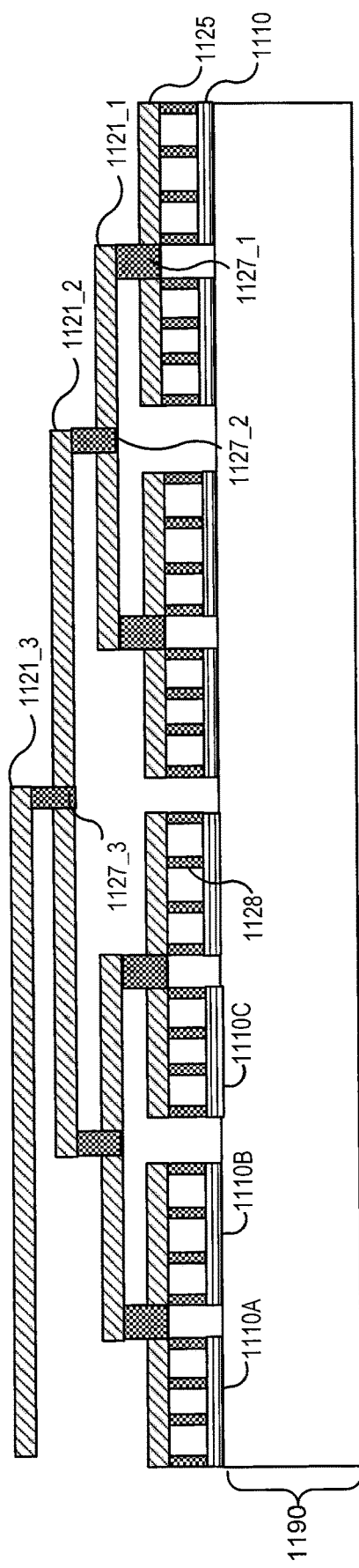
FIG. 11 is a cross section illustrating a transistor device in which multiple gate runners are utilized, according to some embodiments of the invention.

FIG. 11 is a cross section illustrating a transistor device in which multiple gate runners are utilized, according to some embodiments of the invention. In some embodiments, additional conductor layers (e.g., gate runners) may be used in a branch-out form as shown in FIG. 11. In some embodiments, the branch-out may be symmetric. The number of conductor layers can be expanded to allow for more branches, enabling shorter fingers to be used while producing the same desired gate periphery. For example, as illustrated in FIG. 11, a gate finger 1110 may be separated into a number of gate finger segments 1110A, 1110B, 1110C, etc. As discussed herein with respect to FIGS. 6B and 7, the gate finger segments 1110A, 1110B, 1110C may be separated from one another or may be integrated.

The gate finger 1110 may be further coupled to a gate interconnect 1125 by a plurality of first conductive gate vias 1128. In some embodiments, gate interconnect 1125 may be at a higher level than the gate finger 1110. In some embodiments, the gate interconnect 1125 may have a greater dimension in the first direction (e.g., in the Y-direction) than the gate finger 1110. The gate finger 1110 may be connected to a semiconductor structure 1190 in a manner similar to the semiconductor structure 690 of FIGS. 6A-C.

The gate interconnect 1125 may be further connected to a first gate runner 1121_1 by a plurality of second conductive gate vias 1127_1. The first gate runner 1121_1 may be at a higher level than the gate interconnect 1125. In some embodiments, the gate runner 1121_1 may have a greater dimension in the first direction (e.g., in the Y-direction) than the gate interconnect 1125. In some embodiments, the gate interconnect 1125 may be in segments. For example, the gate interconnect 1125 may be separated into a plurality (e.g., 4) segments that may be physically isolated from one another. Each of the segments of the gate interconnect 1125 may be connected to the first gate runner 1121_1 by one of the plurality of second conductive gate vias 1127_1 that is placed at an interior position of the segment of the gate interconnect 1125. In some embodiments, the interior position of the segment of the gate interconnect 1125 may be a midpoint of the segment of the gate interconnect 1125.

The first gate runner 1121_1 may be further connected to a second gate runner 1121_2 by a plurality of third conductive gate vias 1127_2. The second gate runner 1121_2 may be at a higher level than the first gate runner 1121_1. In some embodiments, the second gate runner 1121_2 may have a greater dimension in the first direction (e.g., in the Y-direction) than the first gate runner 1121_1. The second gate runner 1121_2 may be further connected to a third gate runner 1121_3 by a fourth conductive gate via 1127_3. The third gate runner 1121_3 may be at a higher level than the second gate runner 1121_2. In some embodiments, the third gate runner 1121_3 may have a greater dimension in the first direction (e.g., in the Y-direction) than the second gate runner 1121_2. In this way, a device with three layers of gate runners 1121_1, 1121_2, 1121_3 may be constructed.

In some embodiments, each gate runner layer may be connected to an adjacent lower layer below it by a conductive via positioned at an interior position of the adjacent lower layer. For example, the third gate runner 1121_3 may be connected to the second gate runner 1121_2 by the fourth conductive gate via 1127_3 that is placed at an interior position of the second gate runner 1121_2. In some embodiments, the interior position may be a midpoint of the second gate runner 1121_2. In some embodiments, the interior position may be at a distance that is within ten percent of the length of the gate runner layer from the midpoint of the gate runner layer. In some embodiments, the interior position may be at a distance that is within twenty percent of the length of the gate runner layer from the midpoint of the gate runner layer. In some embodiments, the interior position may be at a distance that is between one-third and two-thirds of the distance between a first end and a second end of the gate runner layer.

As illustrated in FIG. 11, some of the stacked gate runner layers may be in segments. For example, the first gate runner 1121_1 may be separated into two segments that may be physically isolated from one another. Each of the segments of the first gate runner 1121_1 may be connected to the second gate runner 1121_2 by one of the plurality of third conductive gate vias 1127_2 that is placed at an interior position of the segment. In some embodiments, the interior position of the segment of the first gate runner 1121_1 is a midpoint of the segment. In some embodiments, the first gate runner 1121_1 may be a unitary layer. In addition, though FIG. 11 illustrates three gate runners 1121_1, 1121_2, and 1121_3 it will be understood that more or fewer gate runners and/or layers may be provided without exceeding the scope of the invention.

As illustrated in FIG. 10, input signals may be provided to the transistor cells via input bond wires connected to a gate bond pad. Similarly, drain signals may be output from the transistor cells via output bond wires connected to a drain bond pad. In some embodiments, the gate bond pad and/or drain bond pad may be provided on the gate fingers and/or drain fingers.

Figure 12A:
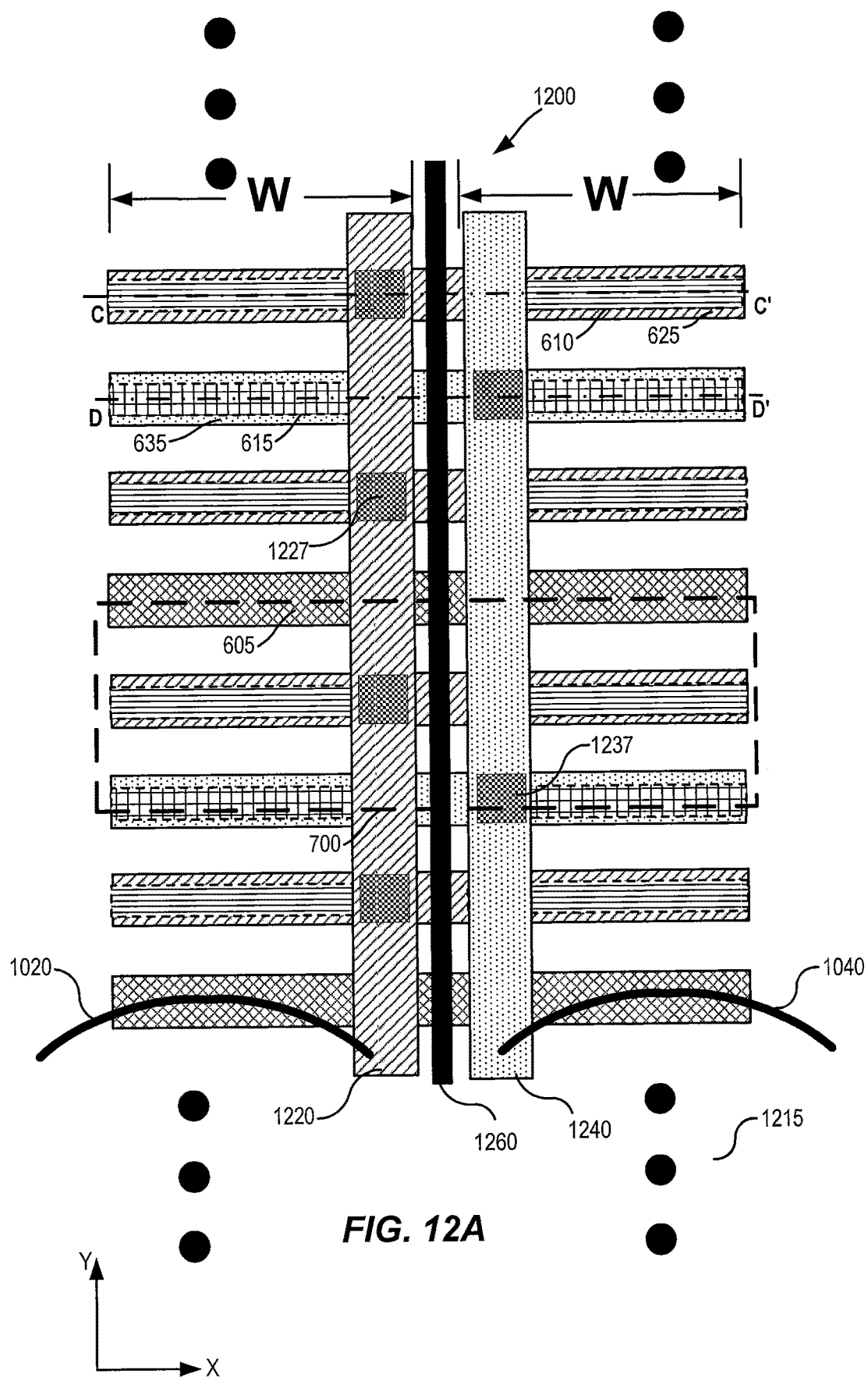
FIG. 12A is a plan view illustrating a transistor device in which the width of gate fingers are increased and a gate bond pad is provided on the gate fingers, according to some embodiments of the invention.
Figure 12B:
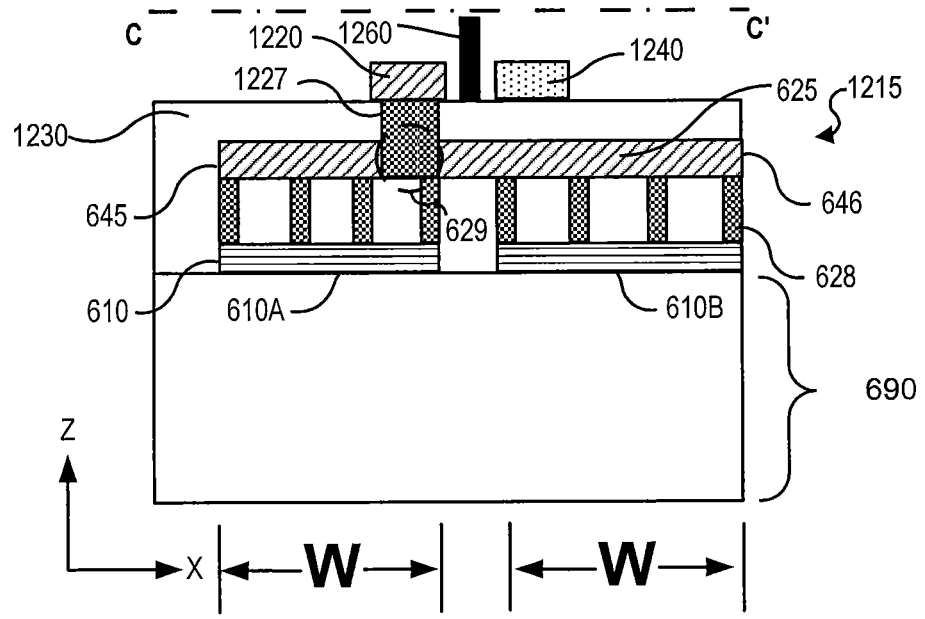
FIG. 12B is a cross section of FIG. 12A taken along the line C-C', according to some embodiments of the invention.
Figure 12C:
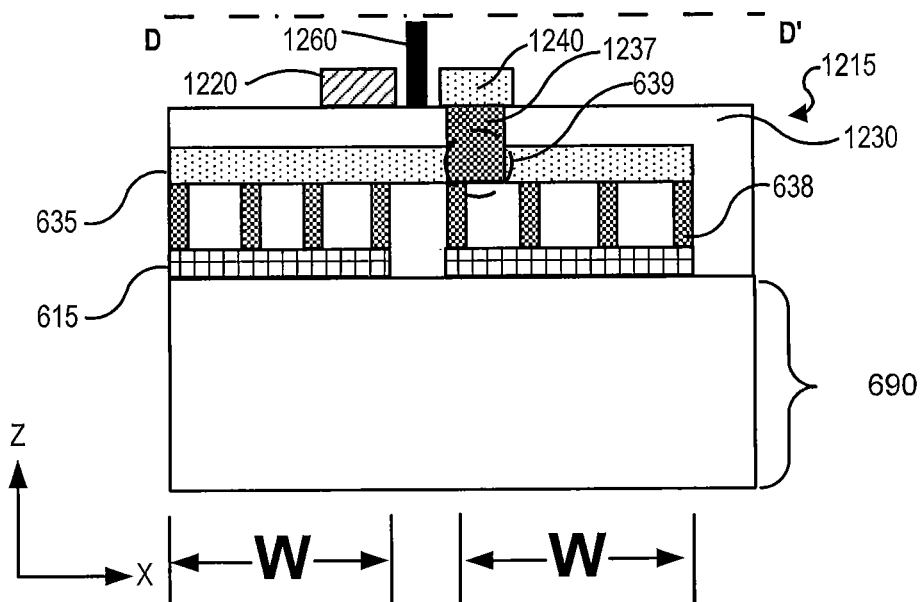
FIG. 12C is a cross section of FIG. 12A taken along the line D-D', according to some embodiments of the invention.

FIG. 12A is a plan view illustrating a transistor device 1200 in which the width of gate fingers 610 are increased and a gate bond pad 1220 is provided on the gate fingers 610, according to some embodiments of the invention. FIG. 12B is a cross section of FIG. 12A taken along the line C-C', according to some embodiments of the invention. FIG. 12C is a cross section of FIG. 12A taken along the line D-D', according to some embodiments of the invention. Many of the elements with respect to the gate fingers 610, drain fingers 615, and source fingers 605 are similar to those illustrated in FIGS. 6A, 6B, and 6C. Accordingly, further description thereof will be omitted.

As illustrated in FIGS. 12A, 12B, and 12C some embodiments of the present invention may provide a plurality of transistor cells 700 repeatedly arranged on a semiconductor structure 690 to form a transistor die 1215. It will be appreciated that the transistor cells 700 may be formed of semiconductor structures 690 such as those illustrated in FIGS. 3A-3C (e.g., LDMOS or HEMT transistor cells). The transistors cells 700 may be arranged as part of a transistor device 1200 to provide a combined output signal. For example, the respective gate regions, drain regions, and source regions of the plurality of transistor cells 700 may be commonly connected so as to provide a plurality of transistors coupled in parallel.

The transistor device 1200 may also include a plurality of gate fingers 610 that are spaced apart from each other along on the semiconductor structure 690 in the first direction (e.g., the Y-direction). Each of the gate fingers 610 may have a width 2W in the second direction (e.g., the X-direction) or some other width that exceeds the width of a conventional transistor device. In some embodiments the width 2W may be 800 microns.

The gate fingers 610 may be disposed on the semiconductor structure 690 to be respectively in electrical contact with the gate regions (e.g., a channel) of the plurality of transistor cells 700. The plurality of gate fingers 610 may provide a gate signal to respective ones of the transistor cells 700.

In some embodiments, the transistor device 1200 may also include a plurality of drain fingers 615 that are arranged on the semiconductor structure 690 in the first direction (e.g., the Y-direction). Each of the plurality of drain fingers 615 may have a width 2W in the second direction (e.g., the X-direction), though the present invention is not limited thereto. The plurality of drain fingers 615 may be disposed on and/or in the semiconductor structure 690 to be respectively in electrical contact with the drain regions of the plurality of transistor cells 700. The drain fingers 615 may conduct a drain signal of respective ones of the transistor cells 700.

A gate bond pad 1220 may be provided on the plurality of gate fingers 610 and drain fingers 615. The gate bond pad 1220 may extend in the first direction (e.g., the Y direction) on the gate fingers 610 and/or drain fingers 615 (e.g., to cross the gate fingers 610 and/or drain fingers 615). One or more input bond wires 1020 may be bonded to the gate bond pad 1220. The input bond wires 1020 may provide an input signal (e.g., a gate signal) to the gates of the transistor cells 700. Though only one input bond wire 1020 is illustrated in FIG. 12A, it will be understood that additional input bond wires 1020 may be present at different positions along the gate bond pad 1220. Respective ones of the input bond wires 1020 may extend on one or more of the gate fingers 610 and/or drain fingers 615 to the gate bond pad 1220.

A drain bond pad 1240 may be provided on the plurality of gate fingers 610 and drain fingers 615. The drain bond pad 1240 may extend in the first direction (e.g., the Y direction) on the gate fingers 610 and/or drain fingers 615 (e.g., to cross the gate fingers 610 and/or drain fingers 615). One or more output bond wires 1040 may be bonded to the drain bond pad 1240. The output bond wires 1040 may provide an output signal (e.g., a drain signal) from the transistor cells 700. Though only one output bond wire 1040 is illustrated in FIG. 12A, it will be understood that additional output bond wires 1040 may be present at different positions along the drain bond pad 1240. Respective ones of the output bond wires 1040 may extend on one or more of the gate fingers 610 and/or drain fingers 615 to be bonded to the drain bond pad 1240. In some embodiments, the gate bond pad 1220 and/or the drain bond pad 1240 may contain metal or other highly conductive material, including, for example, copper, gold, and/or a composite metal.

Each gate finger 610 may be coupled to a gate interconnect 625 by a plurality of first conductive gate vias 628. In some embodiments, the gate interconnects 625 may be at a higher level above the semiconductor structure 690 (e.g., in the Z direction) than the gate fingers 610. In some embodiments, the gate interconnect 625 may have a greater dimension in the first direction (e.g., in the Y-direction) than the gate finger 610. The gate interconnects 625 may be connected to the gate bond pad 1220 by a second conductive gate via 1227.

In some embodiments, each second conductive gate via 1227 that connects the gate bond pad 1220 to a respective gate interconnect 625 may be connected to the gate interconnect 625 at an interior position 629 of the gate interconnect 625. For example, the gate interconnect 625 may have first and second opposed ends 645, 646. In some embodiments, the second conductive gate via 1227 may be connected to the gate interconnect 625 at an interior position 629 of the gate interconnect 625 that is between the first end 645 and the second end 646. In some embodiments, the interior position 629 may be offset from a midpoint of the first end 645 and the second end 646 of the gate interconnect 625. In some embodiments, the interior position 629 may be at a distance that is within twenty percent of the length of the gate interconnect 625 from the midpoint of the gate interconnect 625. In some embodiments, the interior position 629 may be at a distance that is between one-third and two-thirds of the distance between the first end 645 and the second end 646 of the gate interconnect 625.

In some embodiments, each of the gate fingers 610 may be composed of a first segment 610A and a second segment 610B. In some embodiments, the first segment 610A and the second segment 610B may extend collinearly. For example, for a gate finger 610 that has a width 2W, both the first segment 610A and the second segment 610B may have a width W, though the present invention is not limited thereto. In some embodiments, the first segment 610A and the second segment 610B may be physically separated by a gap, as illustrated in FIG. 12B. For example, there may an additional element (e.g., an insulation and/or dielectric layer 1230, discussed herein) disposed between the first segment 610A and the second segment 610B. However, the present invention is not limited thereto, and it will be appreciated that in other embodiments the gate finger 610 may not be divided into separate first and second segments 610A, 610B, as illustrated, for example, in FIG. 7.

Each drain finger 615 may be coupled to a respective drain interconnect 635 by a plurality of first conductive drain vias 638. In some embodiments, the drain interconnects 635 may be at a higher level above the semiconductor structure 690 than the drain fingers 615. In some embodiments, the drain interconnects 635 may be at a same level above the semiconductor structure 690 as the gate interconnects 625. In some embodiments, the drain interconnects 635 may be at a different level above the semiconductor structure 690 than the gate interconnects 625. In some embodiments, the drain interconnects 635 may have a greater dimension in the first direction (e.g., in the Y-direction) than the drain fingers 615.

Each drain interconnect 635 may be connected to the drain bond pad 1240 by a respective second conductive drain via 1237. As with the gate bond pad 1220, in some embodiments, the second conductive drain vias 1237 that connect the drain bond pad 1240 to a respective drain interconnect 635 may be connected to the drain interconnect 635 at an interior position 639 of the drain interconnect 635. The various possibilities for connecting the drain bond pad 1240 to the drain interconnects 635 are similar to those discussed herein with respect to connecting the gate bond pad 1220 to the gate interconnects 625, and duplicate descriptions thereof will be not be repeated for brevity.

A dielectric layer 1230 may be provided on an upper surface of the gate interconnect 625 and/or the drain interconnect 635. The dielectric layer 1230 may assist in insulating the gate interconnect 625 from the drain bond pad 1240 and/or the drain interconnect 635 from the gate bond pad 1220. The second conductive gate vias 1227 may penetrate the dielectric layer 1230 between the gate bond pad 1220 and the gate interconnect 625. The second conductive drain vias 1237 may penetrate the dielectric layer 1230 between the drain bond pad 1240 and the drain interconnect 635. The dielectric layer 1230 may include, for example, a thermal oxide layer, a silicon oxide layer, silicon nitride, silicon oxynitride, or a high-k dielectric layer.

In some embodiments, the gate bond pad 1220 may be positioned on the gate finger 610 and/or gate interconnect 625 near a midpoint of (e.g., halfway between) the first end 645 and the second end 646 of the gate interconnect 625. That is to say that the gate bond pad 1220 may be arranged to be proximate to a virtual vertical line that extends normal to the midpoint of the gate interconnect 625. In some embodiments, the gate bond pad 1220 may be within a distance that is within ten percent of the length of the gate interconnect 625 in the horizontal direction from the midpoint of the gate interconnect 625 (e.g., from the virtual line normal to the midpoint). In some embodiments, the gate bond pad 1220 may be at a distance that is within twenty percent of the length of the gate interconnect 625 in the horizontal direction from the midpoint of the gate interconnect 625 (e.g., from the virtual line normal to the midpoint).

Similarly, in some embodiments, the drain bond pad 1240 may be positioned on the drain finger 615 and/or drain interconnect 635 near a midpoint of (e.g., halfway between) the drain interconnect 635. That is to say that the drain bond pad 1240 may arranged to be proximate to a virtual vertical line that extends normal to the midpoint of the drain interconnect 635. In some embodiments, the drain bond pad 1240 may be within a distance that is within ten percent of the length of the drain interconnect 635 in the horizontal direction from the midpoint of the drain interconnect 635 (e.g., from the virtual line normal to the midpoint). In some embodiments, the drain bond pad 1240 may be at a distance that is within twenty percent of the length of the drain interconnect 635 in the horizontal direction from the midpoint of the drain interconnect 635 (e.g., from the virtual line normal to the midpoint). In some embodiments, the gate bond pad 1220 and the drain bond pad 1240 may be separated by less than 200 microns. In some embodiments, the gate bond pad 1220 and the drain bond pad 1240 may be separated by less than 100 microns.

For example, a length of the gate and/or drain finger 610, 615 may be 360 microns. If the gate bond pad 1220 is positioned within 20% of the midpoint (e.g., 180 microns) of the gate finger 610, the gate bond pad 1220 may be 36 microns from the midpoint of the gate finger 610. Similarly, if the drain bond pad 1240 is positioned within 20% of the midpoint (e.g., 180 microns) of the drain finger 615, the drain bond pad 1240 may be 36 microns from the midpoint of the drain finger 615. Thus, the gate bond pad 1220 and the drain bond pad 1240 may be separated by 72 microns. These distances and placements of the gate bond pad 1220 and drain bond pad 1240 are merely examples, and the embodiments described herein are not limited thereto.

An isolation material 1260 may be placed on a surface of the transistor die 1215 of the transistor device on an area between the gate bond pad 1220 and the drain bond pad 1240. As illustrated in FIG. 12A, input bond wires 1020 may be coupled to the gate bond pad 1220 and output bond wires 1040 may be coupled to the drain bond pad 1240. Because of the proximity of the input bond wires 1020 and the output bond wires 1040, an electrical interconnection (e.g., a capacitive and/or magnetic coupling) may be formed between the input bond wires 1020 and the output bond wires 1040 without the presence of the isolation material 1260. The isolation material 1260 may reduce and/or prevent this capacitive and/or magnetic coupling. The use of isolation material between input and output bonding wires is discussed in, for example in U.S. patent application Ser. No. 16/208,821 entitled "PACKAGED TRANSISTOR DEVICES WITH INPUT-OUTPUT ISOLATION AND METHODS OF FORMING PACKAGED TRANSISTOR DEVICES WITH INPUT-OUTPUT ISOLATION," to Trang, et al., filed on Dec. 4, 2018, the entire contents of which are incorporated by reference herein.

The isolation material 1260 may extend in the first direction (e.g., the Y direction) that is substantially orthogonal to the input bond wires 1020 and/or the output bond wires 1040 that are connected to the gate bond pad 1220 and/or the drain bond pad 1240, respectively. In FIGS. 12A-12C, an example shape of the isolation material 1260 is included only for reference, and a specific dimension (e.g., a height, length, or width) may be different. For example, in FIGS. 12B and 12C, a height of the isolation material 1260 is intended to show a placement of the isolation material 1260. In some embodiments, a height of the isolation material may extend to a height (i.e., a distance in the Z direction above the transistor die 1215) that is at least as high as portions of the input bond wires 1020 and/or the output bond wires 1040.

In some embodiments, the isolation material 1260 may include a metal, a conductive metal nitride, a conductive metal oxide, or a combination of the above materials. For example, the isolation material 1260 may include tungsten (W), tungsten nitride (WN), gold (Au), silver (Ag), copper (Cu), aluminium (Al), titanium aluminium nitride (TiAlN), iridium (Ir), platinum (Pt), palladium (Pd), ruthenium (Ru), zirconium (Zr), rhodium (Rh), nickel (Ni), cobalt (Co), chrome (Cr), tin (Sn), zinc (Zn), indium tin oxide (ITO), an alloy of the above metals, or a combination of the above metals. In some embodiments, the isolation material 1260 may include non-conductive material plated and/or coated with a conductive material (e.g., a metal or metal-containing substance).

Though the isolation material 1260 may be a conductive isolation material, the present invention is not limited thereto. In some embodiments, the isolation material 1260 may include dielectric material capable of absorbing microwave and/or RF emissions. In some embodiments the isolation material 1260 may be formed of a lossy dielectric. The lossy dielectric may be configured to absorb and/or reduce electromagnetic waves such as those forming the coupling between the input and output bond wires 1020, 1040. Lossy dielectrics which may be useful as materials in the isolation material 1260 may include lossy dielectrics having a loss tangent greater than 0.1. The loss tangent, also known as tan δ, is a ratio between the real and imaginary parts of the dielectric permittivity. In some embodiments, the loss tangent for the lossy dielectric being used as the isolation material 1260 may be based on the operating frequency of the transistor device 1200. Examples of lossy dielectrics may include dielectrics containing carbon.

In some embodiments, the isolation material 1260 may include a magnetic material, such as, for example, ferrite, and/or nickel.

The use of the isolation material 1260 may allow for the gate bond pad 1220 and the drain bond pad 1240 to be placed in relatively close proximity to one another without having capacitive and/or magnetic couplings that reduce the efficiency of the transistor device 1200. By placing the gate bond pad 1220 closer to the center of the transistor device, a connection may be made between the gate signal provided at the gate bond pad 1220 and the interior position 629 of the gate interconnect 625 without the use of (or with a smaller one of) a gate runner such as the gate runner 621 illustrated in FIGS. 6A and 6B. Similarly, by placing the drain bond pad 1240 closer to the center of the transistor device, a connection may be made between the drain signal that is output from the drain bond pad 1240 and the interior position 639 of the drain interconnect 635 without the use of (or with a smaller one of) a drain runner such as the drain runner 631 illustrated in FIGS. 6A and 6C.

Figure 12D:
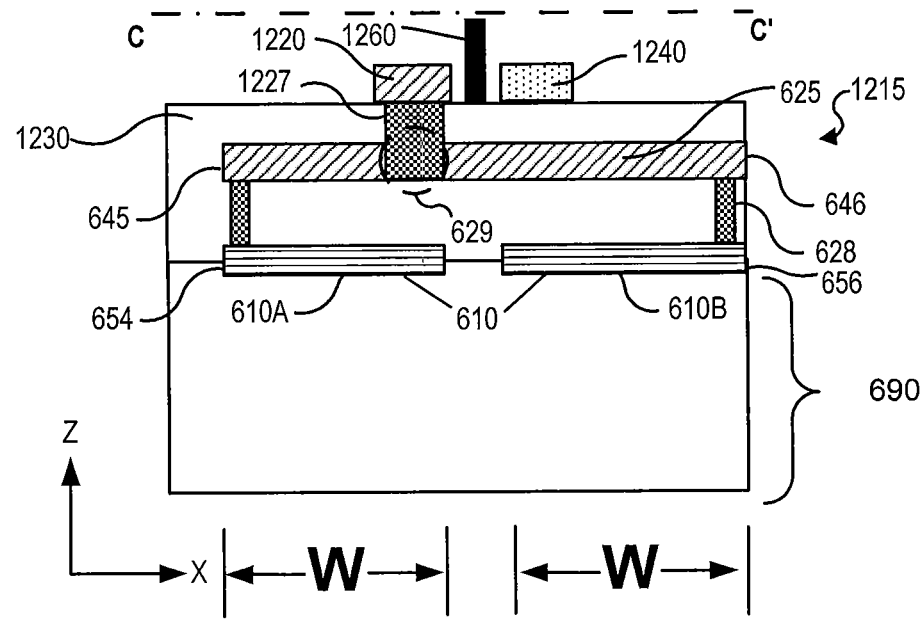
FIGS. 12D and 12E illustrate a cross section of another example embodiment of FIG. 12A taken along the lines C-C' and D-D', respectively, in which the gate finger is edge-fed, according to some embodiments of the invention.
Figure 12E:
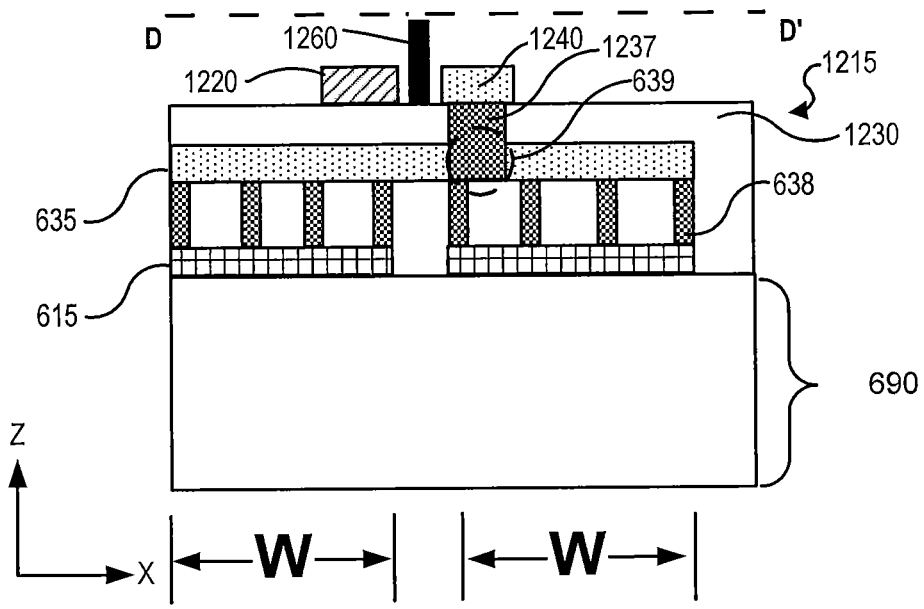

FIG. 12B illustrates an example embodiment where a plurality of conductive vias 628 are connected between the gate interconnect 625 and the gate finger 610 along a length of the gate finger 610. In some embodiments, it may be beneficial to provide connections between the gate interconnect 625 and the gate finger 610 exclusively and/or primarily at edge portions of the gate finger 610. FIGS. 12D and 12E illustrate a cross section of another example embodiment of FIG. 12A taken along the lines C-C' and D-D', respectively, in which the gate finger 610 is edge-fed, according to some embodiments of the invention. The benefits of using edge-fed gate and/or drain fingers are discussed in U.S. patent application Ser. No. 16/375,398, to Trang, et al. entitled "IMPROVED DRAIN AND/OR GATE INTERCONNECT AND FINGER STRUCTURE," and filed on Apr. 4, 2019, the entire contents of which are incorporated herein by reference. In some embodiments, the gate finger 610 may receive the gate signal at edge portions of the gate finger 610 (e.g., without conductive vias 628 in a central portion of the gate finger 610) as illustrated in FIG. 12D, while the drain finger 615 is implemented with conductive vias 638 in central portions of the drain finger 615, as illustrated in FIG. 12E. Thus, in some embodiments, the gate finger 610 may be edge-fed and the drain finger 615 may be interior-fed. The configuration illustrated in FIGS. 12D and 12E may further improve efficiency of the transistor device 1200. Though the conductive vias 628 in FIG. 12D are illustrated as being at the outermost edge of the gate finger 610, it will be understood that the present invention is not limited thereto. In some embodiments, the gate finger 610 may have opposite edges 654, 656, and the conductive vias may be adjacent the opposite edges of the gate finger 610 and/or may be offset from the opposite edges (e.g., the outermost edges) of the gate finger 610. For example, a first conductive via 628 between the gate interconnect 625 and the gate finger 610 may be connected to the gate finger 610 at a first position offset from the first opposite edge 654 and a second conductive via 628 between the gate interconnect 625 and the gate finger 610 may be connected to the gate finger 610 at second position offset from the second opposite edge 656 of the gate finger 610 by a second offset. In some embodiments, the first and/or second conductive via 628 may be offset from respective opposite edges 654, 656 of the gate finger 610 by first and second offsets that are within one-third of the width of the gate finger (e.g., in the X direction) from the closest opposite edge 654, 656 of the gate finger 610. As used herein, the width of the gate finger 610 (e.g., a width of the gate for the associated transistor cell) is a distance between opposite edges 654, 656 of the gate finger 610 (e.g., in the X direction) that does not include the gap between the gate finger segments 610A, 610B. In some embodiments, the width of the gate finger 610 may be the sum of the width of the first gate finger segment 610A and the width of the second gate finger segment 610B. In some embodiments, the first and/or second conductive via 628 may be offset from respective opposite edges 654, 656 of the gate finger 610 by first and second offsets that are within one-fourth of the width of the gate finger 610 (e.g., in the X direction) from the closest opposite edge 654, 656 of the gate finger 610. It will be understood that the first offset and the second offset from the edges 654, 656 may have different values from one another (e.g., one of the offsets may be larger than the other). In some embodiments, the first and second offset may be substantially zero, meaning that the conductive vias 628 are placed at the outermost edges of the gate finger 610.

Figure 12F:
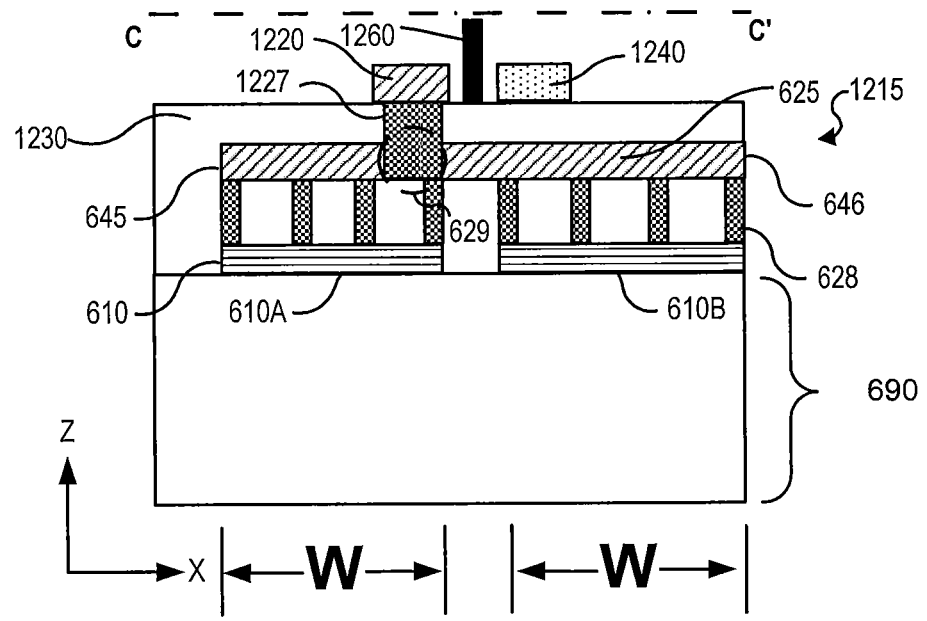
FIGS. 12F and 12G illustrate a cross section of another example embodiment of FIG. 12A taken along the lines C-C' and D-D', respectively, in which the drain finger is edge-fed, according to some embodiments of the invention.
Figure 12G:
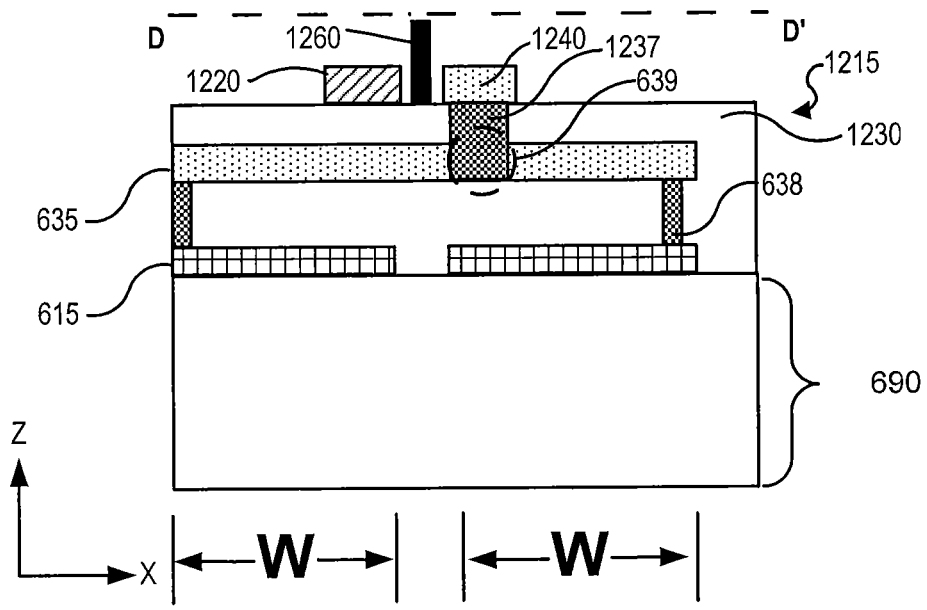

Though FIGS. 12D and 12E illustrate an example in which the gate finger 610 is edge-fed, the present invention is not limited thereto. FIGS. 12F and 12G illustrate a cross section of another example embodiment of FIG. 12A taken along the lines C-C' and D-D', respectively, in which the drain finger 615 is edge-fed, according to some embodiments of the invention. The example embodiment of FIGS. 12F and 12G are similar to those of FIGS. 12D and 12E with the exception that the drain finger 615 may output the drain signal at edge portions of the drain finger 615 (e.g., without conductive vias 638 in a central portion of the drain finger 615) as illustrated in FIG. 12G, while the gate finger 610 is implemented with conductive vias 628 in central portions of the gate finger 610, as illustrated in FIG. 12F. Thus, in some embodiments, the drain finger 615 may be edge-fed and the gate finger 610 may be interior-fed.

Figure 13A:
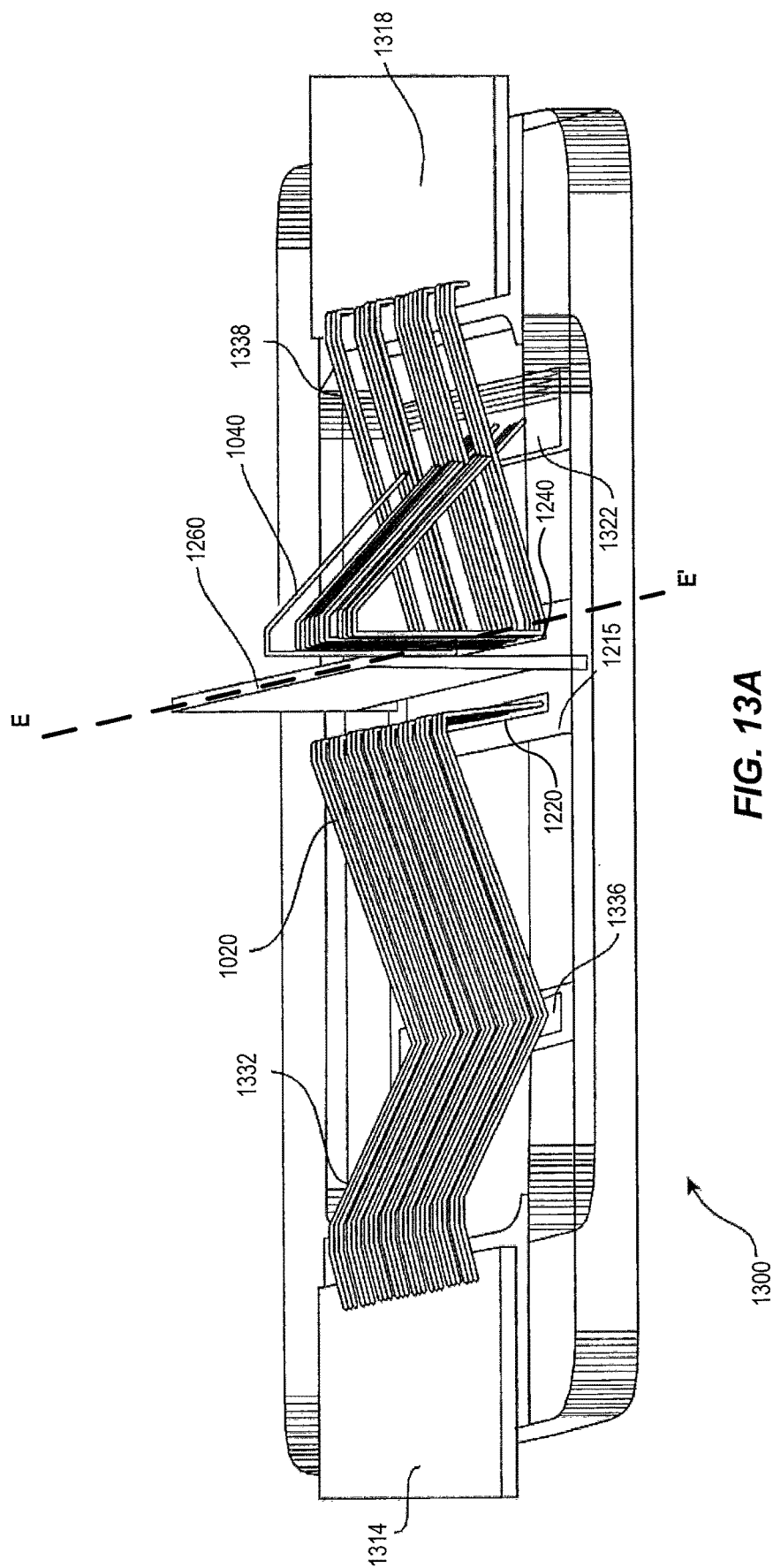
FIG. 13A is a perspective view of a packaged transistor device according to the invention that utilizes an isolation material to reduce the effect of a coupling between the input bond wires and the output bond wires.
Figure 13B:
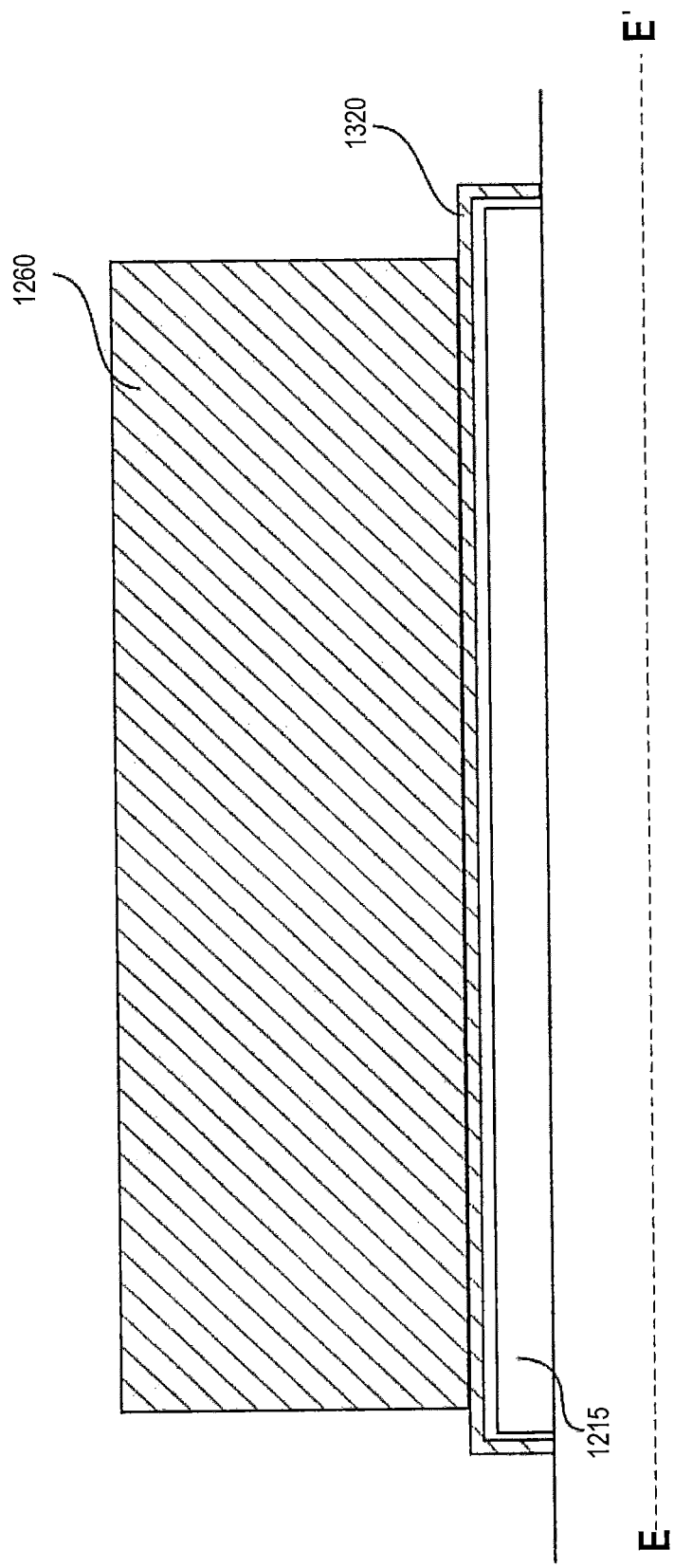
FIG. 13B is a schematic cross-section view of the packaged transistor device, taken along the line E-E', incorporating the isolation material illustrated in the embodiment of FIG. 13A.

As discussed with respect to FIGS. 12A-12G, the isolation material 1260 can take a number of forms. FIG. 13A is a perspective view of a packaged transistor device 1300 according to the invention that utilizes an isolation material 1260 to reduce the effect of a coupling between the input bond wires 1020 and the output bond wires 1040. FIG. 13B is a schematic cross-section view of the packaged transistor device 1300, taken along the line E-E', incorporating the isolation material 1260 illustrated in the embodiment of FIG. 13A.

The packaged transistor device 1300 of FIG. 13A may incorporate the transistor die 1215 illustrated in FIGS. 12A-12G. As illustrated in FIG. 13A, the packaged transistor device 1300 may include an input lead 1314 coupled to a first terminal of a capacitor 1336 via a bond wire 1332, and the first terminal of the capacitor 1336 may be coupled to the transistor die 1315 via the input bond wire 1020. The input bond wire 1020 may be coupled to the gate bond pad 1220 on a surface of the transistor die 1215. In some embodiments, the bond wire 1332, capacitor 1336 and the input bond wire 1020 may form an input matching circuit, though the embodiments described herein are not limited thereto. In some embodiments, the input bond wire 1020 may be coupled directly to the input lead 1314, or with other and/or additional circuit elements therebetween.

The transistor die 1215 may also be coupled to the first terminal of a capacitor 1322 via the output bond wire 1040 and to an output lead 1318 via bond wire 1338. The output bond wire 1040 may be coupled to the drain bond pad 1240 on a surface of the transistor die 1215. In some embodiments, the bond wire 1338, capacitor 1322 and the output bond wire 1040 may form an output matching circuit, though the embodiments described herein are not limited thereto. In some embodiments, the output bond wire 1040 may be coupled directly to the output lead 1318, or with other and/or additional circuit elements therebetween. At least one of the bond wire 1332, input bond wire 1020, output bond wire 1040, and/or bond wire 1338 may extend above a top surface of the transistor die 1215.

Referring to FIGS. 13A and 13B, embodiments of the invention may insert an isolation material 1260 between the input bond wires 1020 that are coupled to the gate bond pad 1220 of the transistor die 1215 and the output bond wires 1040 that are coupled to the drain bond pad 1240 of the transistor die 1215. The isolation material 1260 may extend on a top surface of the transistor die 1215, and at least a portion of the isolation material 1260 may be physically between the input bond wires 1020 and the output bond wires 1040 (e.g., above the transistor die 1215). As used herein, a first element is physically between a second element and a third element when a straight line from a portion of the second element to a portion of the third element would intersect the first element.

In some embodiments, the isolation material 1260 may extend in a first direction that is substantially orthogonal to the input bond wires 1020 connected to the gate bond pad 1220 and/or the output bond wires 1040 connected to the drain bond pad 1240. The isolation material 1260 may reduce a capacitive and/or magnetic coupling between the input bond wire(s) 1020 and the output bond wire(s) 1040. In some embodiments, the isolation material 1260 may be configured to provide an electromagnetic shield between the input bond wire 1020 and the output bond wire 1040.

In some embodiments, the isolation material 1260 may be constructed of a conductive material so as to form a conductive isolation material 1260. The conductive isolation material 1260 may be coupled to a reference voltage source (e.g., ground). For example, the conductive isolation material 1260 may be coupled to a grounded conducting flange, a grounded pad on the base of the packaged transistor device 1300, and/or other element of the packaged transistor device 1300 capable of providing the ground signal.

In some embodiments, the conductive isolation material 1260 may be coupled to a pad or other connective element that is provided on a top surface of the transistor die 1215. The pad may be connected to a reference signal (e.g., ground) via internal connections of the transistor die 1215. In some embodiments, the conductive isolation material 1260 may be provided so as to be electrically floating as opposed to being coupled to ground.

For example, referring to FIG. 13B, the isolation material 1260 may be coupled to a base isolation segment 1320 on the transistor die 1215. In some embodiments, the base isolation segment 1320 may be a bond wire. In some embodiments, the base isolation segment 1320 may be connected to a base and/or substrate on one side of the transistor die 1215, may extend on the transistor die 1215 above the transistor die 1215, and may be connected to the base and/or substrate on a second side of the transistor die 1215. At least one side of the base isolation segment 1320 may be connected to a reference signal (e.g., a ground signal). However, the invention is not limited thereto. In some embodiments, the base isolation segment 1320 may be connected to a pad on the surface of the transistor die 1215, where the pad is further connected to the reference signal (e.g., ground) via internal connections of the transistor die 1215 and/or external connections. For example, in some embodiments, the base isolation segment 1320 may be commonly coupled to the source regions of the transistor die 1215, which may also be coupled to ground.

Though the isolation material 1260 may be a conductive isolation material, the present invention is not limited thereto. In some embodiments, the isolation material 1260 may include dielectric material capable of absorbing microwave and/or RF emissions. In some embodiments the isolation material 1260 may be formed of a lossy dielectric and/or magnetic material.

FIG. 14A is a schematic cross-sectional view illustrating an isolation material 1260 according to further embodiments of the invention. As illustrated in FIG. 14A, the isolation material 1260 may be composed of one or more isolation segments 1410. In some embodiments, the isolation segments 1410 may extend in a direction away from the top surface the transistor die 1215 (e.g., in a vertical direction). In some embodiments, the isolation segments 1410 may extend in a direction that is substantially perpendicular to the top surface of the transistor die 1215. It will be understood that the isolation material 1260 illustrated in FIG. 14A may be disposed on the transistor die 1215 relative to other elements of a packaged transistor device, such as the input bond wires 1020 and output bond wires 1040, in a way similar to the packaged transistor device of FIG. 13A. That is to say that the isolation segments 1410 of the isolation material 1260 may be disposed between the input bond wires 1020 and output bond wires 1040 above the transistor die 1215.

In some embodiments, the isolation segments 1410 may include a metal, a conductive metal nitride, a conductive metal oxide, or a combination of the above materials. For example, the isolation segments 1410 may include tungsten (W), tungsten nitride (WN), gold (Au), silver (Ag), copper (Cu), aluminium (Al), titanium aluminium nitride (TiAlN), iridium (Ir), platinum (Pt), palladium (Pd), ruthenium (Ru), zirconium (Zr), rhodium (Rh), nickel (Ni), cobalt (Co), chrome (Cr), tin (Sn), zinc (Zn), indium tin oxide (ITO), an alloy of the above metals, or a combination of the above metals. In some embodiments, the isolation segments 1410 may include a lossy dielectric and/or a magnetic material.

In some embodiments, the isolation segments 1410 may be formed on a base isolation segment 1420, though the present invention is not limited thereto. In some embodiments, the base isolation segment 1420 may be connected to a base and/or substrate on one side of the transistor die 1215, may extend on the transistor die 1215 above the transistor die 1215, and/or may be connected to the base and/or substrate on a second side of the transistor die 1215. In some embodiments, the base isolation segment 1420 may be one of a plurality of bond wires.

Though FIG. 14A illustrates the base isolation segment 1420 connected to the base and/or substrate, the present invention is not limited thereto. In some embodiments, the transistor die 1215 may have pads and/or other connective element on its surface that are connected to a reference signal (e.g., ground) through internal or external connections of the transistor die 1215 (e.g., to the substrate). FIG. 14B illustrates an embodiment in with the transistor die 1215 has ground pads 1482 on a top surface of the transistor die 1215. In some embodiments, the base isolation segment 1420 may be connected to the ground pads 1482 on the surface of the transistor die 1215. In some embodiments, at least one end of the base isolation segment 1420 may be connected to a reference signal (e.g., a ground signal). In some embodiments, the base isolation segment 1420 may be a bond wire. In some embodiments, the base isolation segment 1420 may be a metal trace and/or segment formed on the top surface of the transistor die 1215.

Though FIGS. 13A-14B illustrate the use of a metal wall and/or other vertically extending structures as the isolation material 1260, it will be understood that other configurations of the isolation material 1260 may be used without deviating from the invention. For example, in some embodiments, the isolation material 1260 may be formed of a mesh, such as a metal mesh. In some embodiments, the isolation material 1260 may be formed of individual isolation bond wires. FIG. 15A is a cross-sectional view illustrating the configuration of an isolation material 1260 incorporating isolation bond wires 1510, according to some embodiments of the invention.

Referring to FIG. 15A, the isolation material 1260 may be composed of a plurality of isolation bond wires 1510 which may be connected to a reference voltage source (e.g., a ground signal). It will be understood that the isolation material 1260 illustrated in FIG. 15A may be disposed on the transistor die 1215 relative to other elements of a packaged transistor device, such as the input bond wires 1020 and output bond wires 1040, in a way similar to the packaged transistor device of FIG. 13A. In some embodiments, the isolation bond wires 1510 of the isolation material 1260 may extend from a first side of the transistor die 1215 to a second side of the transistor die 1215 in a first direction that is orthogonal to a direction in which the input bond wires 1020 and the output bond wires 1040 extend. A portion of at least one of the isolation bond wires 1510 may be physically between the input bond wires 1020 and the output bond wires 1040 (e.g., above the transistor die 1215).

In some embodiments, the isolation bond wires 1510 may be connected to a base and/or substrate on which the transistor die 1215 is arranged on the first side of the transistor die 1215, may extend on the transistor die 1215 at a height above the transistor die 1215, and/or may be connected to the base and/or substrate on the second side of the transistor die 1215. In some embodiments, portions of individual ones of the plurality of isolation bond wires 1510 may overlap one another (e.g., in a horizontal and/or vertical direction), though the present invention is not limited thereto.

Figure 15B:
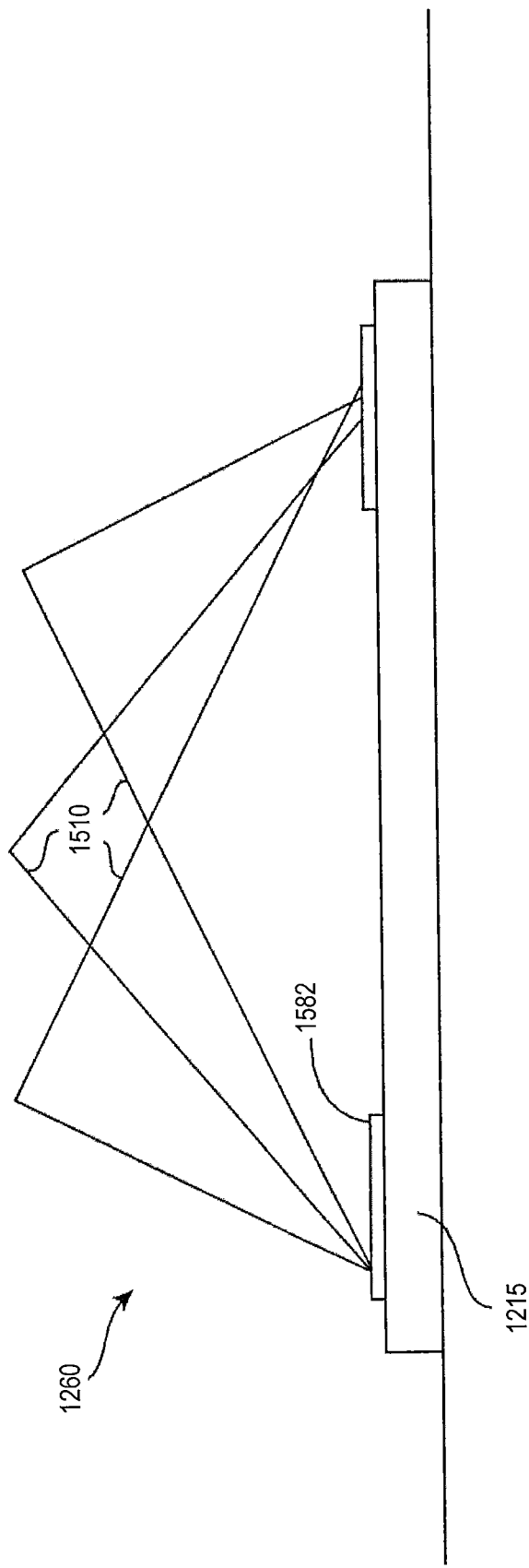
FIG. 15B illustrates an embodiment in which the plurality of isolation bond wires are connected to one or more ground pads, according to further embodiments of the invention.

Though FIG. 15A illustrates the isolation bond wires 1510 connected to the base and/or substrate, the present invention is not limited thereto. In some embodiments, the transistor die 1215 may have pads and/or other connective element on its surface that are connected to a reference signal (e.g., ground) through internal or external connections of the transistor die 1215 (e.g., to the substrate). FIG. 15B illustrates an embodiment in which the plurality of isolation bond wires 1510 are connected to one or more ground pads 1582, according to further embodiments of the invention. In some embodiments, the plurality of isolation bond wires 1510 may be connected to the ground pads 1582 on a surface of the transistor die 1215, such as, for example, a top surface or a side surface.

Figure 16A:
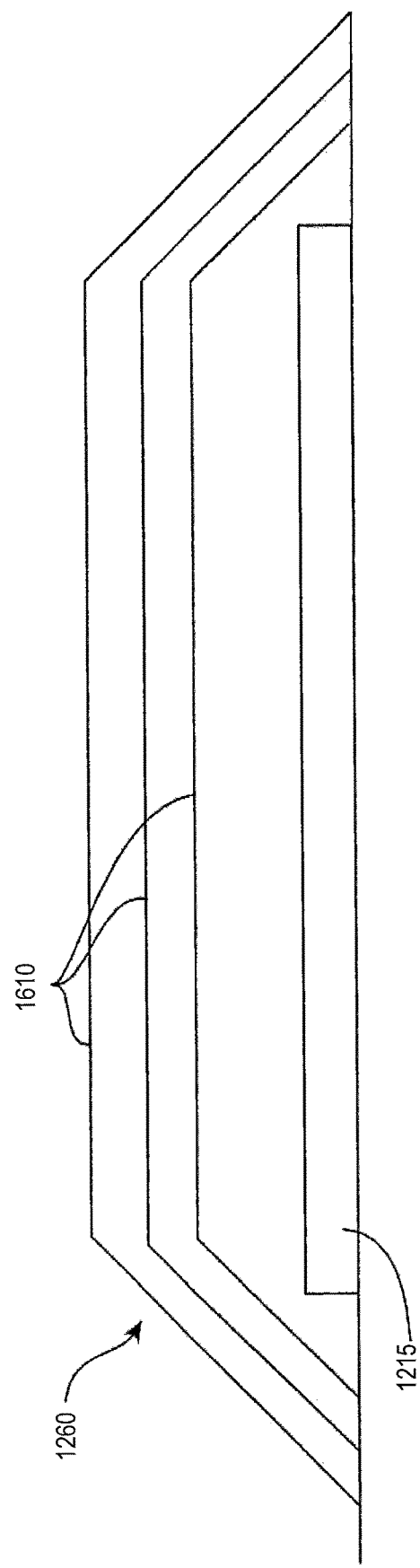
FIG. 16A is a cross-sectional view illustrating the configuration of an isolation material incorporating isolation bond wires, according to further embodiments of the invention.

FIG. 16A is a cross-sectional view illustrating the configuration of an isolation material 1260 incorporating isolation bond wires 1610, according to further embodiments of the invention. Referring to FIG. 16A, the isolation material 1260 may be composed of a plurality of isolation bond wires 1610 which may be connected to a reference voltage source (e.g., a ground signal). The isolation bond wires 1610 of the isolation material 1260 may extend in a first direction from a first side of the transistor die 1215 to a second side of the transistor die 1215. In some embodiments, the isolation bond wires 1610 of the isolation material 1260 may extend from a first side of the transistor die 1215 to a second side of the transistor die 1215 in a first direction that is orthogonal to a direction in which the input bond wires 1020 and the output bond wires 1040 extend. A portion of at least one of the isolation bond wires 1610 may be disposed between the input bond wires 1020 and the output bond wires 1040 (e.g., above the transistor die 1215).

In some embodiments, the isolation bond wires 1610 may be connected to a base and/or substrate on which the transistor die 1215 is arranged on the first side of the transistor die 1215, may extend on the transistor die 1215 at a height above the transistor die 1215, and/or may be connected to the base and/or substrate on the second side of the transistor die 1215. In some embodiments, a first one of the plurality of isolation bond wires 1610 may extend at a level that is higher (e.g., farther from the transistor die 1215) than a second one of the plurality of isolation bond wires 1610. In some embodiments, portions of individual ones of the plurality of isolation bond wires 1610 may extend substantially parallel to one another, though the present invention is not limited thereto. In some embodiments, respective ones of the isolation bond wires 1610 may overlap in the vertical direction but may not overlap in the horizontal direction.

Figure 16B:
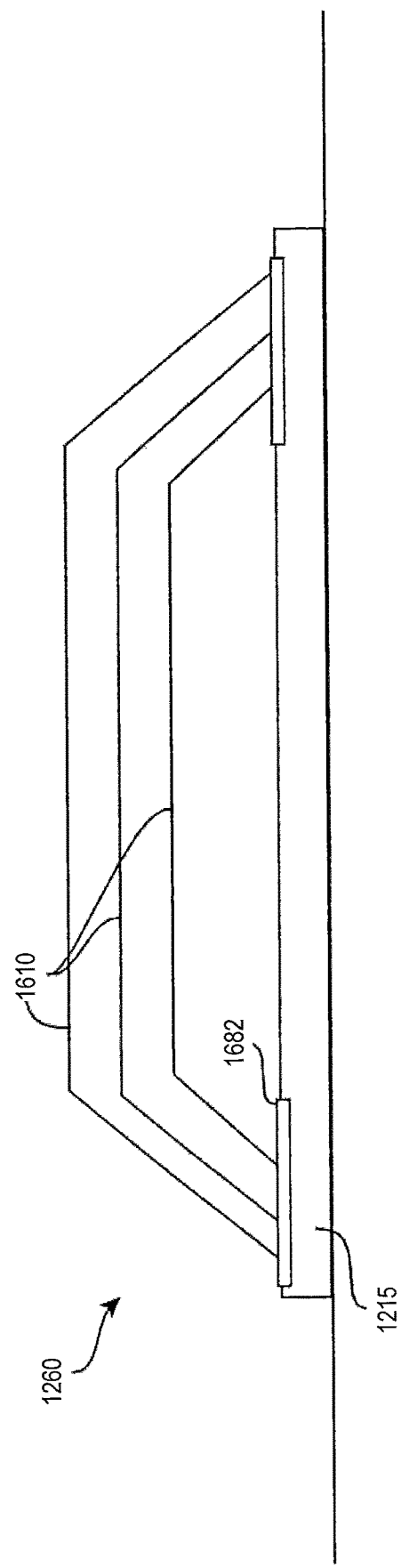
FIG. 16B illustrates an embodiment in which the plurality of isolation bond wires are connected to one or more ground pads, according to further embodiments of the invention.

Though FIG. 16A illustrates the isolation bond wires 1610 connected to the base and/or substrate, the present invention is not limited thereto. FIG. 16B illustrates an embodiment in which the plurality of isolation bond wires 1610 are connected to one or more ground pads 1682. In some embodiments, the transistor die 1215 may have ground pads 1682 and/or other connective elements on its surface that are connected to a reference signal (e.g., ground) through internal or external connections of the transistor die 1215 (e.g., to the substrate). In some embodiments, the plurality of isolation bond wires 1610 may be connected to the ground pads 1682 on a surface of the transistor die 1215, such as, for example, a top surface or a side surface.

As discussed herein, gate bond pads and/or drain bond pads may be disposed on the gate and/or drain fingers to reduce the amount of capacitive and/or magnetic coupling between the bond wires used to couple thereto. As illustrated in FIGS. 12A-12G when a conductive via (e.g., second conductive gate via 1227) is provided directly between the gate bond pad 1220 and the gate interconnect 625, the interior position 629 at which the second conductive gate via 1227 is connected the gate interconnect 625 may be offset from a midpoint of the gate interconnect 625. Similarly, when a conductive via (e.g., second conductive drain via 1237) is provided directly between the drain bond pad 1240 and the drain interconnect 635, the interior position 639 at which the second conductive drain via 1237 is connected the drain interconnect 635 may be offset from a midpoint of the drain interconnect 635. This offset may, in some embodiments, be due to a spacing between the gate bond pad 1220 and the drain bond pad 1240 between which the isolation material 1260 is disposed.

Figure 17A:
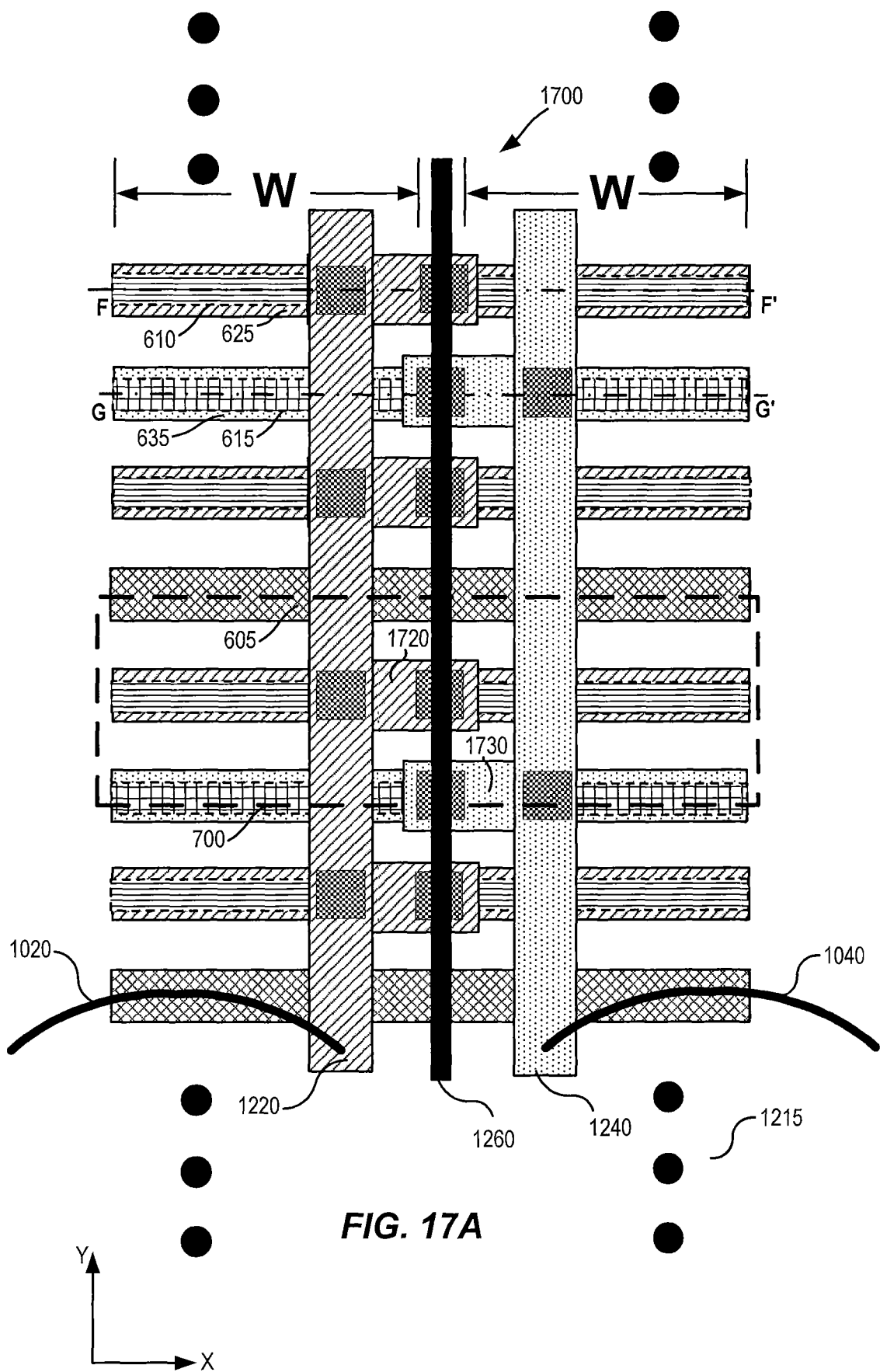
FIG. 17A is a plan view illustrating a transistor device in which the width of gate fingers are increased and a gate bond pad is provided on the gate fingers with a multi-segment conductive via, according to some embodiments of the invention.
Figure 17B:
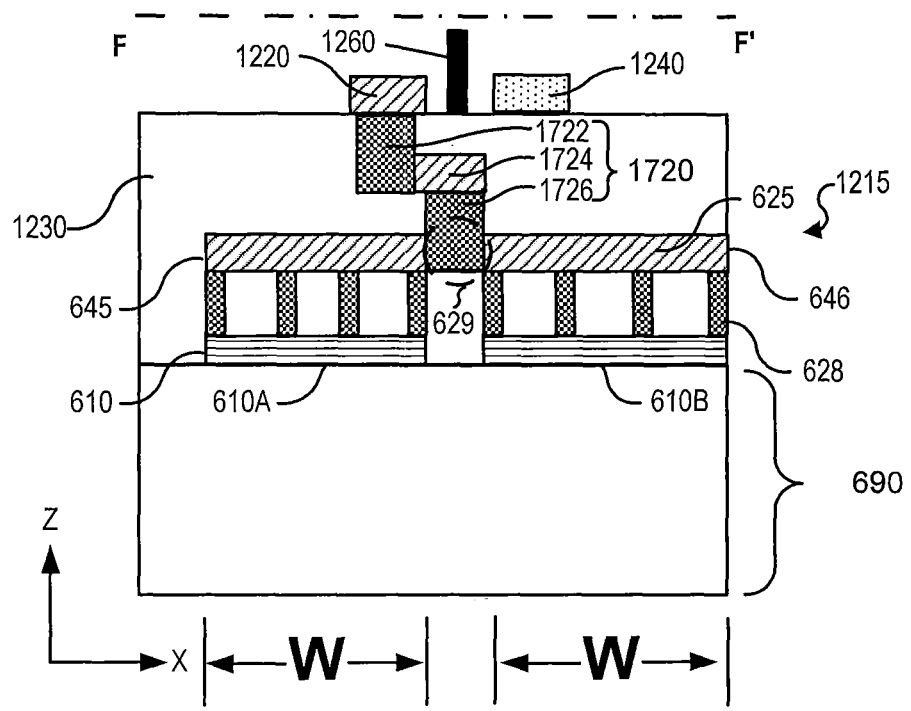
FIG. 17B is a cross section of FIG. 17A taken along the line F-F', according to some embodiments of the invention.
Figure 17C:
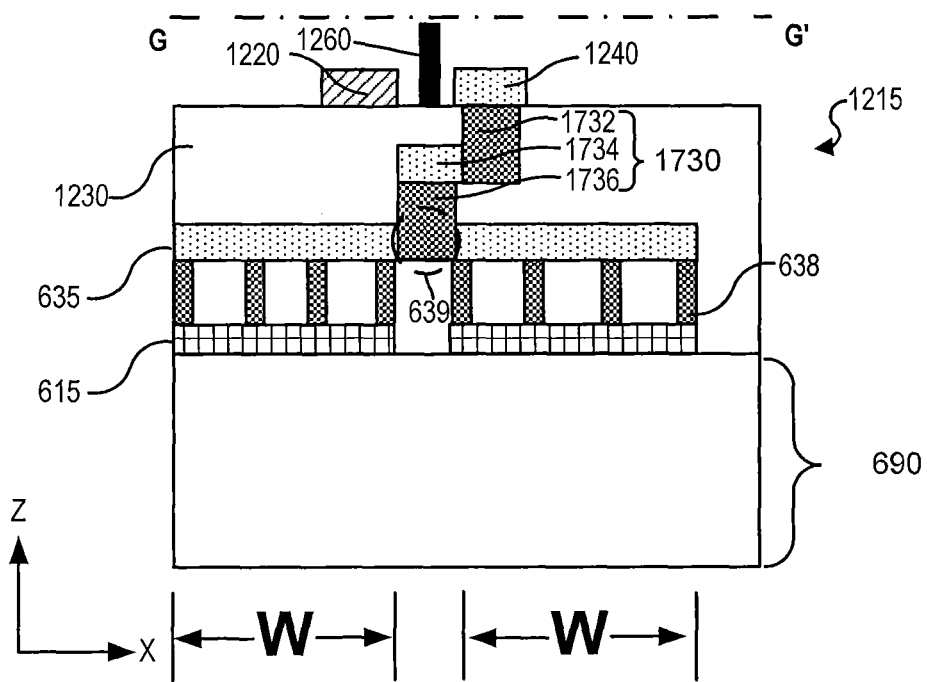
FIG. 17C is a cross section of FIG. 17A taken along the line G-G', according to some embodiments of the invention.

In some embodiments, it may be beneficial to provide an offset to the second conductive drain/gate via so as to connect the second conductive drain/gate via more closely to a midpoint of the respective gate/drain interconnect. FIG. 17A is a plan view illustrating a transistor device 1700 in which the width of gate fingers 610 are increased and a gate bond pad 1220 is provided on the gate fingers 610 with a multi-segment conductive gate via 1720, according to some embodiments of the invention. FIG. 17B is a cross section of FIG. 17A taken along the line F-F', according to some embodiments of the invention. FIG. 17C is a cross section of FIG. 17A taken along the line G-G', according to some embodiments of the invention. Many of the elements with respect to the gate fingers 610, drain fingers 615, and source fingers 605 are similar to those illustrated in FIGS. 6A-6C and 12A-12C. Accordingly, a further description thereof will be omitted.

Referring to FIGS. 17A-17C, a gate bond pad 1220 may be provided on the plurality of gate fingers 610 and drain fingers 615. The gate bond pad 1220 may extend in the first direction (e.g., the Y direction) on the gate fingers 610 and/or drain fingers 615 (e.g., to cross the gate fingers 610 and/or drain fingers 615). One or more input bond wires 1020 may be bonded to the gate bond pad. The input bond wires 1020 may provide an input signal (e.g., a gate signal) to the gates of the transistor cells 700. Though only one input bond wire 1020 is illustrated in FIG. 17A, it will be understood that additional input bond wires 1020 may be present at different positions along the gate bond pad 1220. Respective ones of the input bond wires 1020 may extend on one or more of the gate fingers 610 and/or drain fingers 615 to the gate bond pad 1220.

A drain bond pad 1240 may be provided on the plurality of gate fingers 610 and drain fingers 615. The drain bond pad 1240 may extend in the first direction (e.g., the Y direction) on the gate fingers 610 and/or drain fingers 615 (e.g., to cross the gate fingers 610 and/or drain fingers 615). One or more output bond wires 1040 may be bonded to the drain bond pad. The output bond wires 1040 may provide an output signal (e.g., a drain signal) from the transistor cells 700. Though only one output bond wire 1040 is illustrated in FIG. 17A, it will be understood that additional output bond wires 1040 may be present at different positions along the drain bond pad 1240. Respective ones of the output bond wires 1040 may extend on one or more of the gate fingers 610 and/or drain fingers 615 to be bonded to the drain bond pad 1240. In some embodiments, the gate bond pad 1220 and/or the drain bond pad 1240 may contain metal or other highly conductive material, including, for example, copper, gold, and/or a composite metal.

Referring to FIGS. 17A and 17B, each gate finger 610 may be coupled to a gate interconnect 625 by a plurality of first conductive gate vias 628. In some embodiments, the gate interconnects 625 may be at a higher level above the semiconductor structure 690 (e.g., in the Z direction) than the gate fingers 610. In some embodiments, the gate interconnect 625 may have a greater dimension in the first direction (e.g., in the Y-direction) than the gate finger 610. The gate interconnects 625 may be connected to the gate bond pad 1220 by a multi-segment conductive gate via 1720.

The multi-segment conductive gate via 1720 may include a plurality of segments that provide a connection between the gate bond pad 1220 and the gate interconnect 625. The plurality of segments may include, for example, a first vertical gate via segment 1722, a first horizontal gate via segment 1724, and a second vertical gate via segment 1726. For example, the first vertical gate via segment 1722 may be coupled to the gate bond pad 1220 and extend vertically below a surface of the transistor die 1215. The first horizontal gate via segment 1724 may be coupled to the first vertical gate via segment 1722 and may extend generally in the second direction (e.g., the X direction) within the dielectric layer 1230 to a point above the midpoint of the gate interconnect 625. The second vertical gate via segment 1726 may be coupled to the first horizontal gate via segment 1724 and may extend vertically to couple with the gate interconnect 625 at an interior position 629 of the gate interconnect 625.

It will be understood that the terms "horizontal" and "vertical" do not require that the segment extend strictly in a horizontal or vertical direction. Rather the vertical segments (e.g., the first gate via vertical segment 1722 and/or the second gate via vertical segment 1726) may extend generally from a first position to a second position that is remote from the first position in the third direction (e.g., the Z-direction). Similarly, the horizontal segments (e.g., the first gate via horizontal segment 1724) may extend generally from a first position to a second position that is remote from the first position in the first and/or second directions (e.g., the Y-direction and/or the X-direction).

In some embodiments, each multi-segment conductive gate via 1720 that connects the gate bond pad 1220 to a respective gate interconnect 625 may be connected to the gate interconnect 625 at an interior position 629 of the gate interconnect 625. For example, the gate interconnect 625 may have first and second opposed ends 645, 646. In some embodiments, the second conductive gate via 627 may be connected to the gate interconnect 625 at an interior position 629 of the gate interconnect 625 that is between the first end 645 and the second end 646. In some embodiments, the interior position 629 may be offset from a midpoint of the first end 645 and the second end 646 of the gate interconnect 625. In some embodiments, the interior position 629 may be at a distance that is within twenty percent of the length of the gate interconnect 625 from the midpoint of the gate interconnect 625. In some embodiments, the interior position 629 may be at a distance that is between one-third and two-thirds of the distance between the first end 645 and the second end 646 of the gate interconnect 625.

Similarly, referring to FIGS. 17A and 17C, each drain finger 615 may be coupled to a drain interconnect 635 by a plurality of first conductive drain vias 638. In some embodiments, the drain interconnects 635 may be at a higher level above the semiconductor structure 690 (e.g., in the Z direction) than the drain fingers 615. In some embodiments, the drain interconnect 635 may have a greater dimension in the first direction (e.g., in the Y-direction) than the drain finger 615. The drain interconnects 635 may be connected to the drain bond pad 1240 by a multi-segment conductive drain via 1730.

The multi-segment conductive drain via 1730 may include a plurality of segments that provide a connection between the drain bond pad 1240 and the drain interconnect 635. The plurality of segments may include, for example, a first vertical drain via segment 1732, a first horizontal drain via segment 1734, and a second vertical drain via segment 1736. For example, the first vertical drain via segment 1732 may be coupled to the drain bond pad 1240 and may extend vertically below a surface of the transistor die 1215. The first horizontal drain via segment 1734 may be coupled to the first vertical drain via segment 1732 and may extend generally in the second direction (e.g., the X direction) within the dielectric layer 1230 to a point above the midpoint of the drain interconnect 635. The second vertical drain via segment 1736 may be coupled to the first horizontal drain via segment 1734 and may extend vertically to couple with the drain interconnect 635 at an interior position 639 of the drain interconnect 635.

In some embodiments, each multi-segment conductive drain via 1730 that connects the drain bond pad 1240 to a respective drain interconnect 635 may be connected to the drain interconnect 635 at an interior position 639 of the drain interconnect 635. The interior position 639 of the drain interconnect 635 may be positioned between opposite ends of the drain interconnect similarly as discussed herein with respect to the interior position 629 of the gate interconnect 625.

Though the multi-segment conductive gate via 1720 and the multi-segment conductive drain via 1730 are illustrated with three segments, it will be understood that different numbers of segments, in different configurations than those shown in FIGS. 17B and 17C may be used without deviating from the present invention. In general, the multi-segment conductive gate via 1720 and the multi-segment conductive drain via 1730 are intended to include any conductive via configured to communicate a signal from an interior position of an interconnect (e.g., gate and/or drain interconnect) and/or finger (e.g., gate and/or drain finger) to a bond pad (e.g., gate bond pad 1120 and/or drain bond pad 1240) that is offset in the horizontal direction from the interior position on the interconnect and/or finger.

Figure 17D:
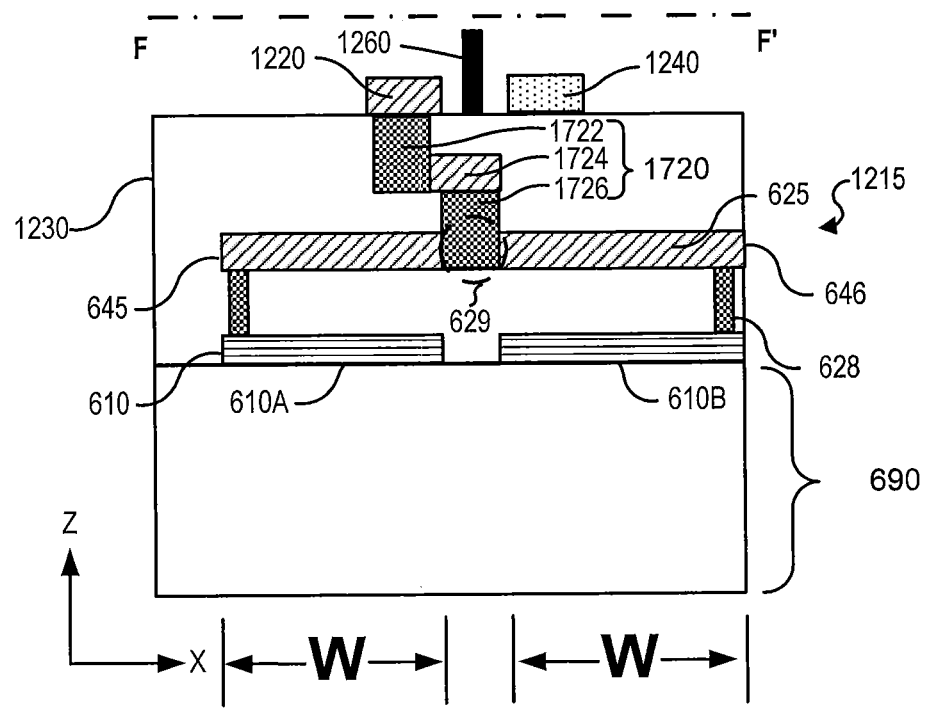
FIGS. 17D and 17E illustrate a cross section of another example embodiment of FIG. 17A incorporating a multi-segment conductive gate via taken along the lines F-F' and G-G', respectively, in which the gate finger is edge-fed, according to some embodiments of the invention.
Figure 17E:
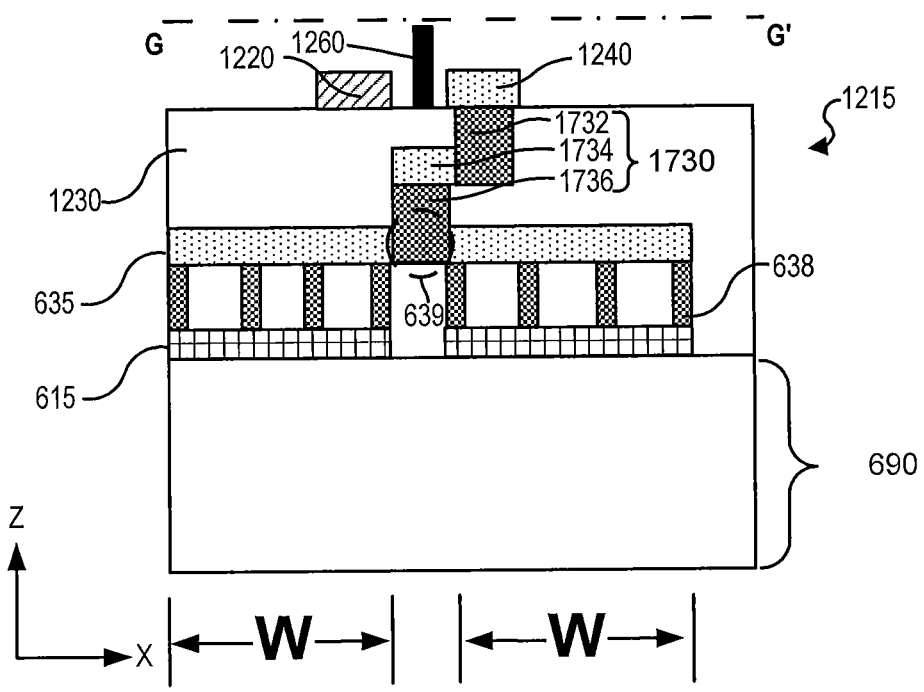
Figure 17F:
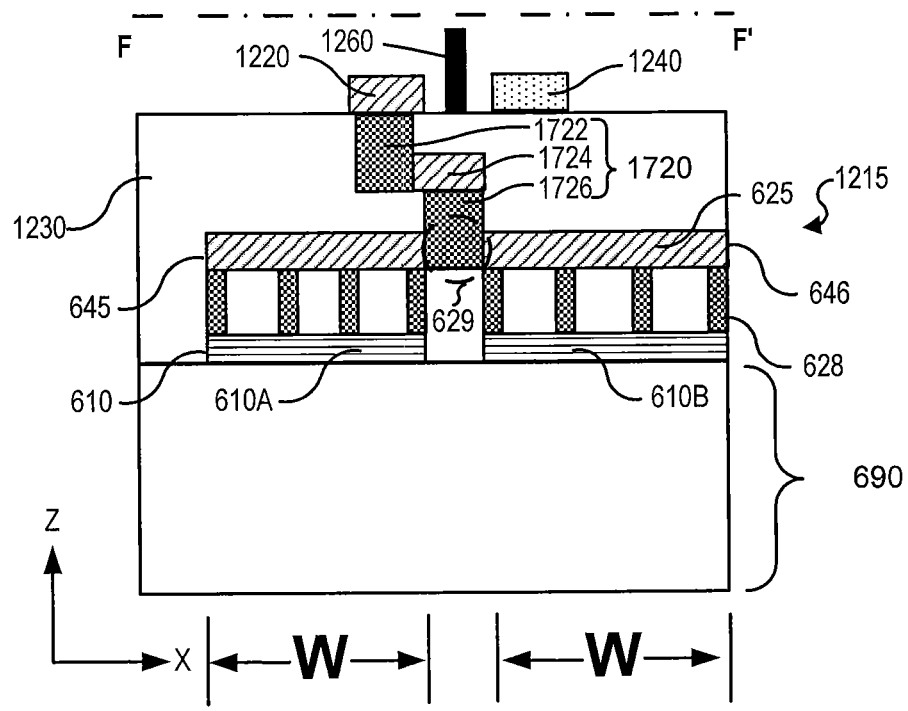
FIGS. 17F and 17G illustrate a cross section of another example embodiment of FIG. 17A incorporating a multi-segment conductive drain via taken along the lines F-F' and G-G', respectively, in which the drain finger is edge-fed, according to some embodiments of the invention.
Figure 17G:
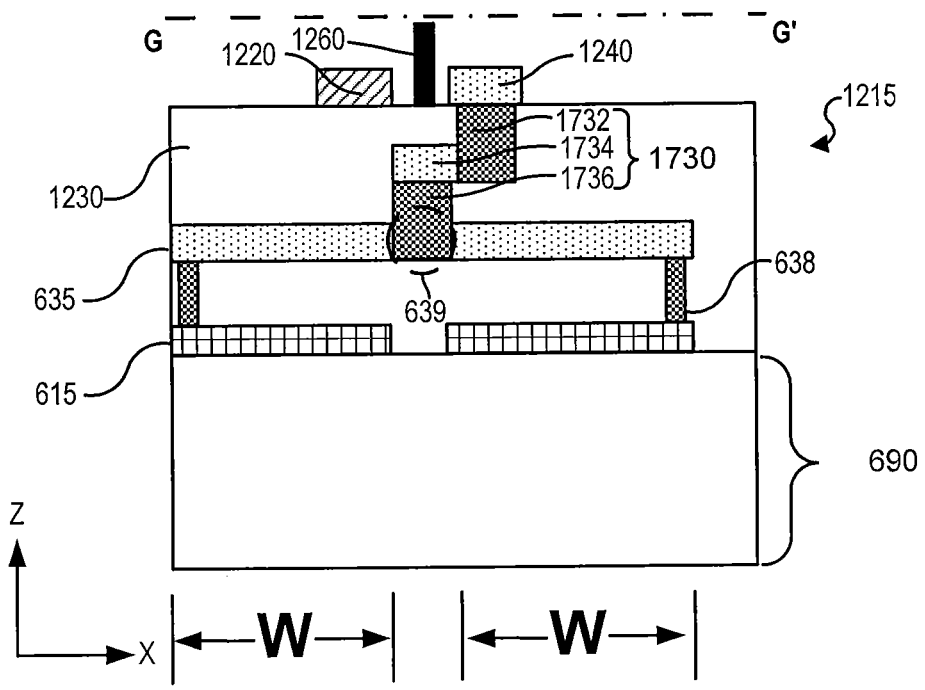

As discussed herein with respect to FIGS. 12D-12G, the gate finger 610 and/or drain finger 615 may be configured to be edge-fed. FIGS. 17D and 17E illustrate a cross section of another example embodiment of FIG. 17A incorporating a multi-segment conductive gate via 1720 taken along the lines F-F' and G-G', respectively, in which the gate finger 610 is edge-fed, according to some embodiments of the invention. FIGS. 17F and 17G illustrate a cross section of another example embodiment of FIG. 17A incorporating a multi-segment conductive drain via 1730 taken along the lines F-F' and G-G', respectively, in which the drain finger 615 is edge-fed, according to some embodiments of the invention.

As illustrated in FIGS. 17D-17G, the transistor device 1700 may incorporate an edge-fed gate finger 610 and an interior-fed drain finger 615 (see FIGS. 17D, 17E) or an interior-fed gate finger 610 and an edge-fed drain finger 615 (see FIGS. 17F,17G) in a manner as discussed herein with respect to FIGS. 12D-12G. The use of an edge-fed gate finger 610 or an edge-fed drain finger 615 may improve the power efficiency of the transistor device 1700.

Figure 18A:
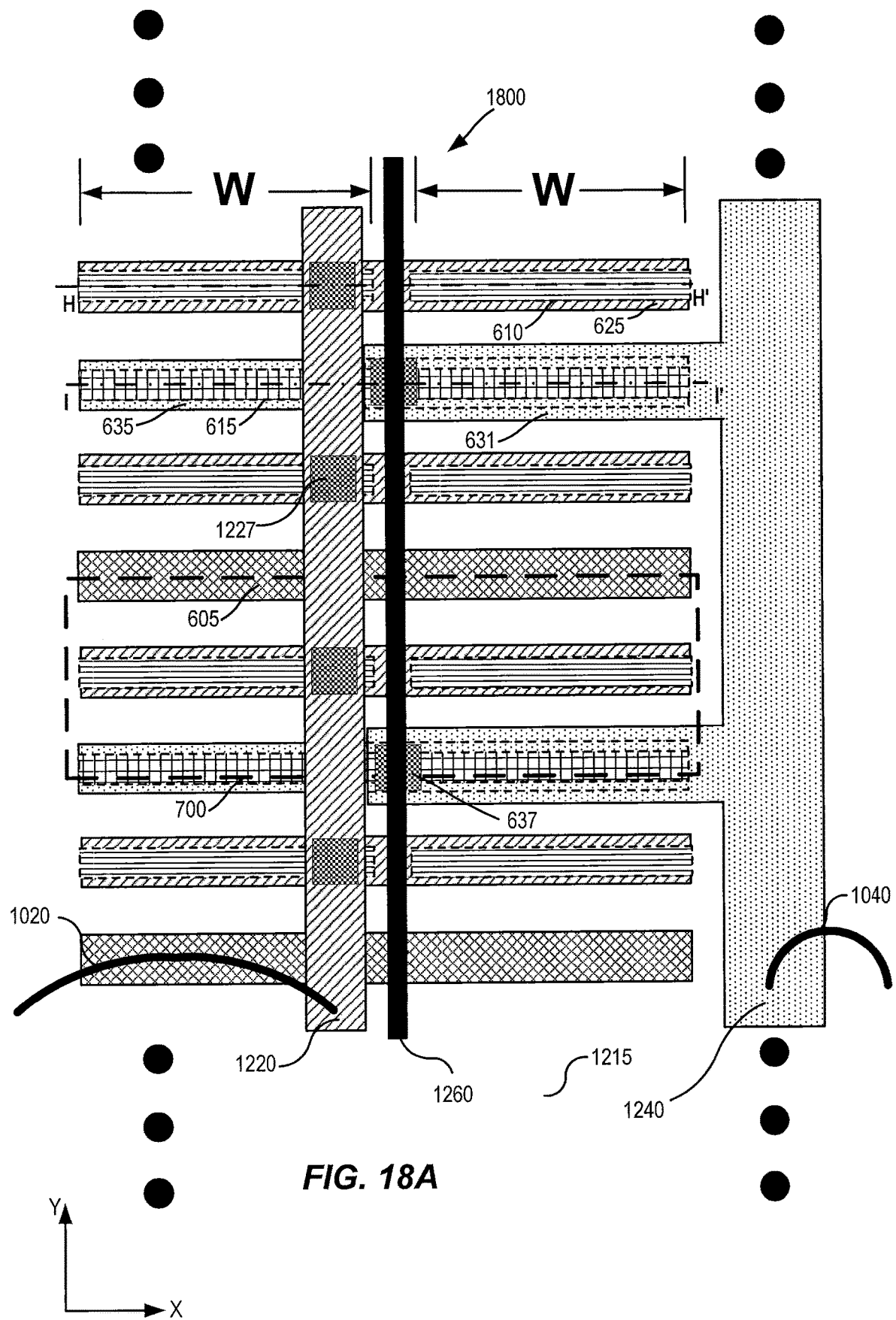
FIG. 18A is a plan view illustrating a transistor device in which the gate bond pad extends on the gate and drain fingers and the drain bond pad does not extend on the gate and drain fingers, according to some embodiments of the invention.
Figure 18B:
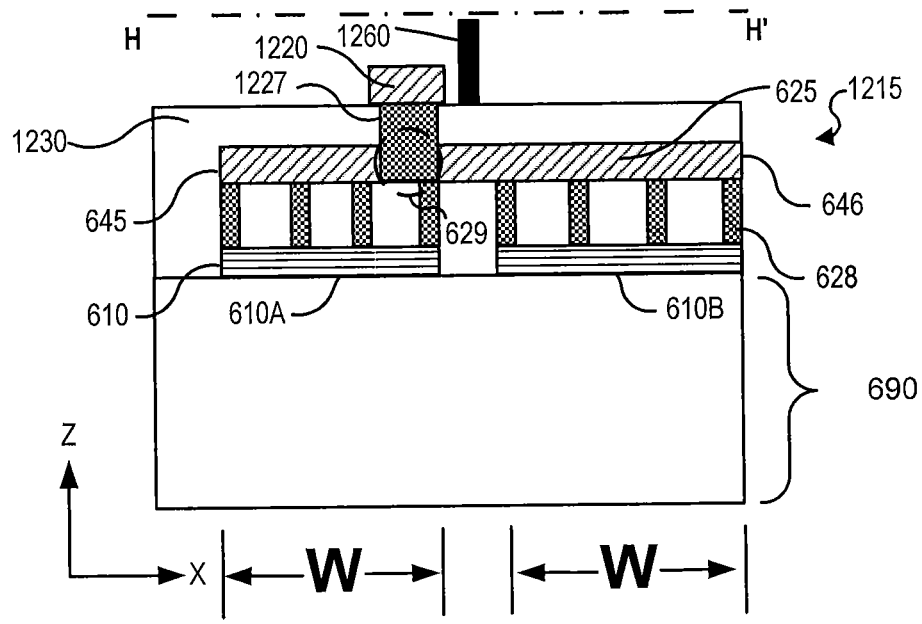
FIG. 18B is a cross section of FIG. 18A taken along the line H-h', according to some embodiments of the invention.
Figure 18C:
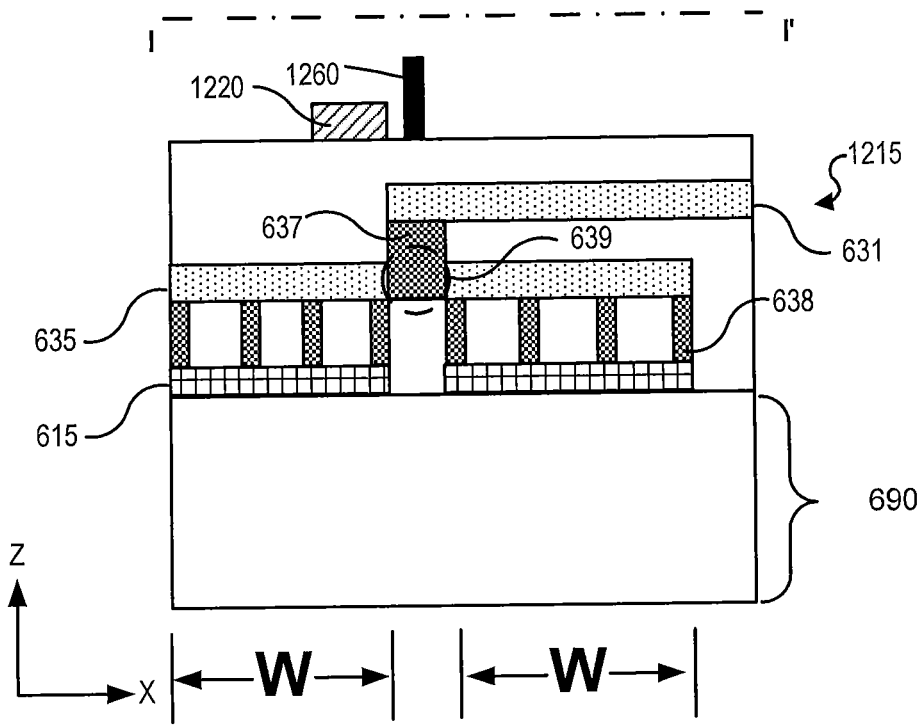
FIG. 18C is a cross section of FIG. 18A taken along the line I-I', according to some embodiments of the invention.

Though FIGS. 12A-17G illustrate embodiments where both the gate bond pad 1220 and the drain bond pad 1240 extend on the gate fingers 610 and drain fingers 615, it will be apparent to those of skill in the art that other embodiments are possible. FIG. 18A is a plan view illustrating a transistor device 1800 in which the gate bond pad 1220 extends on the gate and drain fingers 610, 615 and the drain bond pad 1240 does not extend on the gate and drain fingers 610, 615, according to some embodiments of the invention. FIG. 18B is a cross section of FIG. 18A taken along the line H-H', according to some embodiments of the invention. FIG. 18C is a cross section of FIG. 18A taken along the line I-I', according to some embodiments of the invention. As elements of FIGS. 18A-18C incorporate elements described herein, the description of FIGS. 18A-18C will focus on differences from previous embodiments.

Referring to FIGS. 18A and 18B, the gates of the transistor cells 700 of a transistor device 1800 may incorporate a gate configuration in which the gate bond pad 1220 may be provided on the plurality of gate fingers 610 and drain fingers 615. The gate bond pad 1220 may extend on the gate fingers 610 and/or drain fingers 615 (e.g., to cross the gate fingers 610 and/or drain fingers 615). One or more input bond wires 1020 may be bonded to the gate bond pad 1220. The input bond wires 1020 may provide an input signal (e.g., a gate signal) to the gates of the transistor cells 700. Though only one input bond wire 1020 is illustrated in FIG. 18A, it will be understood that additional input bond wires 1020 may be present at different positions along the gate bond pad 1220. Respective ones of the input bond wires 1020 may extend on one or more of the gate fingers 610 and/or drain fingers 615 to the gate bond pad 1220.

Each gate finger 610 may be coupled to a gate interconnect 625 by a plurality of first conductive gate vias 628. In some embodiments, the gate interconnects 625 may be at a higher level above the semiconductor structure 690 (e.g., in the Z direction) than the gate fingers 610. In some embodiments, the gate interconnect 625 may have a greater dimension in the first direction (e.g., in the Y-direction) than the gate finger 610. The gate interconnects 625 may be connected to the gate bond pad 1220 by a second conductive gate via 1227.

In some embodiments, each second conductive gate via 1227 that connects the gate bond pad 1220 to a respective gate interconnect 625 may be connected to the gate interconnect 625 at an interior position 629 of the gate interconnect 625. For example, the gate interconnect 625 may have first and second opposed ends 645, 646. In some embodiments, the second conductive gate via 1227 may be connected to the gate interconnect 625 at an interior position 629 of the gate interconnect 625 that is between the first end 645 and the second end 646. In some embodiments, the interior position 629 may be offset from a midpoint of the first end 645 and the second end 646 of the gate interconnect 625. The second conductive gate via 1227 may be coupled, for example, as described herein with respect to FIGS. 12A-12G.

Referring to FIGS. 18A and 18C, the transistor cells 700 of a transistor device 1800 may incorporate a drain configuration in which the drain bond pad 1240 does not extend on the plurality of gate fingers 610 and drain fingers 615. The drain bond pad 1240 may extend in the first direction (e.g., the Y direction) adjacent the gate fingers 610 and drain fingers 615. One or more output bond wires 1040 may be bonded to the drain bond pad 1240. The output bond wires 1040 may provide an output signal (e.g., a drain signal) from the transistor cells 700. Though only one output bond wire 1040 is illustrated in FIG. 18A, it will be understood that additional output bond wires 1040 may be present at different positions along the drain bond pad 1240.

Each drain finger 615 may be coupled to a respective drain interconnect 635 by a plurality of first conductive drain vias 638. In some embodiments, the drain interconnects 635 may be at a higher level above the semiconductor structure 690 than the drain fingers 615. In some embodiments, the drain interconnects 635 may be at a same level above the semiconductor structure 690 as the gate interconnects 625. In some embodiments, the drain interconnects 635 may be at a different level above the semiconductor structure 690 as the gate interconnects 625. In some embodiments, the drain interconnects 635 may have a greater dimension in the first direction (e.g., in the Y-direction) than the drain fingers 615.

Each drain interconnect 635 may be connected to a respective drain runner 631 by a respective second conductive drain via 637 at an interior position 639 of the drain interconnect 635. In some embodiments, the drain runner 631 may be at a higher level above the semiconductor structure 690 than the drain interconnect 635. In some embodiments, the drain runner 631 may have a greater dimension in the first direction (e.g., in the Y-direction) than the drain interconnects 635. In some embodiments, the drain runner 631 may contain metal or other highly conductive material, including, for example, copper, gold, and/or a composite metal. The drain runner 631 may be connected to the drain bond pad 1240. The drain bond pad 1240 may provide the drain signal of the plurality of transistor cells 700.

Though the drain runner 631 is illustrated as being directly connected to the drain bond pad 1240 in FIG. 18A, it will be understood that additional embodiments are possible. For example, the drain bond pad 1240 may be connected to a drain mandrel, such as the drain manifold 640 in FIGS. 6A and 6C, and the drain manifold 640 may be connected to the drain runner 631.

An isolation material 1260 may be placed on a surface of the transistor die 1215 of the transistor device on an area between the gate bond pad 1220 and the drain bond pad 1240. As illustrated in FIG. 18A, even though the input bond wires 1020 and the output bond wires 1040 are separated by a greater distance than in previous embodiments, the use of the isolation material may still assist in preventing and/or reducing a capacitive and/or magnetic coupling between the input bond wires 1020 and the output bond wires 1040. The isolation material 1260 may be configured in any of the configurations described herein, and a duplicate description thereof will be omitted.

With respect to the gate configuration of FIGS. 18A-18C, a second conductive gate via 1227 is utilized to connect the gate bond pad 1220 to the gate interconnect 625 at an interior position 629 of the gate interconnect 625. As illustrated in FIG. 18B, the second conductive gate via 1227 may be coupled to the interior position 629 that is offset from a midpoint of the gate interconnect 625. In some embodiments, a multi-segment conductive via may be utilized to connect to the gate interconnect 625 at an interior position 629 that is closer to the midpoint of the gate interconnect.

Figure 19A:
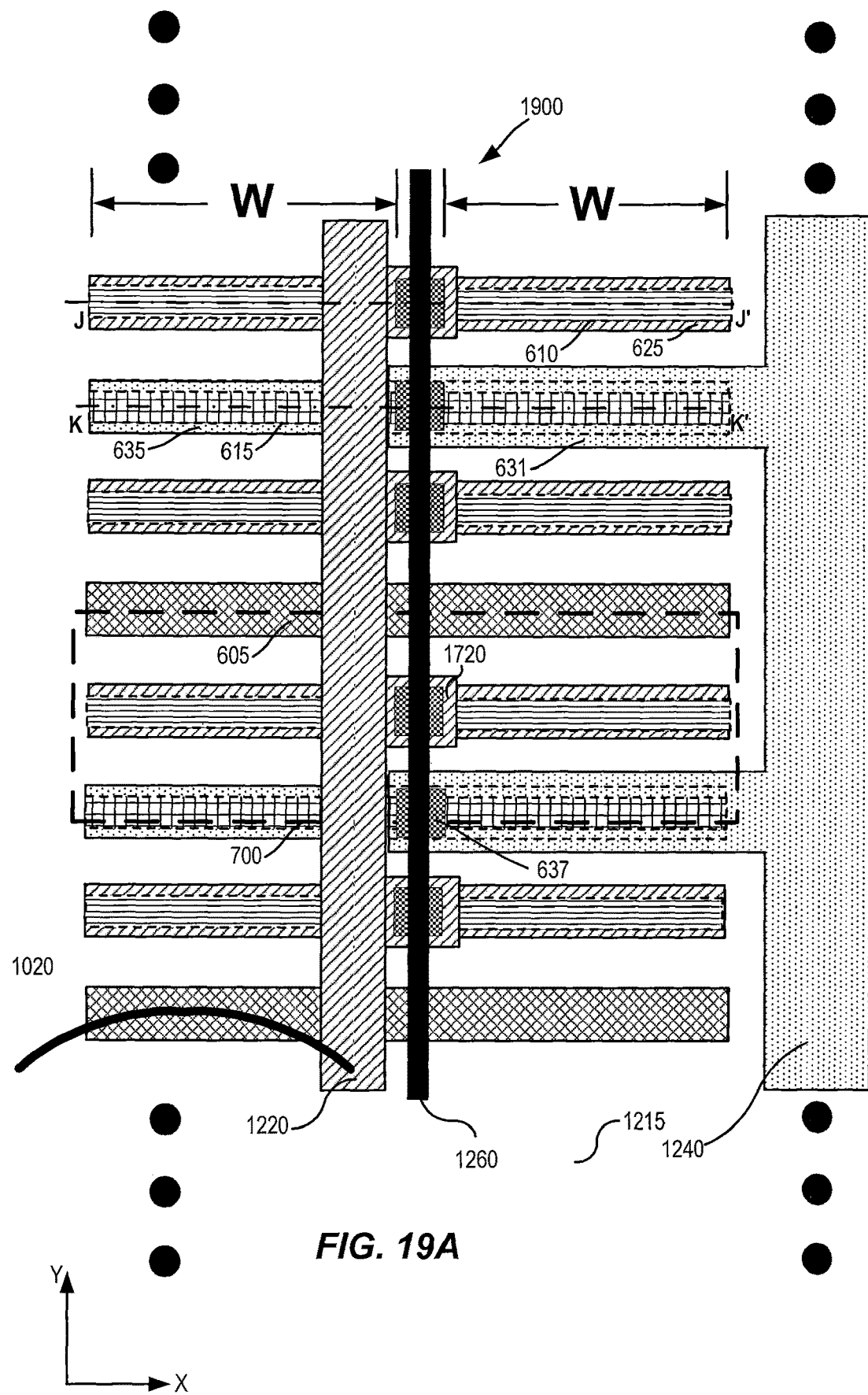
FIG. 19A is a plan view illustrating a transistor device in which a gate bond pad is provided on the gate and drain fingers with a multi-segment conductive via and the drain bond pad does not extend on the gate and drain fingers, according to some embodiments of the invention.
Figure 19B:
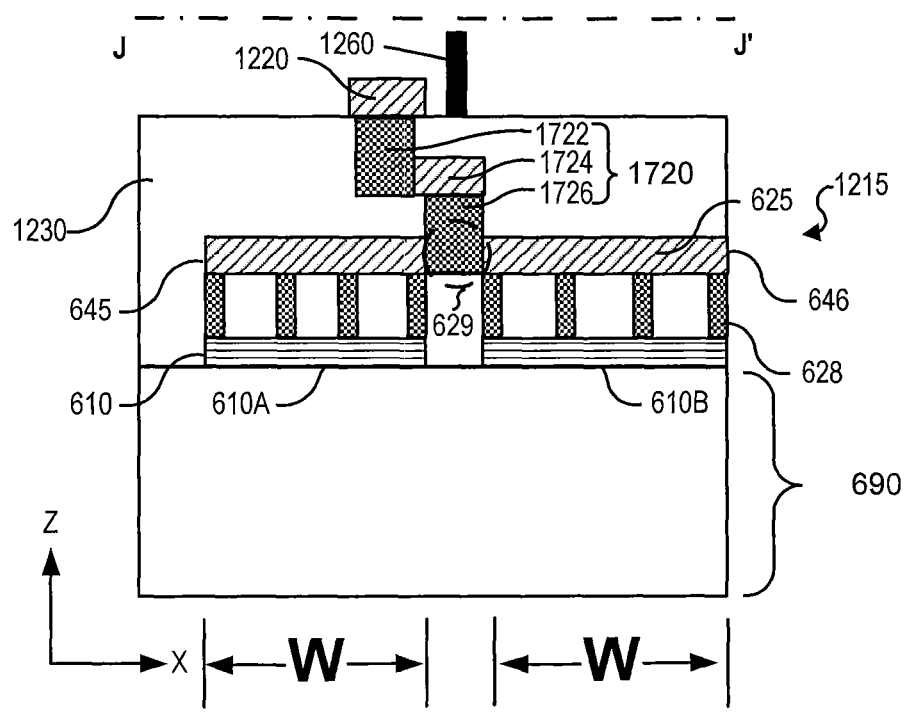
FIG. 19B is a cross section of FIG. 19A taken along the line J-J', according to some embodiments of the invention.
Figure 19C:
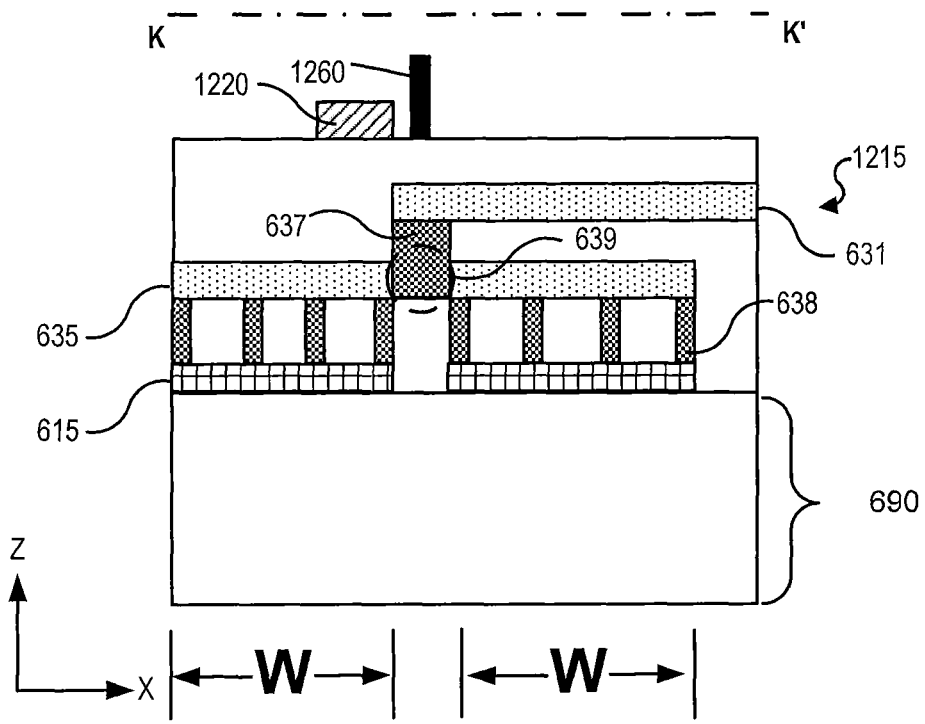
FIG. 19C is a cross section of FIG. 19A taken along the line K-K', according to some embodiments of the invention.

For example, FIGS. 19A-19C illustrate an embodiment of the present invention that is similar to the embodiment of FIGS. 18A-18C, but with the use of a multi-segment conductive gate via 1720. FIG. 19A is a plan view illustrating a transistor device in which a gate bond pad 1220 is provided on the gate and drain fingers 610, 615 with a multi-segment conductive gate via 1720 and the drain bond pad 1240 does not extend on the gate and drain fingers 610, 615, according to some embodiments of the invention. FIG. 19B is a cross section of FIG. 19A taken along the line J-J', according to some embodiments of the invention. FIG. 19C is a cross section of FIG. 19A taken along the line K-K', according to some embodiments of the invention. As elements of FIGS. 19A-19C incorporate elements described herein, the description of FIGS. 19A-19C will focus on differences from previous embodiments.

As illustrated in FIG. 19B, the gate bond pad 1220 may be coupled to the gate interconnect 625 by a multi-segment conductive gate via 1720. The multi-segment conductive gate via 1720 may include a plurality of segments that provide a connection between the gate bond pad 1220 and the gate interconnect 625. The plurality of segments may include, for example, a first vertical gate via segment 1722, a first horizontal gate via segment 1724, and a second vertical gate via segment 1726. For example, the first vertical gate via segment 1722 may be coupled to the gate bond pad 1220 and extend vertically below a surface of the transistor die 1215. The first horizontal gate via segment 1724 may be coupled to the first vertical gate via segment 1722 and may extend generally in the second direction (e.g., the X direction) within the dielectric layer 1230 to a point above the midpoint of the gate interconnect 625. The second vertical gate via segment 1726 may be coupled to the first horizontal gate via segment 1724 and may extend vertically to couple with the gate interconnect 625 at an interior position 629 of the gate interconnect 625. The multi-segment conductive gate via 1720 may be similar to the configurations discussed herein with respect to FIGS. 17A-17G.

As illustrated in FIG. 19C, the drain bond pad 1240 may be coupled in a similar manner as illustrated and described with respect to FIGS. 18A and 18C. As such a duplicate description thereof will be omitted.

Figure 20A:
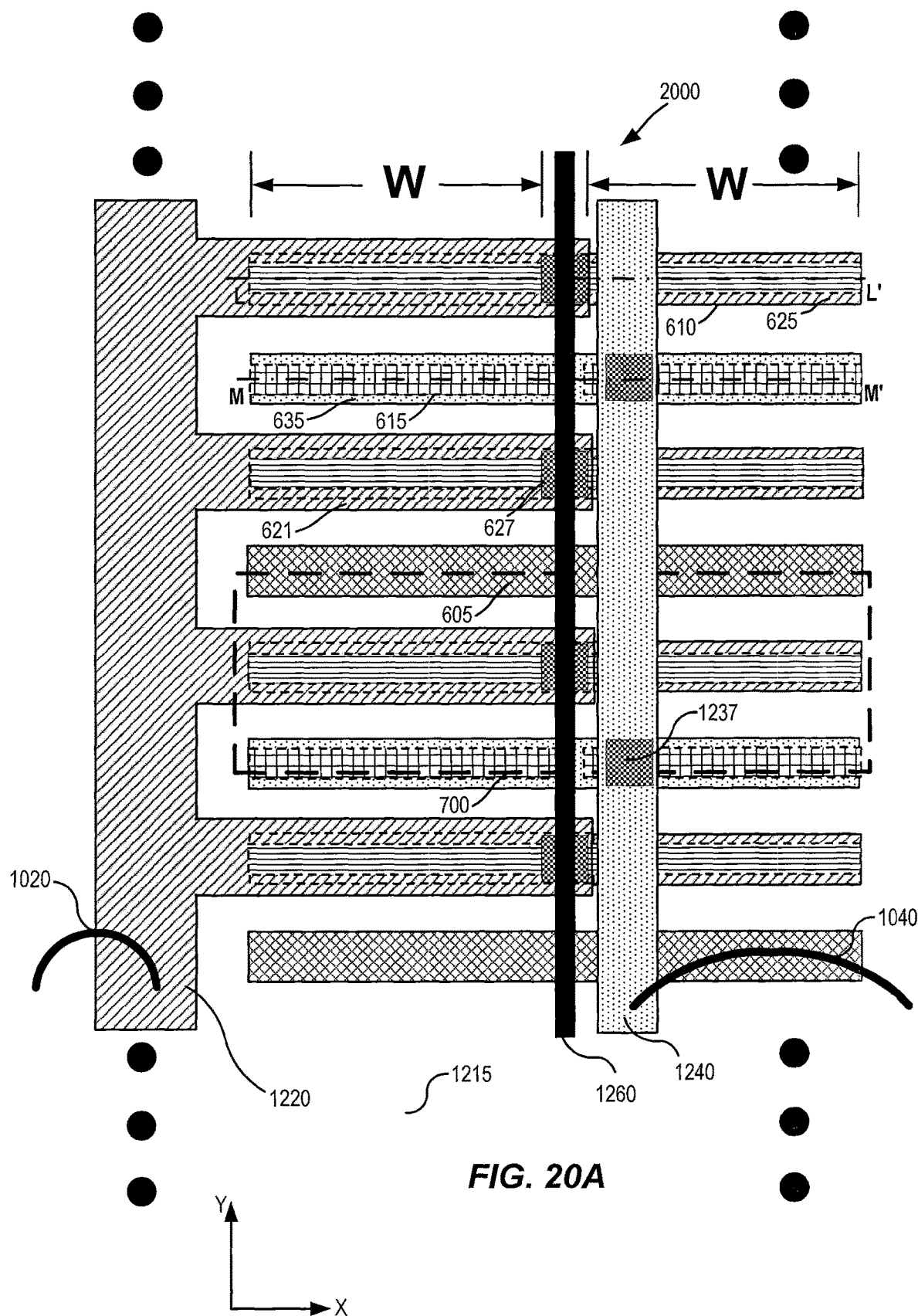
FIG. 20A is a plan view illustrating a transistor device in which gate bond pad 1220 does not extend on the gate and drain fingers and the drain bond pad extends on the gate and drain fingers, according to some embodiments of the invention.
Figure 20B:
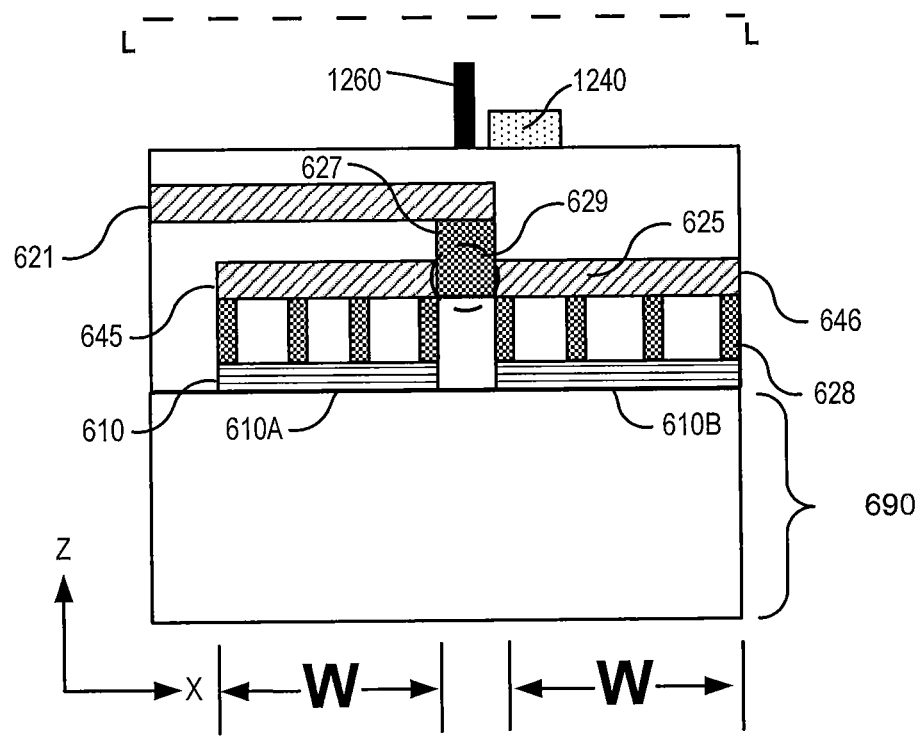
FIG. 20B is a cross section of FIG. 20A taken along the line L-L', according to some embodiments of the invention.
Figure 20C:
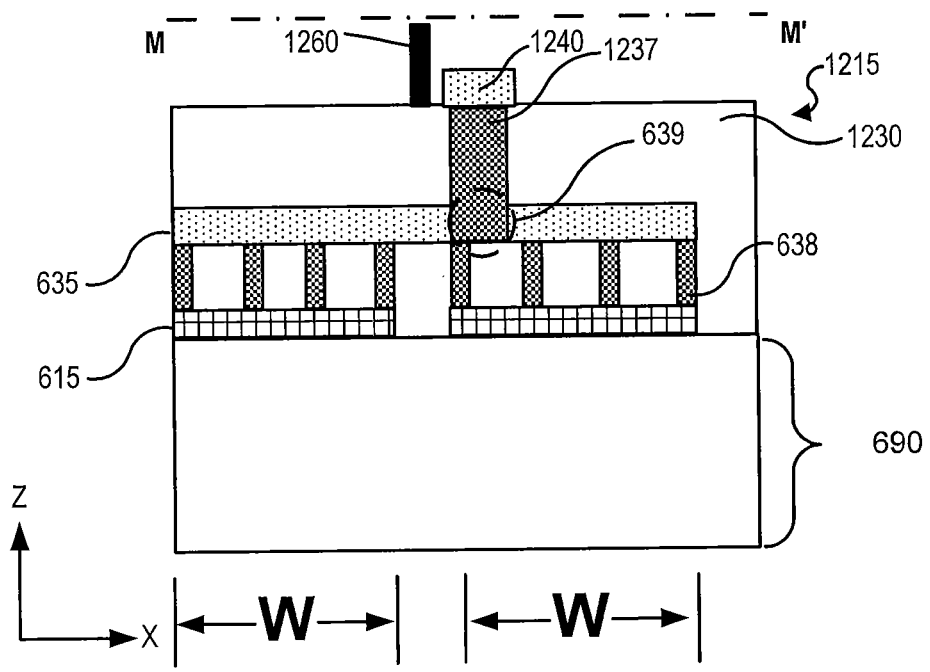
FIG. 20C is a cross section of FIG. 20A taken along the line M-M', according to some embodiments of the invention.

A transistor device can also be coupled such that the drain bond pad 1240 extends on the gate and drain fingers 610, 615, but the gate bond pad 1220 does not. FIG. 20A is a plan view illustrating a transistor device 2000 in which gate bond pad 1220 does not extend on the gate and drain fingers 610, 615 and the drain bond pad 1240 extends on the gate and drain fingers 610, 615, according to some embodiments of the invention. FIG. 20B is a cross section of FIG. 20A taken along the line L-L', according to some embodiments of the invention. FIG. 20C is a cross section of FIG. 20A taken along the line M-M', according to some embodiments of the invention. As elements of FIGS. 20A-20C incorporate some elements described herein, the description of FIGS. 20A-20C will focus on differences from previous embodiments.

Referring to FIGS. 20A and 20B, the gates of the transistor cells 700 of a transistor device 2000 may incorporate a gate configuration in which the gate bond pad 1220 does not extend on the plurality of gate fingers 610 and drain fingers 615. The gate bond pad 1220 may extend in the first direction (e.g., the Y direction) adjacent the gate fingers 610 and drain fingers 615. One or more input bond wires 1020 may be bonded to the gate bond pad 1220. The input bond wires 1020 may provide an input signal (e.g., a gate signal) to the transistor cells 700. Though only one input bond wire 1020 is illustrated in FIG. 20A, it will be understood that additional input bond wires 1020 may be present at different positions along the gate bond pad 1220.

Each gate finger 610 may be coupled to a respective gate interconnect 625 by a plurality of first conductive drain vias 628. In some embodiments, the gate interconnect 625 may be at a higher level above the semiconductor structure 690 than the gate finger 610. In some embodiments, the gate interconnect 625 may have a greater dimension in the first direction (e.g., in the Y-direction) than the gate finger 610.

Each gate interconnect 625 may be connected to a respective gate runner 621 by a respective second conductive gate via 627 at an interior position 629 of the gate interconnect 625. In some embodiments, the gate runner 621 may be at a higher level above the semiconductor structure 690 than the gate interconnect 625. In some embodiments, the gate runner 621 may have a greater dimension in the first direction (e.g., in the Y-direction) than the gate interconnect 625. In some embodiments, the gate runner 621 may contain metal or other highly conductive material, including, for example, copper, gold, and/or a composite metal. The gate runner 621 may be connected to the gate bond pad 1220. The gate bond pad 1220 may provide the gate signal to the plurality of transistor cells 700.

Though the gate runner 621 is illustrated as being directly connected to the gate bond pad 1220 in FIG. 20A, it will be understood that additional embodiments are possible. For example, the gate bond pad 1220 may be connected to a gate mandrel, such as the gate manifold 620 in FIGS. 6A and 6B, and the gate manifold 620 may be connected to the gate runner 621.

Referring to FIGS. 20A and 20C, the drain configuration of the transistor cells 700 may include the drain bond pad 1240 provided on the plurality of gate fingers 610 and drain fingers 615. The drain bond pad 1240 may extend in the first direction (e.g., the Y direction) to cross the gate fingers 610 and drain fingers 615. One or more output bond wires 1040 may be bonded to the drain bond pad 1240. The output bond wires 1040 may provide an output signal (e.g., a drain signal) from the transistor cells 700. Though only one output bond wire 1040 is illustrated in FIG. 20A, it will be understood that additional output bond wires 1040 may be present at different positions along the drain bond pad 1240.

Each drain finger 615 may be coupled to a drain interconnect 635 by a plurality of first conductive drain vias 638. In some embodiments, the drain interconnect 635 may be at a higher level above the semiconductor structure 690 (e.g., in the Z direction) than the drain finger 615. In some embodiments, the drain interconnect 635 may have a greater dimension in the first direction (e.g., in the Y-direction) than the drain finger 615. The drain interconnect 635 may be connected to the drain bond pad 1240 by a second conductive drain via 1237.

In some embodiments, each second conductive drain via 1237 that connects the drain bond pad 1240 to a respective drain interconnect 635 may be connected to the drain interconnect 635 at an interior position 639 of the drain interconnect 635. For example, the second conductive drain via 1237 may be connected to the drain interconnect 635 at an interior position 639 of the drain interconnect 635 that is between the opposite ends of the drain interconnect 635. In some embodiments, the interior position 639 may be offset from a midpoint of the drain interconnect 635. The second conductive drain via 1237 may be coupled, for example, as described herein with respect to FIGS. 12A-12G.

An isolation material 1260 may be placed on a surface of the transistor die 1215 of the transistor device 2000 on an area between the gate bond pad 1220 and the drain bond pad 1240. As illustrated in FIG. 20A, even though the input bond wires 1020 and the output bond wires 1040 are separated by a greater distance than in previous embodiments, the use of the isolation material may still assist in preventing and/or reducing a capacitive and/or magnetic coupling between the input bond wires 1020 and the output bond wires 1040. The isolation material 1260 may be configured in any of the configurations described herein, and a duplicate description thereof will be omitted.

Figure 21A:
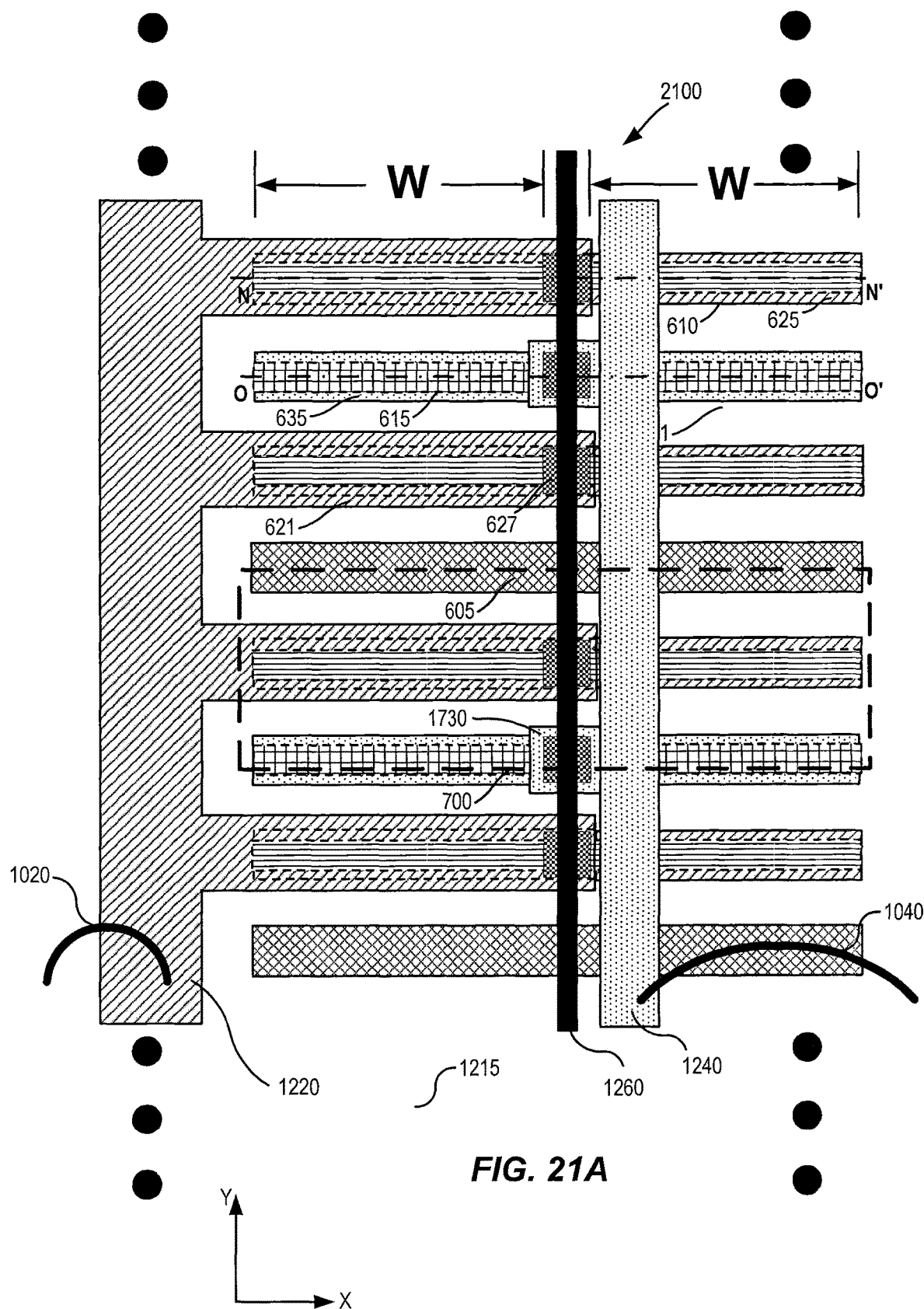
FIG. 21A is a plan view illustrating a transistor device in which a gate bond pad does not extend on the gate and drain fingers and the drain bond pad extend on the gate and drain fingers with a multi-segment conductive via, according to some embodiments of the invention.
Figure 21B:
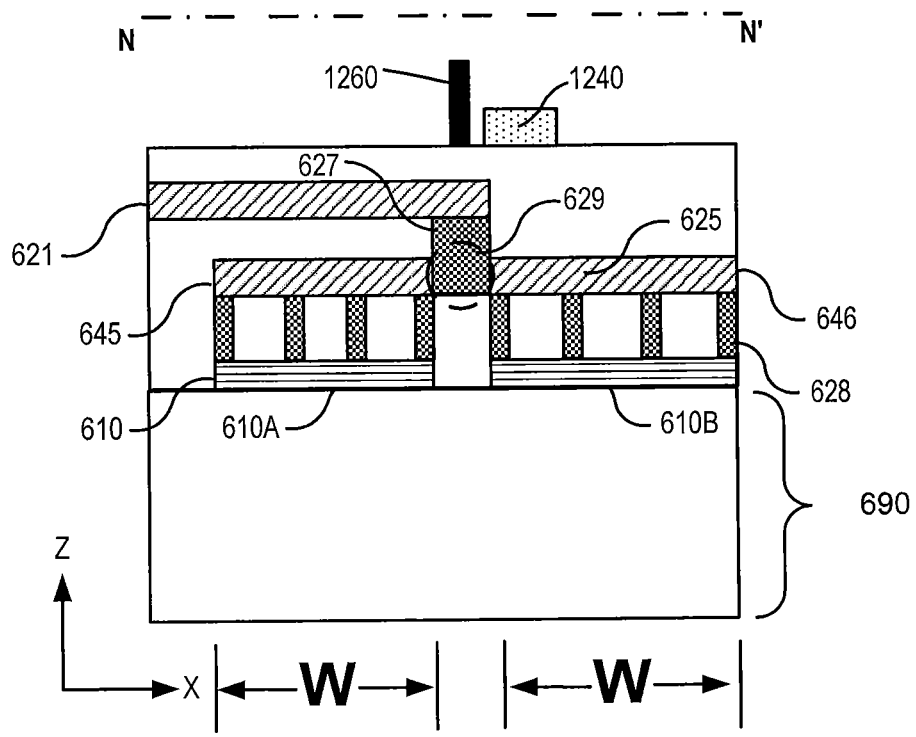
FIG. 21B is a cross section of FIG. 21A taken along the line N-N', according to some embodiments of the invention.
Figure 21C:
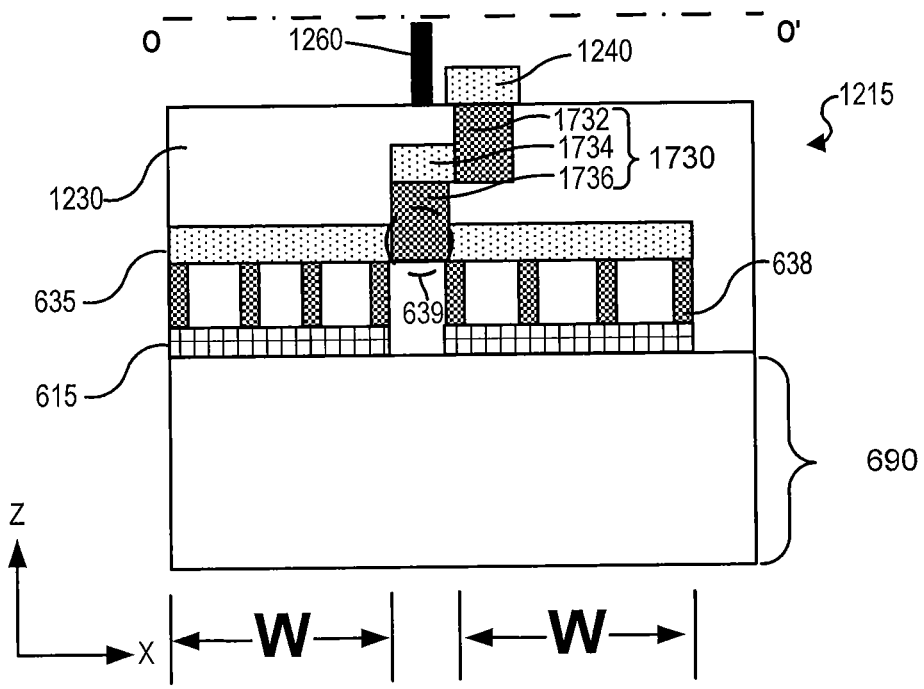
FIG. 21C is a cross section of FIG. 21A taken along the line O-O', according to some embodiments of the invention.

In a similar manner as discussed herein with respect to FIGS. 19A-19C, a multi-segment conductive via may be utilized to connect to the drain bond pad of the configuration of FIGS. 20A-20C to the drain interconnect 635 at an interior position 639 that is closer to the midpoint of the drain interconnect 635. FIG. 21A is a plan view illustrating a transistor device in which a gate bond pad 1220 does not extend on the gate and drain fingers 610, 615 and the drain bond pad 1240 extend on the gate and drain fingers 610, 615 with a multi-segment conductive drain via 1730, according to some embodiments of the invention. FIG. 21B is a cross section of FIG. 21A taken along the line N-N', according to some embodiments of the invention. FIG. 21C is a cross section of FIG. 21A taken along the line O-O', according to some embodiments of the invention. As elements of FIGS. 21A-21C incorporate some elements described herein, the description of FIGS. 21A-21C will focus on differences from previous embodiments.

For example, FIGS. 21A-21C illustrate an embodiment of the present invention that is similar to the embodiment of FIGS. 20A-20C, but with the use of a multi-segment conductive drain via 1730. As illustrated in FIG. 21C, the drain bond pad 1240 may be coupled to the drain interconnect 635 by a multi-segment conductive drain via 1730. The multi-segment conductive drain via 1730 may include a plurality of segments that provide a connection between the drain bond pad 1240 and the drain interconnect 635. The plurality of segments may include, for example, a first vertical drain via segment 1732, a first horizontal drain via segment 1734, and a second vertical drain via segment 1736. For example, the first vertical drain via segment 1732 may be coupled to the drain bond pad 1240 and extend vertically below a surface of the transistor die 1215. The first horizontal drain via segment 1734 may be coupled to the first vertical drain via segment 1732 and may extend generally in the second direction (e.g., the X direction) within the dielectric layer 1230 to a point above the midpoint of the drain interconnect 635. The second vertical drain via segment 1736 may be coupled to the first horizontal drain via segment 1734 and may extend vertically to couple with the drain interconnect 635 at an interior position 639 of the drain interconnect 635. The multi-segment conductive drain via 1730 may be similar to the configuration discussed herein with respect to FIGS. 17A-17G.

As illustrated in FIG. 21B, the gate bond pad 1220 may be coupled in a similar manner as illustrated and described with respect to FIGS. 18A and 18B. As such, a duplicate description thereof will be omitted.

Figure 22A:
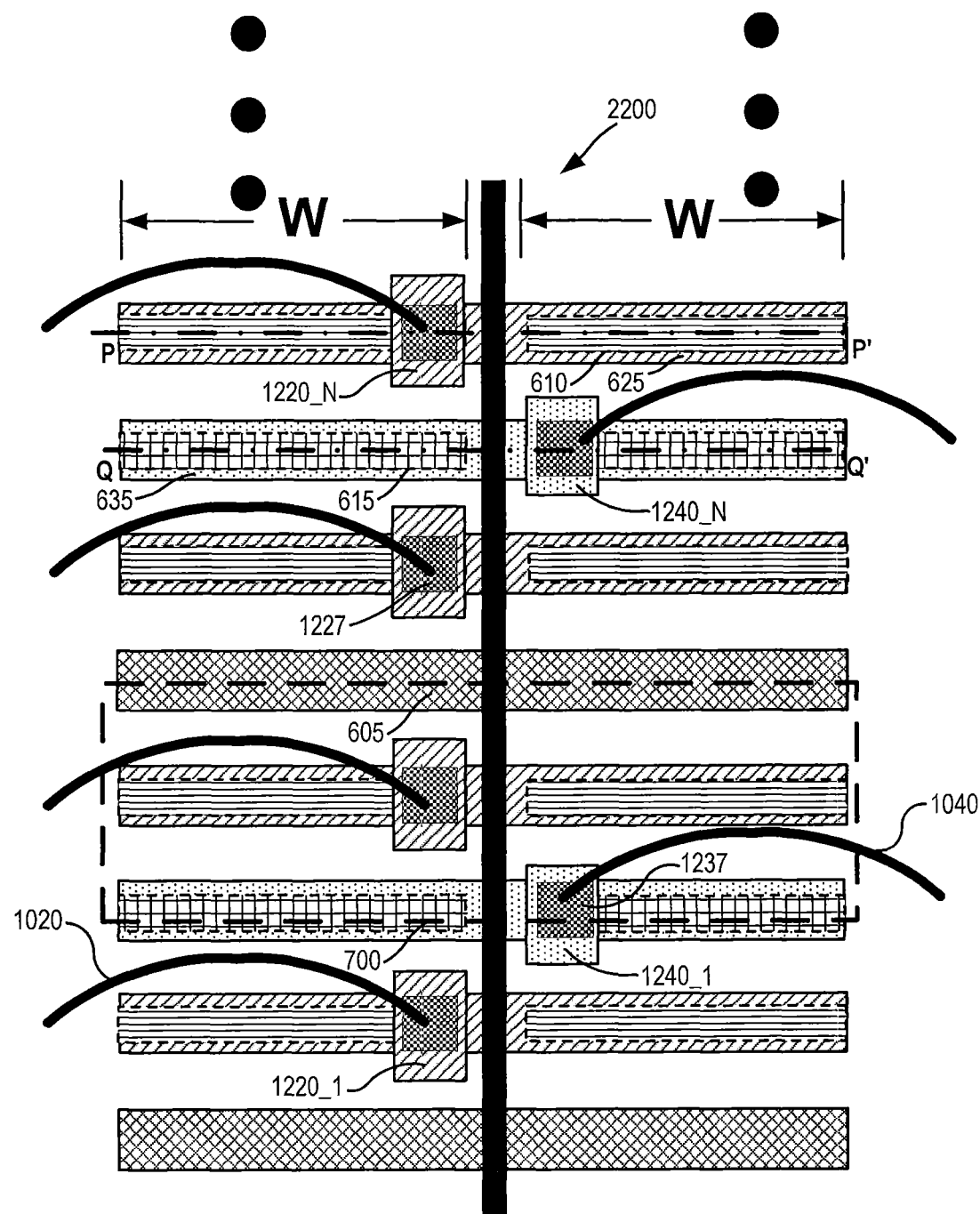
FIG. 22A is a plan view illustrating a transistor device in which both the gate bond pad and the drain bond pad are segmented, according to some embodiments of the invention.
Figure 22B:
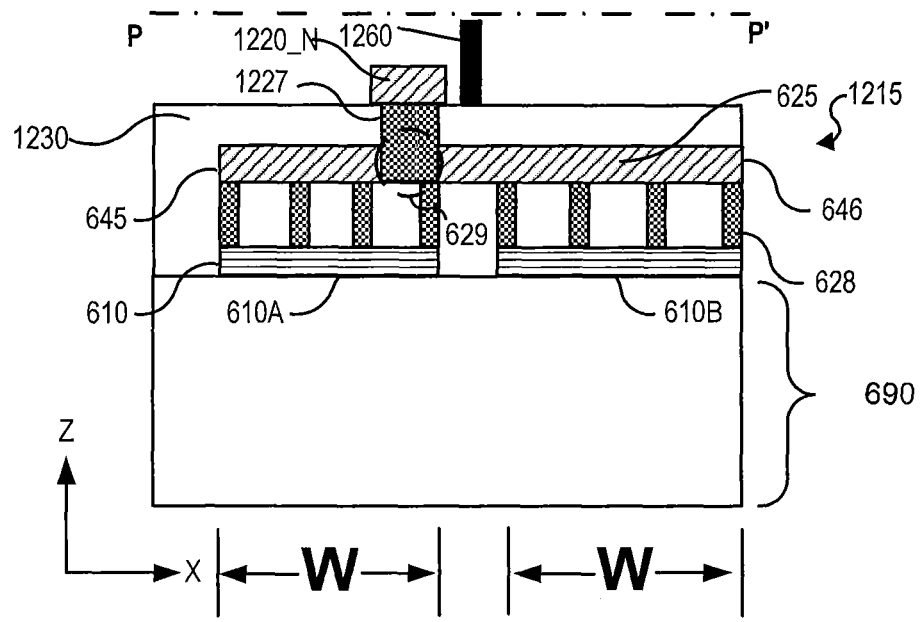
FIG. 22B is a cross section of FIG. 22A taken along the line P-P', according to some embodiments of the invention.
Figure 22C:
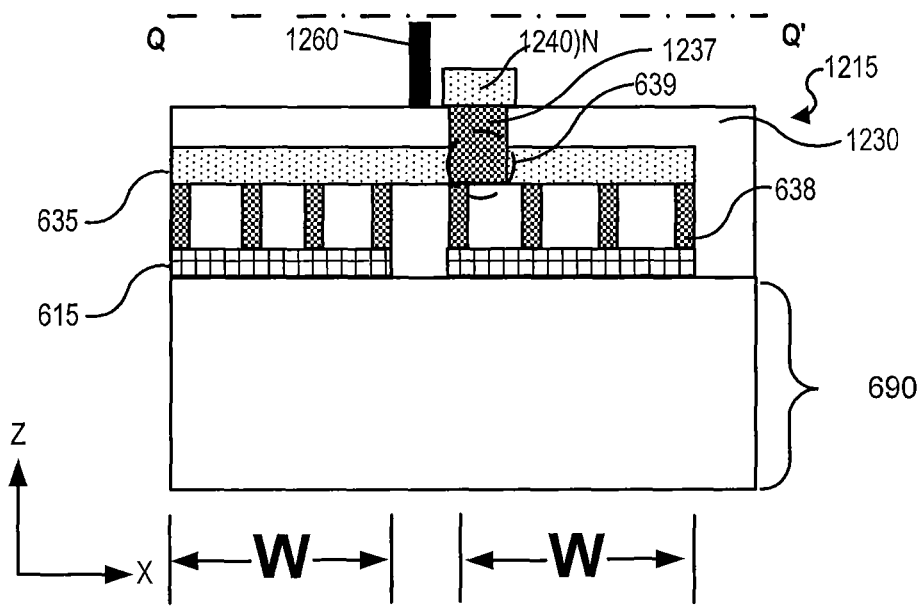
FIG. 22C is a cross section of FIG. 22A taken along the line Q-Q', according to some embodiments of the invention.

In some embodiments, a gate bond pad 1220 and/or drain bond pad 1240 may be segmented so as to comprise distinct gate bond pad segments and/or drain bond pad segments. FIG. 22A is a plan view illustrating a transistor device 2200 in which both the gate bond pad 1220 and the drain bond pad 1240 are segmented, according to some embodiments of the invention. FIG. 22B is a cross section of FIG. 22A taken along the line P-P', according to some embodiments of the invention. FIG. 22C is a cross section of FIG. 22A taken along the line Q-Q', according to some embodiments of the invention. Many of the elements in FIGS. 22A-22C are similar to those described herein. Accordingly, a further description thereof will be omitted.

As illustrated in FIGS. 22A-22C, the previous embodiments described herein may be modified to distribute the gate bond pad 1220 into multiple gate bond pad segments 1220_1 to 1220_N. Each of the individual gate bond pad segments 1220_1 to 1220_N may be distributed on respective ones of the gate fingers 610. In some embodiments, at least one of the gate bond pad segments 1220_1 to 1220_N may not be placed and/or extend on the drain fingers 615. Stated another way, the segmentation of the gate bond pad 1220 may be done so as to place the individual gate bond pad segments 1220_1 to 1220_N on portions of a gate finger 610 but not on portions of the drain fingers 615. As a result of the segmentation, a potential capacitive coupling between the drain finger 615 and the gate bond pad 1220 may be eliminated and/or reduced. For example, as illustrated in FIG. 22C, the gate bond pad 1220 (or a segment thereof) may not be present above the drain finger 615. Though only a single input bond wire 1020 is illustrated in FIG. 22A, it will be understood that one or more input bond wires 1020 may be coupled to respective ones of the gate bond pad segments 1220_1 to 1220_N. In other respects, as illustrated in FIG. 22B, the coupling between the gate bond pad segments 1220_1 to 1220_N and the gate interconnect 625 and/or gate finger 610 may be similar to those configurations described herein. For example, respective ones of the gate bond pad segments 1220_1 to 1220_N may be connected to respective ones of the gate interconnects 625 by second conductive gate via 1227.

Similarly, the drain bond pad 1240 may be distributed into a plurality of individual drain bond pad segments 1240_1 to 1240_N. Each of the individual drain bond pad segments 1240_1 to 1240_N may be distributed on respective ones of the drain fingers 615. In some embodiments, at least one of the drain bond pad segments 1240_1 to 1240_N may not be placed on the gate fingers 610. For example, as illustrated in FIG. 22B, the drain bond pad 1240 (or a segment thereof) may not be present above a gate finger 610. Though only a single output bond wire 1040 is illustrated in FIG. 22A, it will be understood that one or more output bond wires 1040 may be coupled to respective ones of the drain bond pad segments 1240_1 to 1240_N. In other respects, as illustrated in FIG. 22C, the coupling between the drain bond pad segments 1240_1 to 1240_N and the drain interconnect 635 and/or drain finger 615 may be similar to those configurations described herein. For example, respective ones of the drain bond pad segments 1240_1 to 1240_N may be connected to respective ones of the drain interconnects 635 by second conductive drain via 1237.

As with previously discussed embodiments, an isolation material 1260 may be placed on an area between the gate bond pad segments 1220_1 to 1220_N and the drain bond pad segments 1240_1 to 1240_N. The isolation material 1260 can take any of the embodiments described herein. The isolation material 1260 may further reduce and/or prevent coupling between the gate bond pad segments 1220_1 to 1220_N and the drain bond pad segments 1240_1 to 1240_N.

FIGS. 22A-22C illustrate an embodiment in which both the gate bond pad 1220 and the drain bond pad 1240 are segmented, but the present invention is not limited thereto. In some embodiments, the gate bond pad 1220 may be segmented, but the drain bond pad 1240 may not be segmented. In some embodiments, the gate bond pad 1220 may not be segmented, but the drain bond pad 1240 may be segmented. Other combinations of embodiments as described herein will be understood by one of ordinary skill in the art as being compatible with the segmented gate bond pad 1220 and/or segmented drain bond pad 1240. In addition, though the gate bond pad segments 1220_1 to 1220_N and the drain bond pad segments 1240_1 to 1240_N are illustrated as being substantially collinear in FIGS. 22A-22C, the embodiments described herein are not limited thereto. In some embodiments, the gate bond pad segments 1220_1 to 1220_N and/or the drain bond pad segments 1240_1 to 1240_N may be distributed in a non-linear fashion on the gate fingers 610 and/or the drain fingers 615, respectively.

Figure 23A:
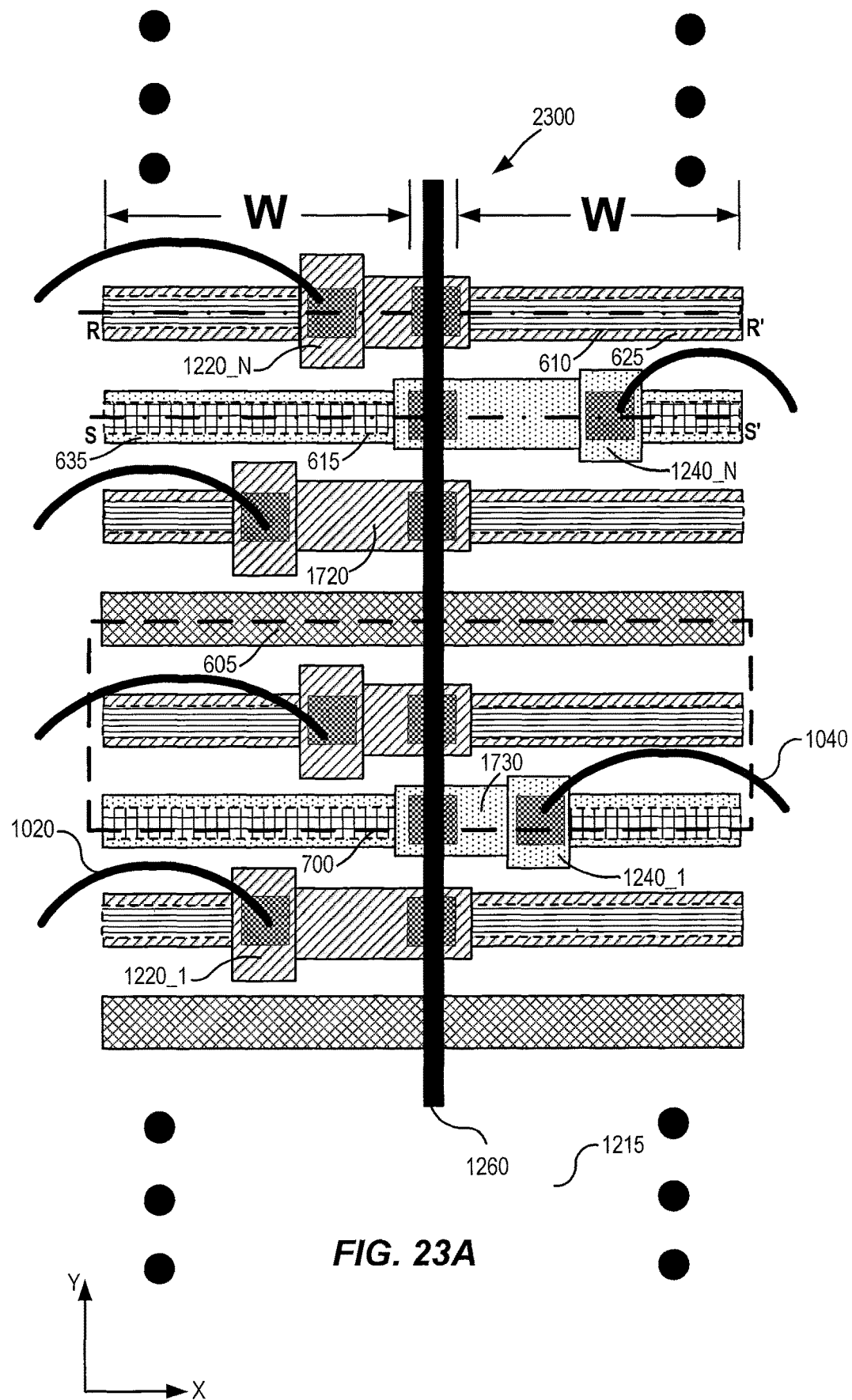
FIG. 23A is a plan view illustrating a transistor device in which both the gate bond pad and the drain bond pad are segmented and utilize multi-segment conductive vias, according to some embodiments of the invention.
Figure 23B:
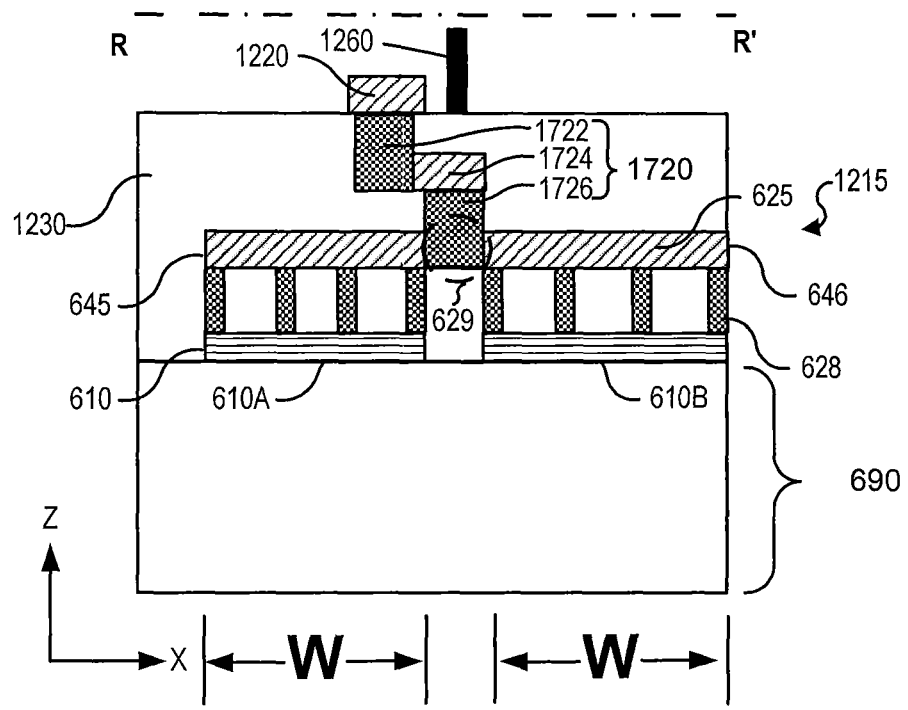
FIG. 23B is a cross section of FIG. 23A taken along the line R-R', according to some embodiments of the invention.
Figure 23C:
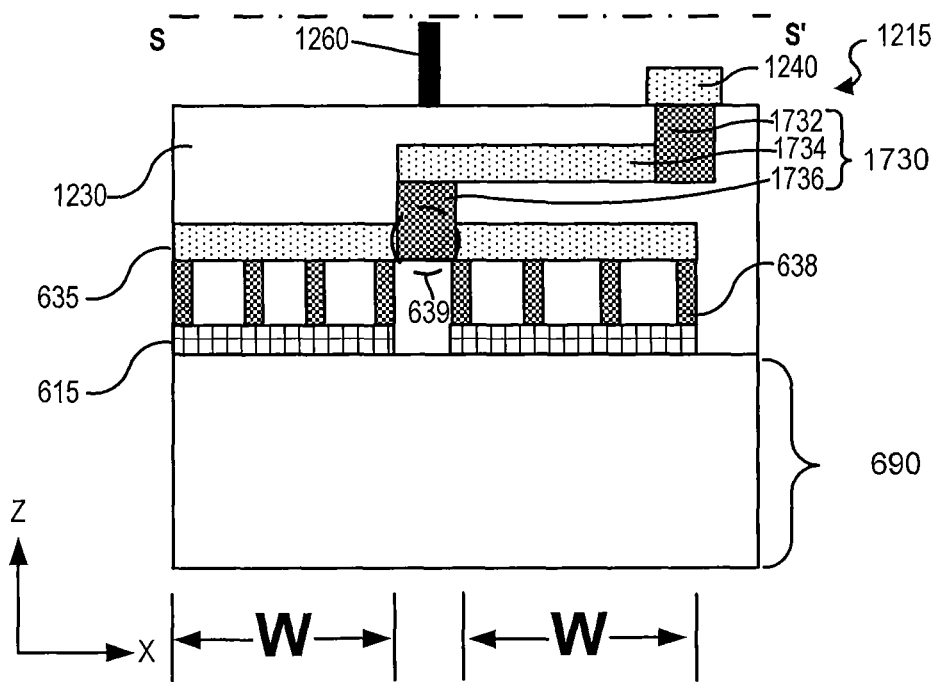
FIG. 23C is a cross section of FIG. 23A taken along the line S-S', according to some embodiments of the invention.

For example, FIGS. 23A-23C illustrate an embodiment of a transistor device 2300 in which the segmented gate bond pad 1220 and/or segmented drain bond pad 1240 of FIGS. 22A-22C are combined with the segmented conductive vias described herein with respect to FIGS. 17A-17G. FIG. 23A is a plan view illustrating a transistor device 2300 in which both the gate bond pad 1220 and the drain bond pad 1240 are segmented and utilize multi-segment conductive vias, according to some embodiments of the invention. FIG. 23B is a cross section of FIG. 23A taken along the line R-R', according to some embodiments of the invention. FIG. 23C is a cross section of FIG. 23A taken along the line S-S', according to some embodiments of the invention. Many of the elements in FIGS. 23A-23C are similar to those described herein. Accordingly, a further description thereof will be omitted.

As illustrated in FIGS. 23A-23C, the gate bond pad 1220 may be segmented into multiple gate bond pad segments 1220_1 to 1220_N. Each of the individual gate bond pad segments 1220_1 to 1220_N may be distributed on respective ones of the gate fingers 610. In some embodiments, at least one of the gate bond pad segments 1220_1 to 1220_N may not be placed on the drain fingers 615. In addition, as is illustrated in FIG. 23A, respective ones of the gate bond pad segments 1220_1 to 1220_N may be offset from one another in both the first direction (e.g., the Y-direction) and the second direction (e.g., the X-direction). This offset in both the first and second directions may reduce and/or prevent coupling and/or electrical interaction between respective ones of the gate bond pad segments 1220_1 to 1220_N. The present invention is not limited to embodiments in which the gate bond pad segments 1220_1 to 1220_N are offset in both the first and second directions. For example, in some embodiments, the gate bond pad segments 1220_1 to 1220_N may be substantially collinear.

Though only a single input bond wire 1020 is illustrated in FIG. 23A, it will be understood that one or more input bond wires 1020 may be coupled to respective ones of the gate bond pad segments 1220_1 to 1220_N. In other respects, as illustrated in FIG. 23B, the coupling between the gate bond pad segments 1220_1 to 1220_N and the gate interconnect 625 and/or gate finger 610 may be similar to those configurations described herein. For example, respective ones of the gate bond pad segments 1220_1 to 1220_N may be connected to respective ones of the gate interconnects 625 by a multi-segment conductive gate via 1720 similar to those described herein with respect to FIGS. 17A-17G.

Similarly, the drain bond pad 1240 may be distributed into a plurality of individual drain bond pad segments 1240_1 to 1240_N. Each of the individual drain bond pad segments 1240_1 to 1240_N may be distributed on respective ones of the drain fingers 615. In some embodiments, at least one of the drain bond pad segments 1240_1 to 1240_N may not be placed on the gate fingers 610. As with the gate bond pad segments 1220_1 to 1220_N, the drain bond pad segments 1240_1 to 1240_N may be offset from one another in both the first direction (e.g., the Y-direction) and the second direction (e.g., the X-direction), but the present invention is not limited thereto.

Though only a single output bond wire 1040 is illustrated in FIG. 23A, it will be understood that one or more output bond wires 1040 may be coupled to respective ones of the drain bond pad segments 1240_1 to 1240_N. In other respects, as illustrated in FIG. 23C, the coupling between the drain bond pad segments 1240_1 to 1240_N and the drain interconnect 635 and/or drain finger 615 may be similar to those configurations described herein. For example, respective ones of the drain bond pad segments 1240_1 to 1240_N may be connected to respective ones of the drain interconnects 635 by a multi-segment conductive drain via 1730 similar to those described herein with respect to FIGS. 17A-17G.

It will be recognized by one of ordinary skill in the art that portions of the respective embodiments described herein may be combined with other embodiments described herein without deviating from the scope and spirit of the present invention. While particular combinations have been described in an effort to provide a complete description, the concepts described herein may be combined in multiple different ways that would be difficult to fully describe without being unnecessarily repetitive. For example, elements of the edge-fed gate or drain finger (see, e.g., FIGS. 12D and 12G) may be combined with different types of isolation material 1260 described with respect to FIGS. 13A-16B and/or different types of interconnects between gate/drain interconnects and gate/drain fingers. That is, elements described with reference to one embodiment may be combined with other embodiments.

Figure 24A:
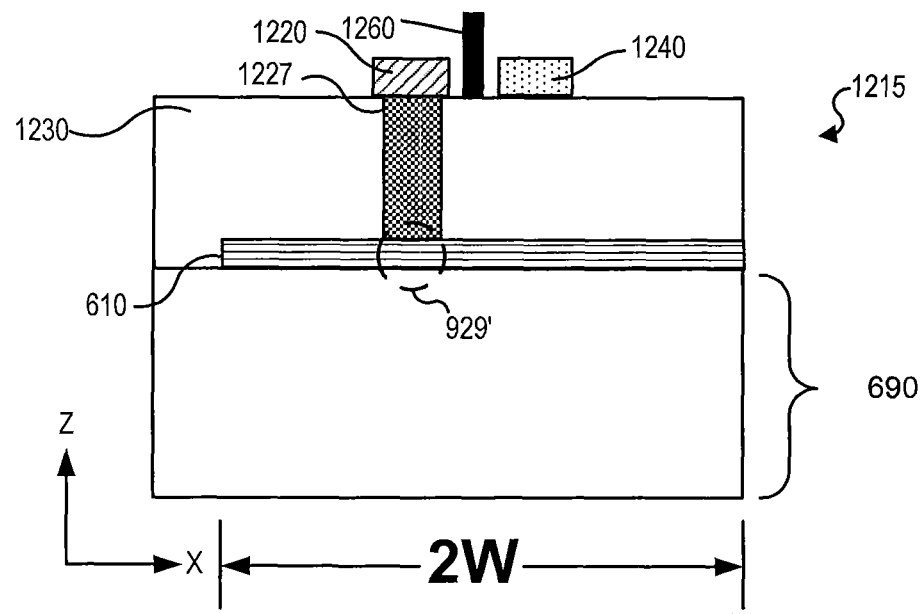
FIGS. 24A-24D illustrate transistor device embodiments which provide connections between the bond pads and gate/drain fingers without the use of an interconnect, according to some embodiments of the invention.
Figure 24B:
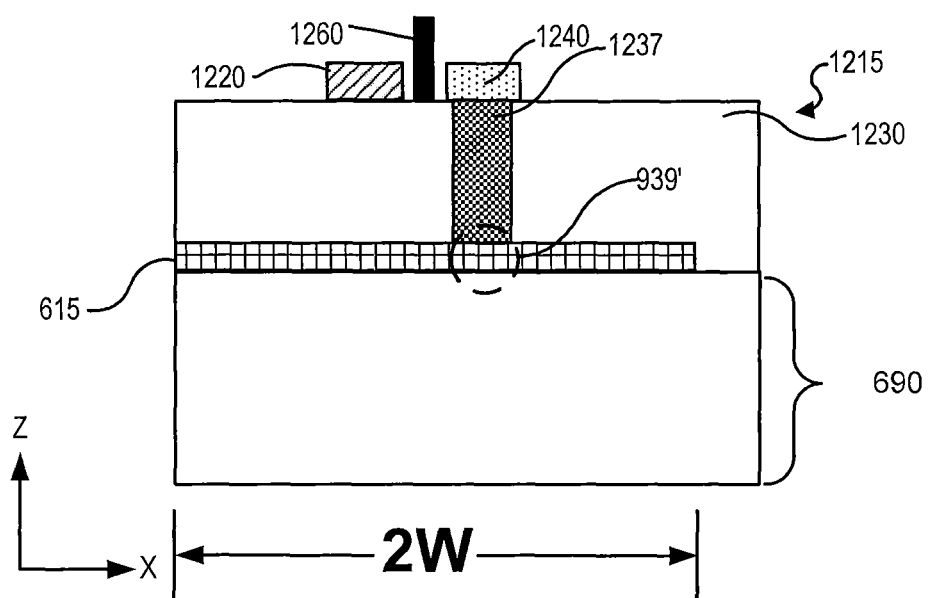
Figure 24C:
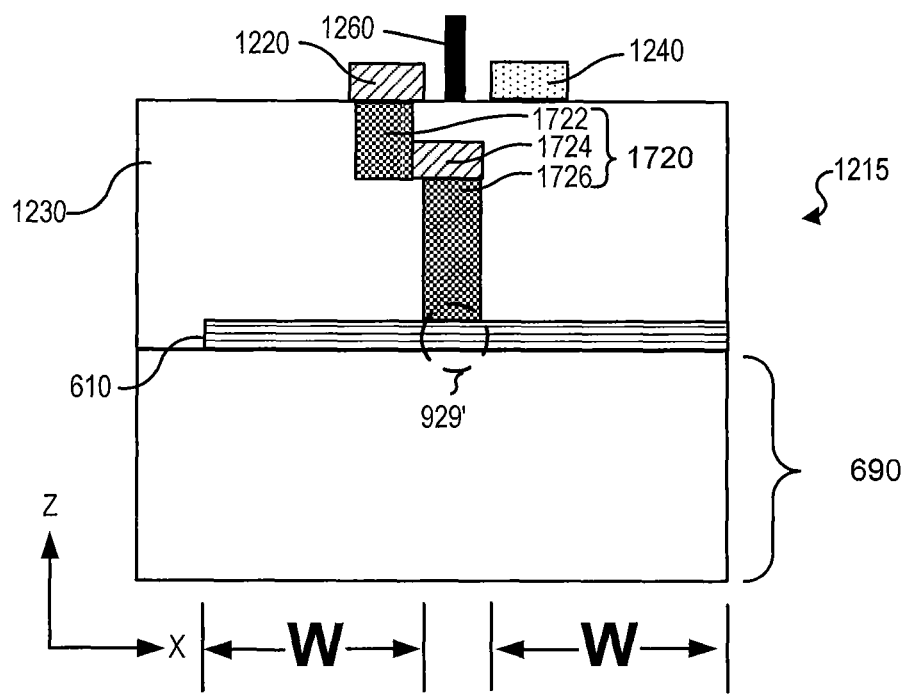

For example, FIGS. 24A-24D illustrate transistor device embodiments which provide connections between the bond pads and gate/drain fingers without the use of an interconnect according to some embodiments of the invention. FIGS. 24A and 24C illustrate, a gate configuration that provides a connection between the gate bond pad 1220 and an interior position 929' of the gate finger 610 without the use of a gate interconnect. For example, as illustrated in FIG. 24A, the gate bond pad 1220 may be connected to the interior position 929' of the gate finger 610 using a second conductive gate via 1227 in a manner similar to that described with respect to FIG. 12B. Similarly, as illustrated in FIG. 24C, the gate bond pad 1220 may be connected to the interior position 929' of the gate finger 610 using a multi-segment conductive gate via 1720 in a manner similar to that described with respect to FIG. 17B.

In some embodiments, the gate bond pad 1220 may be positioned on the gate finger 610 near a midpoint of the gate finger 610. That is to say that the gate bond pad 1220 may be arranged to be proximate to a virtual vertical line that extends normal to the midpoint of the gate finger 610. In some embodiments, the gate bond pad 1220 may be within a distance that is within ten percent of the length of the gate finger 610 in the horizontal direction from the midpoint of the gate finger 610 (e.g., from the virtual line normal to the midpoint). In some embodiments, the gate bond pad 1220 may be at a distance that is within twenty percent of the length of the gate finger 610 in the horizontal direction from the midpoint of the gate finger 610 (e.g., from the virtual line normal to the midpoint).

Figure 24D:
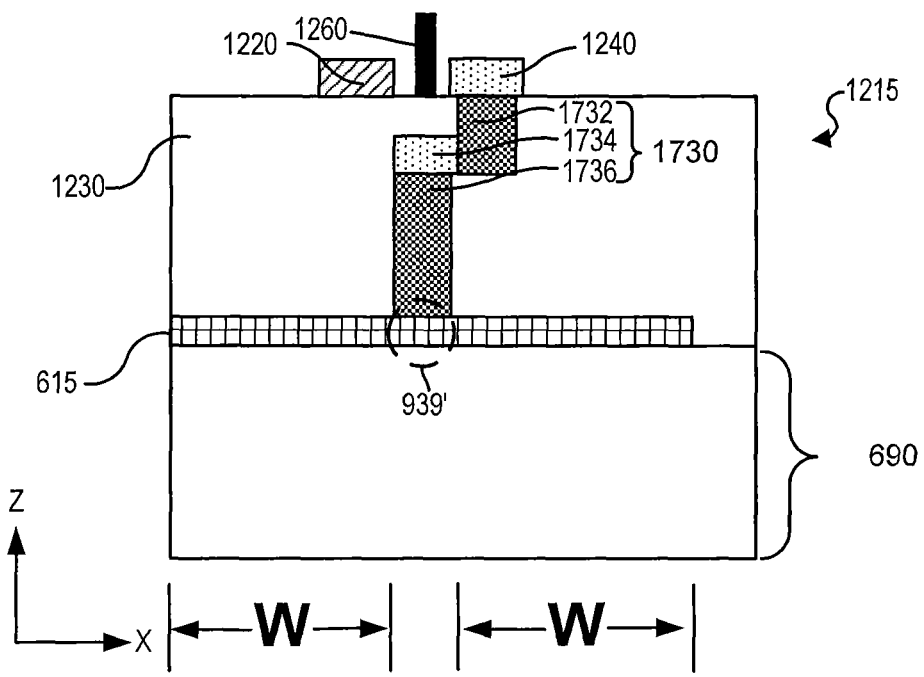

FIGS. 24B and 24D illustrate a drain configuration that provides a connection between the drain bond pad 1240 and an interior position 939' of the drain finger 615 without the use of a drain interconnect. For example, as illustrated in FIG. 24B, the drain bond pad 1240 may be connected to the interior position 939' of the drain finger 615 using a second conductive drain via 1237 in a manner similar to that described with respect to FIG. 12C. Similarly, as illustrated in FIG. 24D, the drain bond pad 1240 may be connected to the interior position 939' of the drain finger 615 using a multi-segment conductive drain via 1730 in a manner similar to that described with respect to FIG. 17C.

In some embodiments, the drain bond pad 1240 may be positioned on the drain finger 615 near a midpoint of the drain finger 615. That is to say that the drain bond pad 1240 may arranged to be proximate to a virtual vertical line that extends normal to the midpoint of the drain finger 615. In some embodiments, the drain bond pad 1240 may be within a distance that is within ten percent of the length of the drain finger 615 in the horizontal direction from the midpoint of the drain finger 615 (e.g., from the virtual line normal to the midpoint). In some embodiments, the drain bond pad 1240 may be at a distance that is within twenty percent of the length of the drain finger 615 in the horizontal direction from the midpoint of the drain finger 615 (e.g., from the virtual line normal to the midpoint). In some embodiments, the gate bond pad 1220 and the drain bond pad 1240 may be separated by less than 200 microns. In some embodiments, the gate bond pad 1220 and the drain bond pad 1240 may be separated by less than 100 microns.

Figure 25A:
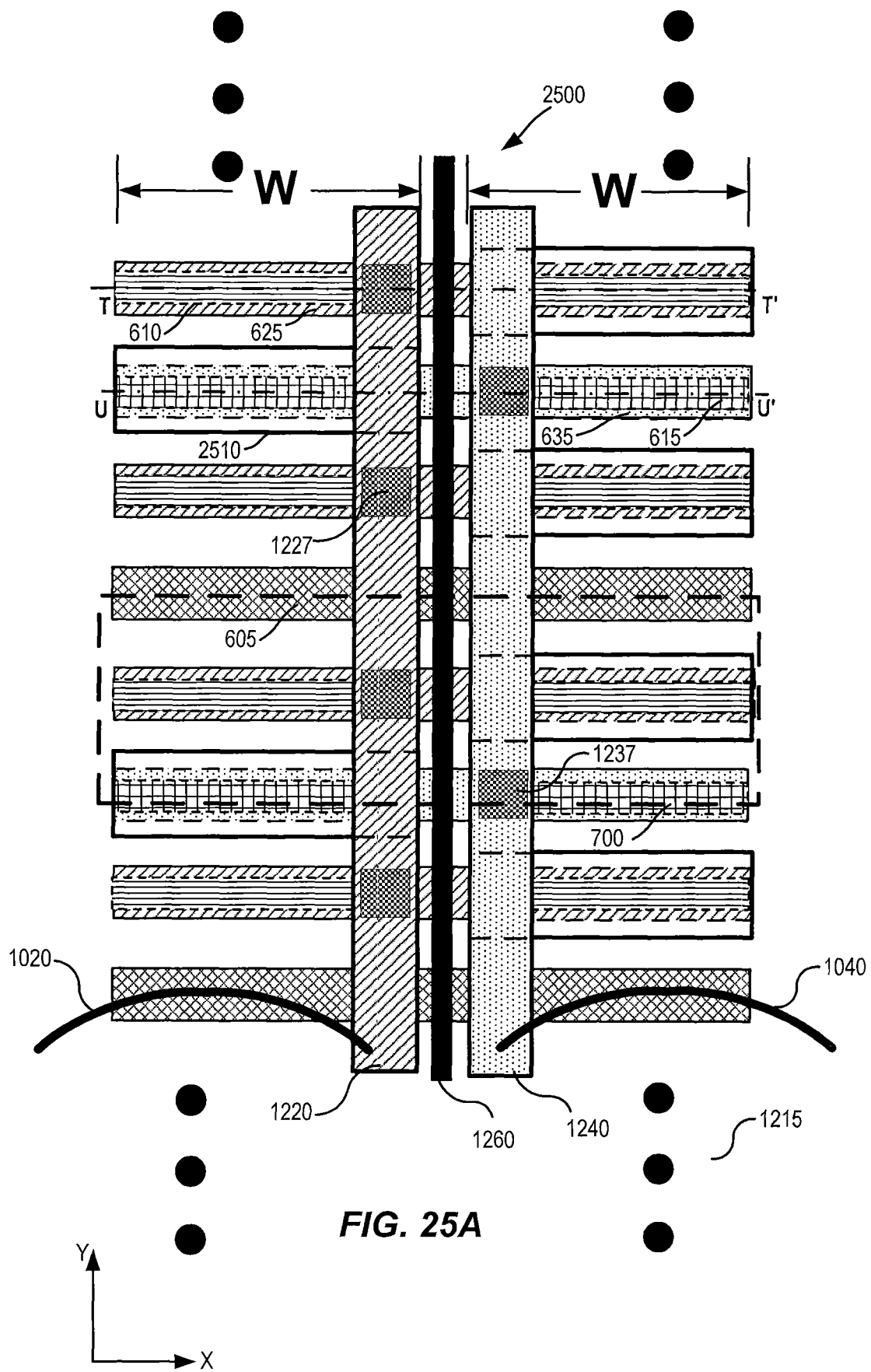
FIG. 25A is a plan view illustrating a transistor device according to some embodiments of the invention that incorporates field plates.
Figure 25B:
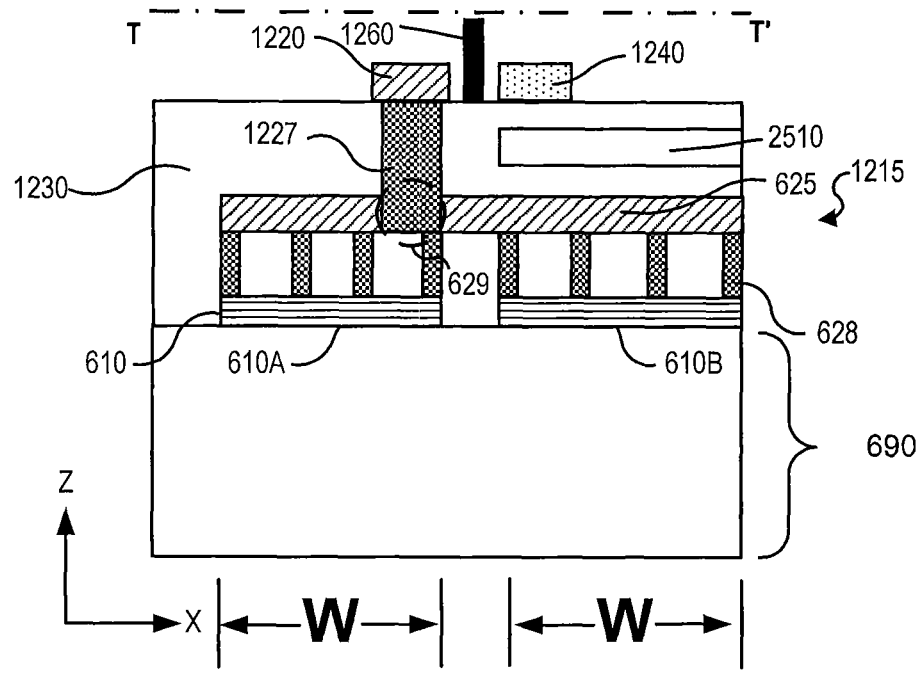
FIG. 25B is a cross section of FIG. 25A taken along the line T-T', according to some embodiments of the invention.
Figure 25C:
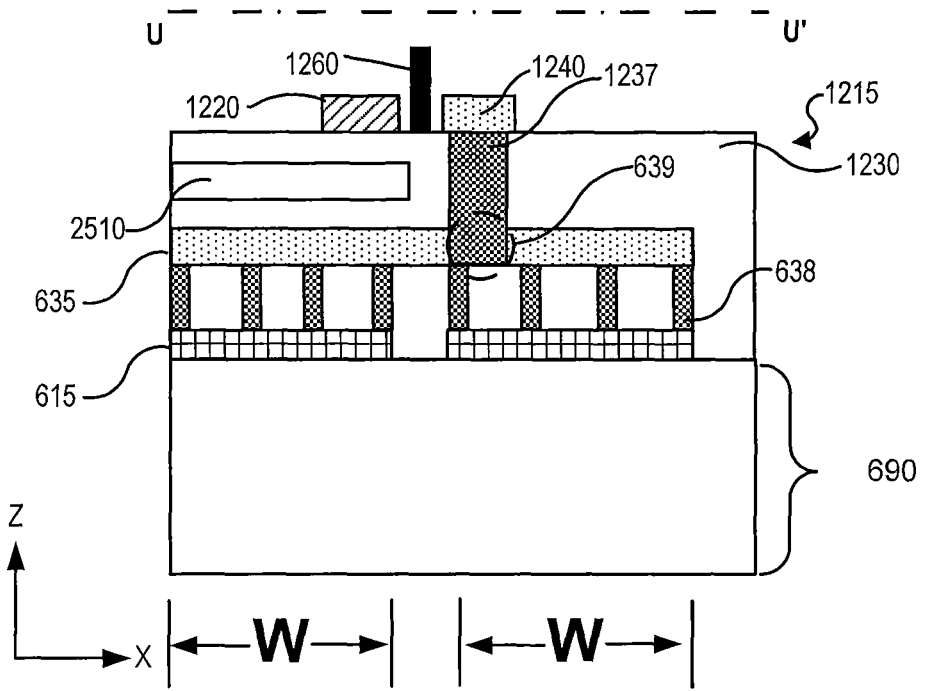
FIG. 25C is a cross section of FIG. 25A taken along the line U-U', according to some embodiments of the invention.

Embodiments described herein may have gate bond pads and/or drain bond pads that extend over the gate fingers and/or the drain fingers. As recognized by the inventors, this may provide the potential for a capacitance to develop between the bond pad and the respective finger. For example, a gate bond pad over the drain finger or a drain bond pad over the gate finger may develop a gate-to-drain capacitance $C_{gd}$. The inventors have recognized that field plates may alleviate this additional capacitance. FIG. 25A is a plan view illustrating a transistor device 2500 according to some embodiments of the invention that incorporates field plates 2510. FIG. 25B is a cross section of FIG. 25A taken along the line T-T', according to some embodiments of the invention. FIG. 25C is a cross section of FIG. 25A taken along the line U-U', according to some embodiments of the invention. Many of the elements in FIGS. 25A-25C are similar to those previously described. Accordingly, a further description thereof will be omitted.

Referring to FIGS. 25A and 25B, a field plate 2510 may be disposed within the dielectric layer 1230 between the drain bond pad 1240 and the gate interconnect 625 and/or the gate finger 610. The field plate 2510 may contain metal or other highly conductive material, including, for example, copper, gold, and/or a composite metal. The field plate 2510 may serve to reduce a capacitance that forms between the drain bond pad 1240 and the gate interconnect 625 and/or the gate finger 610. Similarly, as illustrated in FIGS. 25A and 25C, a field plate 2510 may be disposed within the dielectric layer 1230 between the gate bond pad 1220 and the drain interconnect 635 and/or the drain finger 615.

In some embodiments, the field plate 2510 may be connected to a reference voltage. For example, the field plate 2510 may be coupled to a ground voltage. In some embodiments, the field plate 2510 may be coupled to the ground voltage via a connection to the source contacts of the transistor device 2500. The shape of the field plate 2510 illustrated in FIGS. 25A-25C is intended to be illustrative only. The present invention is intended to cover embodiments in which a material is placed between the bond pad (e.g., the gate bond pad 1220 and/or drain bond pad 1240) and an adjacent interconnect and/or finger, and is not limited to the specific configuration illustrated in FIGS. 25A-25C. In addition, the field plates 2510 are not limited to the specific configuration of gate and drain bond pads 1220, 1240, gate/drain interconnects 625, 635, and/or gate/drain fingers 610, 615 illustrated in FIGS. 25A-25C. The field plates 2510 may be utilized in any of the embodiments described herein, such as those discussed with respect to FIGS. 17A-21C.

The invention described herein is technology independent, which means it can be applied for LDMOS, GaN, and other high-power RF transistor technologies. While embodiments of the present invention are illustrated with reference to a LDMOS and HEMT structures, the present inventive concepts are not limited to such devices. Thus, embodiments of the present invention may include other transistor devices having a plurality of unit cells and a controlling electrode. Embodiments of the present invention may be suitable for use in any transistor device where a wider controlling electrode is desired and multiple unit cells of the device are present. Thus, for example, embodiments of the present invention may be suitable for use in various types of devices, such as, MESFETs, MMICs, SITs, LDMOS, BJTs, pHEMTs, etc., fabricated using SiC, GaN, GaAs, silicon, etc.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A transistor device, comprising:
 a gate finger and a drain finger extending on a semiconductor structure, each having a respective longitudinal axis that extends in a first direction;
 a gate bond pad coupled to the gate finger, the gate bond pad comprising a surface configured to be bonded to a first bond wire; and
 a drain bond pad coupled to the drain finger, the drain bond pad comprising a surface configured to be bonded to a second bond wire,
 wherein the gate bond pad and the drain bond pad each have a respective longitudinal axis that extends in a second direction that crosses the first direction, and
 wherein a portion of the gate bond pad extends in the second direction and vertically overlaps both the gate finger and the drain finger.

2. The transistor device of claim 1, further comprising an isolation material arranged on an area between the gate bond pad and the drain bond pad.

3. The transistor device of claim 2, wherein the isolation material is a conductive isolation material, a magnetic isolation material, or a lossy dielectric isolation material.

4. The transistor device of claim 3, wherein the isolation material comprises a plurality of third bond wires that extend on and vertically overlap the gate finger and the drain finger at a level that is higher than the gate bond pad and the drain bond pad.

5. The transistor device of claim 2, further comprising:
 the first bond wire coupled to the gate bond pad; and
 the second bond wire coupled to the drain bond pad,
 wherein the isolation material is physically between the first bond wire and the second bond wire.

6. The transistor device of claim 1, further comprising:
 a gate interconnect coupled to the gate finger, wherein the gate bond pad is coupled to the gate interconnect at an interior position of the gate interconnect.

7. The transistor device of claim 6, wherein the interior position of the gate interconnect is between one-third and two-thirds of a distance between a first end and a second end of the gate interconnect.

8. The transistor device of claim 6, wherein the interior position of the gate interconnect is at a halfway point between a first end and a second end of the gate interconnect.

9. The transistor device of claim 6, wherein the gate bond pad is coupled to the gate interconnect by a multi-segment conductive via comprising at least one horizontal segment and at least one vertical segment.

10. The transistor device of claim 1, further comprising a field plate between the gate bond pad and the drain finger in a vertical direction such that the gate bond pad vertically overlaps the drain finger and the field plate.

11. The transistor device of claim 5, wherein the first bond wire is coupled to the gate bond pad at a first location on the gate bond pad that vertically overlaps an active region of the transistor device, and
 wherein the second bond wire is coupled to the drain bond pad at a second location on the gate bond pad that vertically overlaps the active region of the transistor device.

12. The transistor device of claim 5, wherein the portion of the gate bond pad that vertically overlaps both the gate finger and the drain finger also vertically overlaps an active region of the transistor device.

13. A transistor device, comprising:
 a gate finger and a drain finger;
 a gate interconnect coupled to the gate finger;
 a drain interconnect coupled to the drain finger;
 a gate bond pad coupled to the gate interconnect at an interior position of the gate interconnect;
 a first bond wire that is bonded to a surface of the gate bond pad at a first location on the gate bond pad that vertically overlaps an active region of the transistor device;

a drain bond pad coupled to the drain interconnect at an interior position of the drain interconnect; and a second bond wire that is bonded to a surface of the drain bond pad at a second location on the gate bond pad that vertically overlaps the active region of the transistor device, wherein the gate bond pad extends on the active region of the transistor device and vertically overlaps the gate finger and/or the drain bond pad extends on the active region of the transistor device and vertically overlaps the drain finger.

14. The transistor device of claim 13, further comprising:
an isolation material physically between the first bond wire and the second bond wire.

15. The transistor device of claim 14, wherein the isolation material is a conductive isolation material, a magnetic isolation material, or a lossy dielectric isolation material that is configured to reduce a coupling between the first bond wire and the second bond wire.

16. The transistor device of claim 14, wherein the isolation material comprises a plurality of third bond wires that extend on and vertically overlap the gate finger and the drain finger at a level that is higher than the gate bond pad and the drain bond pad.

17. The transistor device of claim 13, wherein the gate bond pad extends on and vertically overlaps both the drain finger and the gate finger.

18. The transistor device of claim 17, further comprising a field plate between the gate bond pad and the drain finger in a vertical direction such that the gate bond pad vertically overlaps the drain finger and the field plate.

19. A transistor device, comprising;
a gate finger having a longitudinal axis extending in a first direction;

a drain finger having a longitudinal axis extending in the first direction;

a gate bond pad having a longitudinal axis extending in a second direction, crossing the first direction, and having a first bond wire coupled thereto;

a drain bond pad having a longitudinal axis extending in the second direction and having a second bond wire coupled thereto; and an isolation material at a level that is between the first bond wire and the second bond wire in the first direction, the isolation material extending on and overlapping both the gate finger and the drain finger, wherein the gate bond pad extends on and vertically overlaps the gate finger and/or the drain bond pad extends on and vertically overlaps the drain finger.

20. The transistor device of claim 19, wherein the isolation material has a longitudinal axis that extends on the gate finger and the drain finger in the second direction at the level that is between the first bond wire and the second bond wire.

21. The transistor device of claim 19, further comprising:
a gate interconnect coupled to the gate finger, wherein the gate bond pad is coupled to the gate interconnect at an interior position of the gate interconnect.

22. The transistor device of claim 19, wherein the first bond wire is coupled to the gate bond pad at a first location on the gate bond pad that vertically overlaps an active region of the transistor device, and wherein the second bond wire is coupled to the drain bond pad at a second location on the gate bond pad that vertically overlaps the active region of the transistor device.

* * * * *